(12) United States Patent
Shimizu et al.

(10) Patent No.: US 10,615,352 B2
(45) Date of Patent: Apr. 7, 2020

(54) N-TYPE SEMICONDUCTOR ELEMENT, COMPLEMENTARY TYPE SEMICONDUCTOR DEVICE AND METHOD FOR MANUFACTURING SAME, AND WIRELESS COMMUNICATION DEVICE IN WHICH SAME IS USED

(71) Applicant: TORAY INDUSTRIES, INC., Tokyo (JP)

(72) Inventors: Hiroji Shimizu, Shiga (JP); Seiichiro Murase, Shiga (JP); Daisuke Sakaii, Shiga (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 16/066,858

(22) PCT Filed: Jan. 19, 2017

(86) PCT No.: PCT/JP2017/001777
§ 371 (c)(1),
(2) Date: Jun. 28, 2018

(87) PCT Pub. No.: WO2017/130836
PCT Pub. Date: Aug. 3, 2017

(65) Prior Publication Data
US 2019/0027700 A1 Jan. 24, 2019

(30) Foreign Application Priority Data

Jan. 25, 2016 (JP) .................... 2016-011239
Jan. 25, 2016 (JP) .................... 2016-011240
Dec. 9, 2016 (JP) .................... 2016-239049

(51) Int. Cl.
*H01L 51/05* (2006.01)
*H01L 29/786* (2006.01)
(Continued)

(52) U.S. Cl.
CPC ........ *H01L 51/052* (2013.01); *H01L 21/8238* (2013.01); *H01L 27/092* (2013.01);
(Continued)

(58) Field of Classification Search
CPC ..................................... H01L 51/052
See application file for complete search history.

(56) References Cited

U.S. PATENT DOCUMENTS

2003/0148572 A1* 8/2003 Inaba ................ H01L 21/26586
438/200
2006/0214192 A1* 9/2006 Nanai .................... B82Y 10/00
257/213
(Continued)

FOREIGN PATENT DOCUMENTS

JP 2009-283924 A 12/2009
WO WO 2005/057665 A1 6/2005
(Continued)

OTHER PUBLICATIONS

International Search Report for PCT/JP2017/001777 (PCT/ISA/210) dated Apr. 18, 2017.
(Continued)

*Primary Examiner* — Lex H Malsawma
*Assistant Examiner* — Geoffrey H Ida
(74) *Attorney, Agent, or Firm* — Birch, Stewart, Kolasch & Birch, LLP

(57) ABSTRACT

An excellent complementary semiconductor device is provided using a simple process. An n-type drive semiconductor device including a substrate; and a source electrode, a drain electrode, a gate electrode, a gate insulating layer, and a semiconductor layer on the substrate; and including a second insulating layer on the opposite side of the semiconductor layer from the gate insulating layer; in which the second insulating layer contains an organic compound con-
(Continued)

taining a bond between a carbon atom and a nitrogen atom; and in which the semiconductor layer contains a carbon nanotube composite having a conjugated polymer attached to at least a part of the surface thereof.

19 Claims, 9 Drawing Sheets

(51) Int. Cl.
    *H01L 27/092*     (2006.01)
    *H01L 21/8238*     (2006.01)
    *H01L 27/28*     (2006.01)
    *H01L 51/00*     (2006.01)
    *H04B 5/00*     (2006.01)

(52) U.S. Cl.
    CPC .......... *H01L 27/283* (2013.01); *H01L 29/786* (2013.01); *H01L 51/0003* (2013.01); *H01L 51/0036* (2013.01); *H01L 51/0048* (2013.01); *H01L 51/0094* (2013.01); *H01L 51/05* (2013.01); *H01L 51/0566* (2013.01); *H04B 5/0062* (2013.01)

(56) References Cited

U.S. PATENT DOCUMENTS

| | | | |
|---|---|---|---|
| 2008/0224940 A1* | 9/2008 | Sugiyama | ............. H01L 23/145 343/873 |
| 2010/0102299 A1* | 4/2010 | Murase | ................. B82Y 10/00 257/40 |
| 2011/0121273 A1 | 5/2011 | Jo et al. | |
| 2016/0035457 A1 | 2/2016 | Murase et al. | |
| 2016/0268237 A1* | 9/2016 | Lee | ..................... H01L 25/0753 |

FOREIGN PATENT DOCUMENTS

| | | |
|---|---|---|
| WO | WO 2009/139339 A1 | 11/2009 |
| WO | WO 2014/142105 A1 | 9/2014 |

OTHER PUBLICATIONS

Written Opinion of the international Searching Authority for PCT/JP2017/001777 (PCT/ISA/237) dated Apr. 18, 2017.

\* cited by examiner

N-TYPE SEMICONDUCTOR ELEMENT, COMPLEMENTARY TYPE SEMICONDUCTOR DEVICE AND METHOD FOR MANUFACTURING SAME, AND WIRELESS COMMUNICATION DEVICE IN WHICH SAME IS USED

TECHNICAL FIELD

The present invention relates to n-type semiconductor devices, complementary semiconductor devices, methods of producing the same, and wireless communication devices in which the same are used.

BACKGROUND ART

In recent years, development has been promoted for wireless communication systems using RFID (Radio Frequency IDentification) technology for contactless tags. RFID systems perform wireless communication between a wireless transceiver called a reader/writer and an RFID tag.

RFID tags are expected to be utilized in various applications such as logistics management, merchandise management, shoplifting prevention, and the like, and have started being introduced in some of the applications, for example, merchandise tags and IC cards such as transportation cards. An RFID tag has an IC chip and an antenna for wireless communication with readers/writers. The antenna mounted in the tag receives carrier waves transmitted from readers/writers and thus operates a drive circuit in the IC chip.

RFID tags are expected to be used for every kind of merchandise. For that purpose, the production cost needs to be reduced, and studies have been made on flexible and inexpensive tags based on getting rid of production processes that use vacuum and high temperature and on using coating and printing technologies.

For example, for a drive circuit in an IC chip, using a field-effect transistor (hereinafter referred to as FET) has been proposed in which an organic semiconductor having excellent formability is used as a semiconductor layer. Utilizing an organic semiconductor as ink makes it possible to form a circuit pattern directly on a flexible substrate using inkjet technology, screening technology, and the like. In this regard, FETs in which carbon nanotubes (CNTs) or organic semiconductors are used in place of conventional inorganic semiconductors are vigorously studied (see, for example, Patent Document 1).

A drive circuit in an RFID tag generally includes a complementary circuit composed of a p-type FET and an n-type FET for purposes of suppression of power consumption and the like. It is known, however, that an FET using CNTs usually exhibits the characteristics of a p-type semiconductor device in the atmosphere. In addition, an FET using an organic semiconductor has a single channel. This does not enable a complementary circuit to be composed of the same materials, but different materials have to be selected for a p-type FET and an n-type FET, posing a problem in that the production processes are complicated, the production efficiency is decreased, and the production cost is increased.

For this reason, converting an FET using CNTs into an n-type semiconductor device by means of vacuum heating treatment or ion doping (see, for example, Patent Document 2 and Non-Patent Document 1) and using a bipolar organic semiconductor material (see, for example, Patent Documents 3 and 4) to form a complementary circuit from the same materials have been studied.

CITATION LIST

Patent Documents

Patent Document 1: WO 2009/139339
Patent Document 2: US 2003/122133 A1
Patent Document 3: JP 2008-311594 A
Patent Document 4: JP 2014-116564 A Non-Patent Document Non-Patent Document 1: Nano Letters. 1, p. 453-456 (2001)

SUMMARY OF INVENTION

Technical Problem

In Patent Document 2, a method in which to dope oxygen or potassium ions to CNTs, which is thereby converted into an n-type semiconductor device, is contemplated. There is a problem, however, in that oxygen is difficult to separate as an element and that potassium ions are difficult to handle.

In Non-Patent Document 1, a method is contemplated in which an FET using CNTs is patterned and protected with photolithography technology, then heated under vacuum at 200° C. for 10 hours, and thereby converted into an n-type semiconductor device. However, this method requires a long time high temperature treatment under vacuum, posing a problem in that the process time is prolonged and that the production cost is increased.

According to Patent Document 3, a complementary circuit is formed by using the same materials between the electrodes, insulating layers, and semiconductor layer of a p-type FET and those of an n-type FET respectively, and by forming a polarizable thin film in contact with the gate insulating film and the source and drain electrodes only in the n-type FET. There is a problem, however, in that an additional step is required for forming the polarizable thin film selectively only for the n-type FET, thus increasing the number of production steps.

In Patent Document 4, it is contemplated that a layer region containing lanthanum boride is provided in contact with the gate insulating film side of the semiconductor layer region of an n-type FET in which pentacene is used in the semiconductor layer. However, this requires a lanthanum boride layer to be newly formed, posing a problem in that the production cost is increased.

The present invention is focused on the above-mentioned problems, and an object thereof is to provide excellent n-type semiconductor devices and complementary semiconductor devices using simple processes.

Solution to Problem

To solve the above-mentioned problems, the present invention has the following structure.

In other words, the present invention is an n-type semiconductor device including:
a substrate;
a source electrode, a drain electrode, and a gate electrode;
a semiconductor layer in contact with the source electrode and the drain electrode;
a gate insulating layer insulating the semiconductor layer from the gate electrode; and a second insulating layer in contact with the semiconductor layer on the opposite side of the semiconductor layer from the gate insulating layer;

in which the semiconductor layer contains a carbon nanotube composite having a conjugated polymer attached to at least a part of the surface thereof; and in which the second insulating layer contains an organic compound containing a bond between a carbon atom and a nitrogen atom.

Another structure of the present invention is an n-type semiconductor device including:

a substrate;

a source electrode, a drain electrode, and a gate electrode;

a semiconductor layer in contact with the source electrode and the drain electrode;

a gate insulating layer insulating the semiconductor layer from the gate electrode; and a second insulating layer in contact with the semiconductor layer on the opposite side of the semiconductor layer from the gate insulating layer;

in which the semiconductor layer contains a carbon nanotube; and in which the second insulating layer contains an organic compound having a structure of the general formula (2).

The present invention also has the following structure. In other words, the present invention is a complementary semiconductor device including the n-type semiconductor device and a p-type semiconductor device;

in which the p-type semiconductor device includes:

a substrate;

a source electrode, a drain electrode, and a gate electrode;

a semiconductor layer in contact with the source electrode and the drain electrode; and a gate insulating layer insulating the semiconductor layer from the gate insulating layer;

in which the semiconductor layer of the p-type semiconductor device contains a carbon nanotube composite having a conjugated polymer attached to at least a part of the surface thereof.

Advantageous Effects of Invention

According to the present invention, n-type semiconductor devices using high functionality CNTs, high functionality complementary semiconductor devices, and wireless communication devices using the same can be produced in simple processes.

DESCRIPTION OF EMBODIMENTS

<N-Type Semiconductor Device>

An n-type semiconductor device according to the present invention includes a substrate; a source electrode, a drain electrode, and a gate electrode; a semiconductor layer in contact with the source electrode and the drain electrode; a gate insulating layer insulating the semiconductor layer from the gate electrode; and a second insulating layer in contact with the semiconductor layer on the opposite side of the semiconductor layer from the gate insulating layer; in which the semiconductor layer contains a carbon nanotube composite having a conjugated polymer attached to at least a part of the surface thereof; and in which the second insulating layer contains an organic compound containing a bond between a carbon atom and a nitrogen atom.

Alternatively, an n-type semiconductor device according to another embodiment of the present invention includes a substrate; a source electrode, a drain electrode, and a gate electrode; a semiconductor layer in contact with the source electrode and the drain electrode; a gate insulating layer insulating the semiconductor layer from the gate electrode; and a second insulating layer in contact with the semiconductor layer on the opposite side of the semiconductor layer from the gate insulating layer; in which the semiconductor layer contains a carbon nanotube; and in which the second insulating layer contains an organic compound having a structure of the general formula (2).

Figure 1:
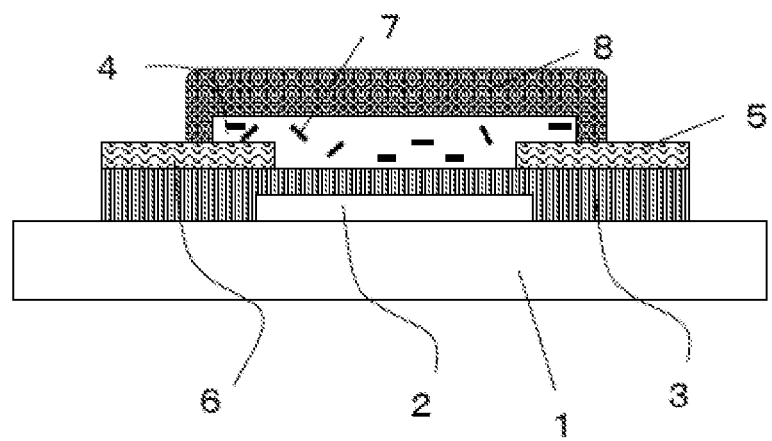
FIG. 1 is a schematic cross-sectional view depicting an n-type semiconductor device which is one of the embodiments of the present invention.

FIG. 1 is a schematic cross-sectional view depicting a first embodiment of an n-type semiconductor device according to the present invention.

The n-type semiconductor device has: an insulating substrate 1 on which a gate electrode 2 is formed; a gate insulating layer 3 covering the gate electrode; a source electrode 5 and a drain electrode 6 provided on the gate insulating layer; a semiconductor layer 4 provided between the electrodes; and a second insulating layer 8 covering the semiconductor layer. The semiconductor layer 4 contains a carbon nanotube composite having a conjugated polymer attached to at least a part of the surface thereof, or a carbon nanotube 7, and the second insulating layer 8 contains an organic compound containing a bond between a carbon atom and a nitrogen atom or an organic compound having a structure of the general formula (2).

This structure is what is called a bottom-gate/bottom-contact structure in which a gate electrode is disposed below a semiconductor layer, and a source electrode and a drain electrode are disposed on the underside of the semiconductor layer.

Figure 2:
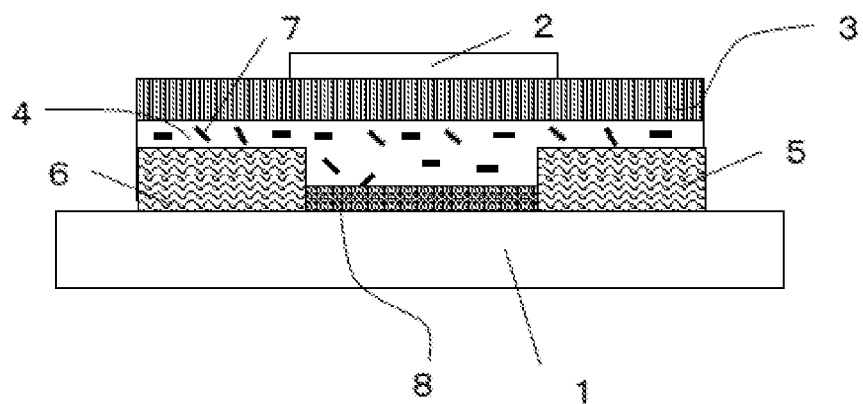
FIG. 2 is a schematic cross-sectional view depicting an n-type semiconductor device which is one of the embodiments of the present invention.

FIG. 2 is a schematic cross-sectional view depicting a second embodiment of an n-type semiconductor device according to the present invention.

The n-type semiconductor device has: an insulating substrate 1 on which a source electrode 5 and a drain electrode 6 are formed; a second insulating layer 8 provided between the electrodes; a semiconductor layer 4 in contact with the electrodes; a gate insulating layer 3 covering the semiconductor layer 4; and a gate electrode 2 provided on the gate insulating layer. The semiconductor layer 4 contains a carbon nanotube composite having a conjugated polymer attached to at least a part of the surface thereof, or a carbon nanotube 7, and the second insulating layer 8 contains an organic compound containing a bond between a carbon atom and a nitrogen atom or an organic compound having a structure of the general formula (2).

This structure is what is called a top-gate/bottom-contact structure in which a gate electrode is disposed above the semiconductor layer, and a source electrode and a drain electrode are disposed on the underside of the semiconductor layer.

Figure 3:
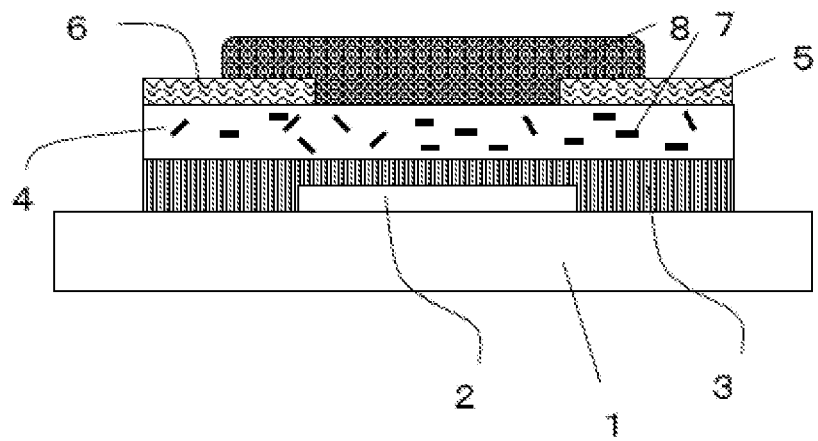
FIG. 3 is a schematic cross-sectional view depicting an n-type semiconductor device which is one of the embodiments of the present invention.

FIG. 3 is a schematic cross-sectional view depicting a third embodiment of an n-type semiconductor device according to the present invention.

The n-type semiconductor device has: an insulating substrate 1 on which a gate electrode 2 is formed; a gate insulating layer 3 covering the gate electrode; a semiconductor layer 4 provided on the gate insulating layer; a source electrode 5 and a drain electrode 6 formed on the semiconductor layer; and a second insulating layer 8 provided on them. The semiconductor layer 4 contains a carbon nanotube composite having a conjugated polymer attached to at least a part of the surface thereof, or a carbon nanotube 7, and the second insulating layer 8 contains an organic compound containing a bond between a carbon atom and a nitrogen atom or an organic compound having a structure of the general formula (2).

This structure is what is called a bottom-gate/top-contact structure in which a gate electrode is disposed below a semiconductor layer, and a source electrode and a drain electrode are disposed on the top side of the semiconductor layer.

Figure 4:
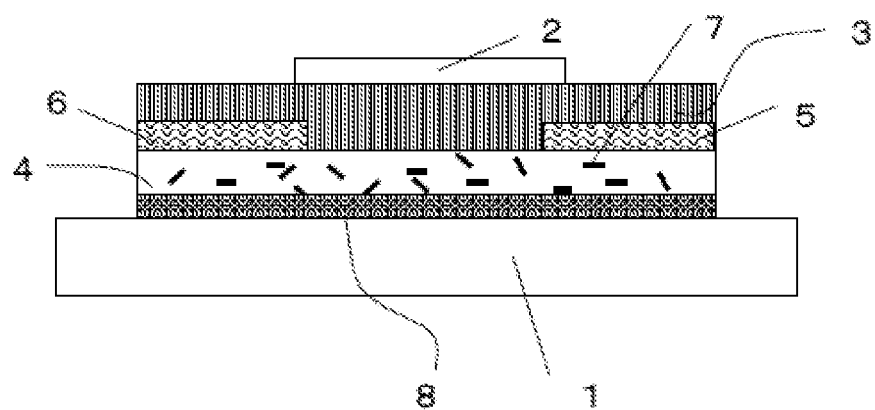
FIG. 4 is a schematic cross-sectional view depicting an n-type semiconductor device which is one of the embodiments of the present invention.

FIG. 4 is a schematic cross-sectional view depicting a fourth embodiment of an n-type semiconductor device according to the present invention.

The n-type semiconductor device has: an insulating substrate 1 on which a second insulating layer 8 is formed; a semiconductor layer 4 formed on the second insulating layer; a source electrode 5 and a drain electrode 6 formed on the semiconductor layer; a gate insulating layer 3 covering the electrodes; and a gate electrode 2 provided on the gate insulating layer. The semiconductor layer 4 contains a carbon nanotube composite having a conjugated polymer attached to at least a part of the surface thereof, or a carbon nanotube 7, and the second insulating layer 8 contains an organic compound containing a bond between a carbon atom and a nitrogen atom or an organic compound having a structure of the general formula (2).

This structure is what is called a top-gate/top-contact structure in which a gate electrode is disposed above the semiconductor layer, and a source electrode and a drain electrode are disposed on the top side of the semiconductor layer.

Embodiments of an n-type semiconductor device according to the present invention are not to be limited to these. In addition, the below-mentioned description equally applies to all embodiments, unless otherwise specified.

(Insulating Substrate)

The insulating substrate may be of any material as long as at least the surface of the substrate on which the electrode system is to be disposed has insulating properties. For example, inorganic materials such as a silicon wafer, glass, sapphire, and alumina sintered materials; organic materials such as polyimides, polyvinyl alcohols, polyvinyl chloride, polyethylene terephthalate, polyvinylidene difluoride, polysiloxanes, polyvinyl phenol (PVP), polyesters, polycarbonates, polysulfone, polyether sulfone, polyethylene, polyphenylene sulfide, and polyparaxylene; and the like are suitably used.

The insulating substrate may also be, for example, one which is a plurality of materials layered one on another, such as a silicon wafer with a PVP film formed thereon or a polyethylene terephthalate material with a polysiloxane film formed thereon.

(Electrode)

The materials used for the gate electrode, source electrode, and drain electrode may be any electrically conductive materials which can be generally used for electrodes. Examples thereof include, but are not limited to: electrically conductive metal oxides such as tin oxide, indium oxide and indium tin oxide (ITO); metals such as platinum, gold, silver, copper, iron, tin, zinc, aluminum, indium, chromium, lithium, sodium, potassium, cesium, calcium, magnesium, palladium, molybdenum, amorphous silicon and polysilicon, and alloys thereof; inorganic electrically conductive substances such as copper iodide and copper sulfide; polythiophene, polypyrrole, polyaniline; a complex of polyethylenedioxythiophene and polystyrene sulfonic acid, and the like; electrically conductive polymers whose electrical conductivities are enhanced by doping with iodine or the like; carbon materials and the like; materials containing an organic component and an electrical conductor; and the like. These electrode materials may be used alone, or a plurality of these materials may be used as a laminate or a mixture.

Among others, materials containing an organic component and an electrical conductor are preferable in that they afford increased electrode flexibility, good adhesion in bending, and good electrical connection. The organic component is not particularly limited, and may be, for example, a monomer, an oligomer or polymer, a photopolymerization initiator, a plasticizer, a leveling agent, a surfactant, a silane coupling agent, an antifoaming agent, or a pigment. Among these, an oligomer or polymer is preferred, in terms of improving the bending resistance of the electrode.

The oligomer or polymer is not particularly limited, and an acrylic resin, an epoxy resin, a novolac resin, a phenol resin, a polyimide precursor, a polyimide, or the like can be used. However, an acrylic resin is preferred, in terms of improving crack resistance upon bending. This is assumed to be because, an acrylic resin has a glass transition temperature of 100° C. or lower, and thus softens during the thermal curing of the conductive film to increase the bond between electrical conductor particles.

The acrylic resin is a resin which contains at least a structure derived from an acrylic monomer, as a repeating unit. Specifically, as the acrylic monomer, any compound containing a carbon-carbon double bond can be used, and preferred examples thereof include:
acrylic monomers such as methyl acrylate, acrylic acid, 2-ethylhexyl acrylate, ethyl methacrylate, n-butyl acrylate, i-butyl acrylate, i-propane acrylate, glycidyl acrylate, N-methoxymethyl acrylamide, N-ethoxymethyl acrylamide, N-n-butoxymethyl acrylamide, N-isobutoxymethyl acrylamide, butoxy triethylene glycol acrylate, dicyclopentanyl acrylate, dicyclopentenyl acrylate, 2-hydroxyethyl acrylate, isobornyl acrylate, 2-hydroxypropylacrylate, isodecyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, acrylamide, aminoethyl acrylate, phenyl acrylate, phenoxyethyl acrylate, 1-naphthyl acrylate, 2-naphthyl acrylate, thiophenol acrylate, and benzylmercaptan acrylate; those obtained by replacing the acrylate in these monomers with methacrylate; styrenes such as styrene, p-methylstyrene, o-methylstyrene, m-methylstyrene, α-methylstyrene, chloromethylstyrene, and hydroxymethylstyrene; γ-methacryloxypropyltrimethoxysilane; and 1-vinyl-2-pyrrolidone.
These acrylic monomers may be used alone, or in combination of two or more kinds.

An electrical conductor may be any electrically conductive material which can be generally used for electrodes, and is preferably metal particles. This is because metal particles serve to form irregularities on the surfaces of the conductive films, and the gate insulating film infiltrates into the irregularities to produce an anchoring effect, thereby improving the adhesion between the conductive films and the gate insulating film. This adhesion between the conductive film and the gate insulating film being improved by the irregularities on the conductive film improves the bending resistance and the reliability of the device in terms of electrical characteristics in repeated applications of voltage.

Specific preferred examples of the metal particles include metal particles containing at least one of: gold, silver, copper, platinum, lead, tin, nickel, aluminum, tungsten, molybdenum, ruthenium oxide, chromium, titanium, carbon or indium. These metal particles can be used as single metal particles, or as alloy particles or mixed particles.
Among these, particles of gold, silver, copper or platinum are preferred, in terms of electrical conductivity. In particular, particles of silver are more preferred, in terms of cost and stability. It is still more preferred that the metal particles contain carbon black, in terms of reducing the electric resistivity of the conductive films.

As an index of the irregularities of the surface of each conductive film, the arithmetic average roughness (Ra) of the surface of the conductive film may be used, for example. The surface of the conductive film preferably has an Ra of, for example, from 5 to 200 nm. An Ra of 5 nm or more allows for providing an effective anchoring effect. Further, an Ra of 200 nm or less enables to produce a gate insulating film without pinhole defects. By preventing the occurrence of pinhole defects, the occurrence of a short circuit fault in the element can be prevented.

The surface roughness can be measured using a surface profilometer or an atomic force microscope (AFM). In the case of using a surface profilometer, the measurement is carried out at arbitrary selected five points on the conductive film, and the mean value of the measured values is taken as the Ra of the conductive film. Likewise, in the case of using an AFM, the measurement is carried out at arbitrary five points on the conductive film, and the mean value of the measured values is taken as the Ra of the conductive film. These measurement methods are used as appropriate depending on the size of the conductive film to be measured. In cases where the Ra can be measured by either method, the value measured by the surface profilometer is used.

The metal particles in each conductive film preferably have an average particle size of from 0.01 to 5 μm, and more preferably from 0.01 to 2 μm. When the average particle size is 0.01 μm or more, the probability of contact between the particles is improved, and it is possible to reduce the specific resistance of the electrode to be formed, and the probability of disconnection. In addition, an average particle size of 5 μm or less, on the other hand, enables to produce a conductive film having a high bending resistance. In addition, an average particle size of 2 μm or less enhances the surface smoothness, pattern accuracy, and dimensional accuracy of the electrode.

In this regard, the average particle size of the metal particles in the conductive film in the present invention can be determined, for example, by measuring the sizes of 100 particles and calculating the average value of the measurements, in which the particles are randomly selected on the basis of the images obtained by observing the cross-section of an electrode using a scanning electron microscope (SEM) at a magnification ratio of 10000×. In cases where the particles have a spherical shape, the diameter of each particle is taken as the particle size of the particle. In cases where the particles have a shape other than a spherical shape, the mean value of the maximum width and the minimum width of one particle observed by an electron microscope is calculated as the particle size of the particle.

The amount of electrical conductor in the conductive film is preferably within the range of from 70 to 95 wt % with respect to the total amount of the conductive film, and it is more preferred that the lower limit thereof be 80 mass % or more, and the upper limit thereof be 90 wt % or less. When the amount of the electrical conductor is within the above described range, the specific resistance of the conductive film and the probability of disconnection can be reduced.

The width and thickness of each of the gate electrode, source electrode, and drain electrode, and the spacing between the source electrode 5 and the drain electrode 6 are selected arbitrarily. It is preferred that each electrode have a width of from 10 μm to 10 mm and a thickness of from 0.01 μm to 100 μm, and that the spacing between the source electrode and the drain electrode be from 1 μm to 1 mm, but not limited thereto.

Examples of methods of forming an electrode include methods using known technologies, such as resistance heating evaporation, electron beaming, sputtering, plating, CVD, ion plating coating, inkjet, and printing. In addition, examples include a method in which a paste containing the organic component and the electrical conductor is applied onto an insulated substrate using a known technique such as a spin-coating method, a blade coating method, a slit die coating method, a screen printing method, a bar coater method, a casting method, a transfer printing method, an immersion and withdrawal method, or the like, and dried using an oven, a hot plate, infrared ray, or the like to form an electrode. The methods of forming an electrode is not limited to particular ones as long as they can achieve conduction.

In addition, a method of forming an electrode pattern may be a method in which an electrode thin film formed by the above described method is patterned into a desired form by a known photolithography method or the like, or may be a method in which a pattern is formed via a mask having a desired shape, when performing the vapor deposition or sputtering of an electrode substance.

(Gate Insulating Layer)

The material to be used for the gate insulating layer is not particularly limited, and examples thereof include: inorganic materials such as silicon oxide and alumina; organic polymer materials such as polyimides, polyvinyl alcohol, polyvinyl chloride, polyethylene terephthalate, polyvinylidene fluoride, polysiloxanes, and polyvinyl phenol (PVP); and mixtures of inorganic material powders and organic materials. Among these, the gate insulating layer preferably contains an organic compound containing a bond between silicon and carbon.

Examples of organic compounds include a silane compound represented by the general formula (9), an epoxy group-containing silane compound represented by the general formula (10), a condensation product thereof, and a polysiloxane containing any of these as a copolymerization component. Among these, the polysiloxane is more preferred, since it has high insulation properties and is capable of being cured at a low temperature.

$$R^{14}{}_m Si(OR^{15})_{4-m} \quad (9)$$

Here, $R^{14}$ represents a hydrogen atom, an alkyl group, a heterocyclic group, an aryl group, or an alkenyl group; and in cases where a plurality of $R^{14}$s are present, the respective $R^{14}$s may be the same as or different from each other. $R^{15}$ represents a hydrogen atom, an alkyl group, an acyl group, or an aryl group; and in cases where a plurality of $R^{15}$s are present, the respective $R^{15}$s may be the same as or different from each other. m represents an integer of from 1 to 3.

$$R^{16}{}_n R^{17}{}_l Si(OR^{18})_{4-n-l} \quad (10)$$

Here, $R^{16}$ represents an alkyl group containing one or more epoxy groups as a part of the chain; and in cases where a plurality of $R^{16}$s are present, the respective $R^{16}$s may be the same as or different from each other. $R^{17}$ represents a hydrogen atom, an alkyl group, a heterocyclic group, an aryl group, or an alkenyl group; and in cases where a plurality of $R^{17}$s are present, the respective $R^{17}$s may be the same as or different from each other. $R^{18}$ represents a hydrogen atom, an alkyl group, an acyl group, or an aryl group; and in cases where a plurality of $R^{18}$s are present, the respective $R^{18}$s may be the same as or different from each other. l represents an integer of from 0 to 2, and n represents 1 or 2, with the proviso that l+n≤3.

To the description of the alkyl group, acyl group, and aryl group in $R^{14}$ to $R^{18}$, the below-mentioned description of $R^{19}$ to $R^{24}$ equally applies.

The heterocyclic group in each of $R^{14}$ and $R^{17}$ represents a group derived from an aliphatic ring which contains an atom other than a carbon atom within the ring, such as a pyran ring, a piperidine ring, or an amide ring, which group may or may not contain a substituent. The number of carbon atoms in the heterocyclic group is not particularly limited, but it is preferably within the range of from 2 to 20.

The alkenyl group in each of $R^{14}$ and $R^{17}$ represents, for example, a vinyl group, an allyl group, a butadienyl group or the like, which is an unsaturated aliphatic hydrocarbon group containing a double bond, and which group may or may not contain a substituent. The number of carbon atoms in the alkenyl group is not particularly limited, but it is preferably within the range of from 2 to 20.

The alkyl group having an epoxy group(s) as a part of the chain, in $R^{16}$, represents an alkyl group having a 3-membered ring ether structure formed by two adjacent carbon atoms being linked by one oxygen atom, as a part of the chain. This includes both the case where two adjacent carbon atoms contained in the main chain, which is the portion where carbon atoms extend continuously for the longest length, of the alkyl group are used; and the case where two adjacent carbon atoms contained in a portion other than the main chain, a so-called side chain, of the alkyl group are used.

By incorporating the silane compound represented by the general formula (9) as a copolymerization component of a polysiloxane, it is possible to improve the insulation properties and chemical resistance of the resulting film while maintaining a high transparency in the visible light region, and to form an insulating film with fewer traps.

Further, it is preferred that at least one of the $R^{14}$s in the general formula (9), which are present in a number of m, be an aryl group, because it allows for improving the flexibility of the resulting insulating film, and to prevent the occurrence of cracks.

Specific examples of the silane compound represented by the general formula (9) include vinyltrimethoxysilane, vinyltriethoxysilane, 3-methacryloxypropyltrimethoxysilane, 3-methacryloxypropyltriethoxysilane, methyltrimethoxysilane, methyltriethoxysilane, ethyltrimethoxysilane, ethyltriethoxysilane, propyltrimethoxysilane, propyltriethoxysilane, hexyltrimethoxysilane, octadecyltrimethoxysilane, octadecyltriethoxysilane, phenyltrimethoxysilane, phenyltriethoxysilane, p-tolyltrimethoxysilane, benzyltrimethoxysilane, α-naphthyltrimethoxysilane, β-naphthyltrimethoxysilane, 3-aminopropyltriethoxysilane, N-(2-aminoethyl)-3-aminopropyltrimethoxysilane, 3-chloropropyltrimethoxysilane, dimethyldimethoxysilane, dimethyldiethoxysilane, diphenyldimethoxysilane, diphenyldiethoxysilane, methylphenyldimethoxysilane, methylvinyldimethoxysilane, methylvinyldiethoxysilane, 3-aminopropylmethyldimethoxysilane, N-(2-aminoethyl)-3-aminopropylmethyldimethoxysilane, 3-chloropropylmethyldimethoxysilane, 3-chloropropylmethyldiethoxysilane, cyclohexylmethyldimethoxysilane, 3-methacryloxypropyldimethoxysilane, octadecylmethyldimethoxysilane, trimethoxysilane, trifluoroethyltrimethoxysilane, trifluoroethyltriethoxysilane, trifluoroethyltriisopropoxysilane, trifluoropropyltrimethoxysilane, trifluoropropyltriethoxysilane, trifluoropropyltriisopropoxysilane, heptadecafluorodecyltrimethoxysilane, heptadecafluorodecyltriethoxysilane, heptadecafluorodecyltriisopropoxysilane, tridecafluorooctyltriethoxysilane, tridecafluorooctyltrimethoxysilane, tridecafluorooctyltriisopropoxysilane, trifluoroethylmethyldimethoxysilane, trifluoroethylmethyldiethoxysi lane, trifluoroethylmethyldiisopropoxysilane, trifluoropropylmethyldimethoxysilane, trifluoropropylmethyldiethoxysilane, trifluoropropylmethyldiisopropoxysilane, heptadecafluorodecylmethyldimethoxysilane, heptadecafluorodecylmethyldiethoxysilane, heptadecafluorodecylmethyldiisopropoxysilane, tridecafluorooctylmethyldimethoxysilane, tridecafluorooctylmethyldiethoxysilane, tridecafluorooctylmethyldiisopropoxysilane, trifluoroethylethyldimethoxysilane, trifluoroethylethyldiethoxysilane, trifluoroethylethyldiisopropoxysilane, trifluoropropyleth- yldimethoxysilane, trifluoropropylethyldiethoxysilane, trifluoropropylethyldiisopropoxysilane, heptadecafluorodecylethyldimethoxysilane, heptadecafluorodecylethyldiethoxysilane, heptadecafluorodecylethyldiisopropoxysilane, tridecafluorooctylethyldiethoxysilane, tridecafluorooctylethyldimethoxysilane, tridecafluorooctylethyldiisopropoxysilane, p-trifluorophenyltriethoxysilane, and the like.

To increase the crosslinking density and to improve the chemical resistance and insulation properties of the gate insulating layer, it is preferable to use, among the above mentioned silane compounds, vinyltrimethoxysilane, vinyltriethoxysilane, methyltrimethoxysilane, methyltriethoxysilane, ethyltrimethoxysilane, ethyltriethoxysilane, propyltrimethoxysilane, propyltriethoxysilane, hexyltrimethoxysilane, octadecyltrimethoxysilane, octadecyltriethoxysilane, phenyltrimethoxysilane, p-tolyltrimethoxysilane, benzyltrimethoxysilane, α-naphthyltrimethoxysilane, β-naphthyltrimethoxysilane, trifluoroethyltrimethoxysilane, trimethoxysilane, or p-trifluorophenyltriethoxysilane, which is a compound represented by the general (9), wherein m=1. Further, in terms of mass production, it is particularly preferable to use: vinyltrimethoxysilane, methyltrimethoxysilane, ethyltrimethoxysilane, propyltrimethoxysilane, hexyltrimethoxysilane, octadecyltrimethoxysilane, octadecyltrimethoxysilane, phenyltrimethoxysilane, p-tolyltrimethoxysilane, benzyltrimethoxysilane, α-naphthyltrimethoxysilane, β-naphthyltrimethoxysilane, trifluoroethyltrimethoxysilane, or trimethoxysilane, which is a compound represented by the general formula (9), wherein $R^{15}$ is a methyl group.

In addition, it is more preferred that two or more kinds of the silane compounds represented by the general formula (9) are used in combination. In particular, the use of a silane compound containing an alkyl group and a silane compound containing an aryl group in combination is particularly preferred, because it allows for providing high insulation properties and flexibility for preventing the occurrence of cracks in a balanced manner.

Specific examples of the epoxy group-containing silane compound represented by the general formula (10) include γ-glycidoxypropyltrimethoxysilane, β-(3,4-epoxycyclohexyl)ethyltrimethoxysilane, γ-glycidoxypropyltriethoxysilane, β-(3,4-epoxycyclohexyl)ethyltriethoxysilane, γ-glycidoxypropyltriisopropoxysilane, β-(3,4-epoxycyclohexyl)ethyltriisopropoxysilane, γ-glycidoxypropylmethyldi- methoxysilane, β-(3,4-epoxycyclohexyl)ethylmethyldimethoxysilane, γ-glycidoxypropylmethyldiethoxysilane, β-(3,4-epoxycyclohexyl)ethylmethyldiethoxysilane, γ-glycidoxypropylmethyldiisopropoxysilane, β-(3,4-epoxycyclohexyl)ethylmethyldiisopropoxysilane, γ-glycidoxypropylethyldimethoxysilane, β-(3,4-epoxycyclohexyl)ethylethyldimethoxysilane, γ-glycidoxypropylethyldiethoxysilane, β-(3,4-epoxycyclohexyl)ethylethyldiethoxysilane, γ-glycidoxypropylethyldiisopropoxysilane, β-(3,4-epoxycyclohexyl)ethylethyldiisopropoxysilane, β-(3,4-epoxycyclohexyl)propyltrimethoxysilane, γ-glycidoxyethyltrimethoxysilane, and the like.

To increase the crosslinking density and to improve the chemical resistance and insulation properties of the gate insulating layer, it is preferable to use, among the above mentioned silane compounds: γ-glycidoxypropyltrimethoxysilane, β-(3,4-epoxycyclohexyl)ethyltrimethoxysilane, γ-glycidoxypropyltriethoxysilane, β-(3,4-epoxycyclohexyl)ethyltriethoxysilane, γ-glycidoxypropyltriisopropoxysilane, β-(3,4-epoxycyclohexyl)ethyltriisopropoxysilane, β-(3,4-epoxycyclohexyl)propyltrimethoxysilane, or γ-glycidoxyethyltrimethoxysilane, which is a compound represented by the general formula (10), wherein n=1, and l=0. Further, in terms of mass production, it is particularly preferable to use: γ-glycidoxypropyltrimethoxysilane, β-(3,4-epoxycyclohexyl)ethyltrimethoxysilane, β-(3,4-epoxycyclohexyl)propyltrimethoxysilane, or γ-glycidoxyethyltrimethoxysilane, which is a compound represented by the general formula (10), wherein $R^{18}$ is a methyl group.

Preferably, the gate insulating layer further contains a metal compound containing a bond between a metal atom and an oxygen atom. The metal compound is not limited to a particular one as long as it contains a bond between a metal atom and an oxygen atom, and examples thereof include metal oxides, metal hydroxides, and the like. The metal atom to be contained in the metal compound is not particularly limited as long as it forms a metal chelate, and may be, for example, an atom of magnesium, aluminum, titanium, chromium, manganese, cobalt, nickel, copper, zinc, gallium, zirconium, ruthenium, palladium, indium, hafnium, or platinum. Among these, aluminum is preferred, in terms of ease of availability, cost, and the stability of the resulting metal chelate.

In the gate insulating layer, the metal atom is preferably contained in an amount of from 10 to 180 parts by weight, with respect to 100 parts by weight of the total amount of carbon atoms and silicon atoms. When the amount of the metal atom is within the above described range, the insulation properties can be more improved.

The weight ratio of the amount of the metal atom with respect to 100 parts by weight of the total amount of carbon atoms and silicon atoms in the gate insulating layer can be determined by X-ray photoelectron spectroscopy (XPS).

The gate insulating layer preferably has a film thickness of from 0.05 to 5 μm, and more preferably from 0.1 to 1 μm. A film thickness within the above range facilitates the formation of a uniform thin film. The film thickness can be measured using an atomic force microscope or by ellipsometry.

The method of producing a gate insulating layer is not particularly limited, and examples thereof include a method in which a coating film obtained by coating a substrate with a composition containing a material for forming an insulating layer and by drying the composition is subjected to a heat-treatment, as necessary. Examples of coating methods include known coating methods such as a spin-coating method, a blade coating method, a slit die coating method, a screen printing method, a bar coater method, a casting method, a transfer printing method, an immersion and withdrawal method, an inkjet method, and the like. Temperatures at which coating films are heat-treated are preferably in the range of 100 to 300° C.

Here, an insulating layer is formed, for example, by coating a substrate with a composition, drying, and heat-treating it, in which the composition contains (A) an aluminum chelate, (B) a polymer having a weight average molecular weight of 1000 or more, and (C) a solvent, and the content of (B) is 5 to 90 parts by weight with respect to 100 parts by weight of (A). The insulating layer generally contains an organic compound containing a bond between silicon and carbon and a compound containing a bond between an aluminum atom and an oxygen atom, and the content of aluminum atoms is 10 to 180 parts by weight with respect to 100 parts by weight of the total of carbon atoms and silicon atoms.

In this regard, the above-mentioned relationship between the composition and the content ratios of the atoms in the insulating layer is a rough tendency, and the above-mentioned relationship is not always satisfied, depending on, for example, the kind of the metal atom and the like.

The insulating layer may be a monolayer or multilayer. In addition, one layer may be composed of a plurality of insulating materials, or an insulating multilayer may be formed of a plurality of insulating materials that are layered.

(CNT Composite)

The state where a conjugated polymer is attached to at least a part of the surface of CNT, refers to a state in which a part of or the entire surface of the CNT is covered by the conjugated polymer. It is assumed that the conjugated polymer is able to cover the CNT, because π-electron clouds derived from the conjugated structures of the CNT and the polymer overlap with one another, to generate an interaction therebetween. Whether the CNT is covered by a conjugated polymer or not can be determined by its reflected color, since the reflected color of the CNT covered by a conjugated polymer becomes closer to that of the polymer, as compared to the reflected color of an uncovered CNT. The state of coverage of the CNT can be determined quantitatively, by identifying the presence of an attached substance, and the weight ratio of the attached substance with respect to the CNT, through an elemental analysis such as X-ray photoelectron spectroscopy (XPS).

In addition, the conjugated polymer preferably has a weight average molecular weight of 1000 or more in the context of easier attachment to the CNT. Here, a conjugated polymer refers to a compound whose repeating unit has a conjugate structure and whose polymerization degree is 2 or more.

By allowing a conjugated polymer to be attached on at least a part of the surface of CNT, it becomes possible to uniformly disperse the CNTs in a solution, without compromising the high electrical properties of the CNT. In addition, a CNT film in which CNTs are uniformly dispersed can be formed using a coating method with a solution in which CNTs are uniformly dispersed. This allows the film to achieve high semiconductor characteristics.

Examples of the method of allowing a conjugated polymer to be attached to the surface of CNT include: (I) a method in which CNT is added to a melted conjugated polymer, followed by mixing; (II) a method in which a conjugated polymer is dissolved in a solvent, and CNT is added to the resulting solution, followed by mixing; (III) a method in which CNT is pre-dispersed in a solvent by ultrasonic waves or the like, and a conjugated polymer is added to the resulting dispersion, followed mixing: and (IV) a method in which a conjugated polymer and CNT are added to a solvent, and the resulting mixture system is irradiated by ultrasonic waves and mixed. In the present invention, any of these methods may be used alone, or a plurality of these methods may be used in combination.

Examples of the conjugated polymer include polythiophene-based polymers, polypyrrole-based polymers, polyaniline-based polymers, polyacetylene-based polymers, poly-p-phenylene-based polymers, and poly-p-phenylene vinylene-based polymers, but not particularly limited thereto. As the above described polymer, a polymer composed of one type of monomer units is preferably used. However, a polymer obtained by block copolymerization or random copolymerization of different types of monomer units is also used. It is also possible to use a polymer obtained by graft polymerization.

Among the above-mentioned polymers, polythiophene-based polymers, which are easily attached to CNTs and with which a CNT composite is easier to form, are preferably used in the present invention. Those which contain, in the repeating units, a fused heteroaryl unit having a nitrogen-containing double bond in the ring and a thiophene unit are more preferable.

Examples of fused heteroaryl units having a nitrogen-containing double bond in the ring include units such as thienopyrrole, pyrrolochiazol, pyrrolopyridazine, benzimidazole, benzotriazole, benzoxazole, benzothiazol, benzothiadiazole, quinoline, quinoxaline, benzotriazine, thienoxazole, thienopyridine, thienothiazine, and thienopyrazine. Among these, particularly benzothiadiazole units or quinoxaline units are preferable. Having these units can increase the adhesion between CNTs and a conjugated polymer and disperse the CNTs in the semiconductor layer better.

Further, the conjugated polymer is particularly preferably one having a structure represented by the following general formula (11).

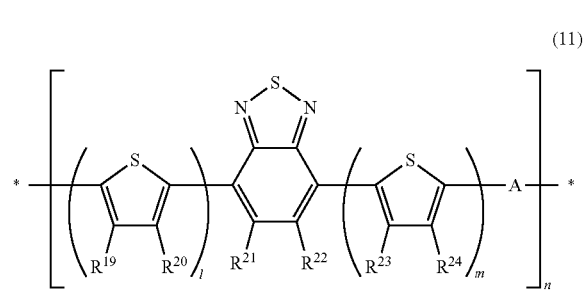

Here, $R^{19}$ to $R^{24}$ may be the same or different and each represent hydrogen, alkyl, cycloalkyl, a heterocyclic group, alkenyl, cycloalkenyl, alkynyl, alkoxy, alkylthio, arylether, arylthioether, aryl, heteroaryl, halogen atom, cyano, formyl, carbamoyl, amino, alkylcarbonyl, arylcarbonyl, carboxyl, alkoxycarbonyl, aryloxycarbonyl, alkylcarbonyloxy, arylcarbonyloxy, or silyl. In addition, the adjacent groups among $R^{19}$ to $R^{24}$ may form a ring structure. A is selected from a single bond, an arylene group, a heteroarylene group other than a thienylene group, an ethenylene group, and an ethynylene group. l and m each represent an integer of from 0 to 10, and 1+m≥1. n represents a range from 2 to 1000. When l, m, and n are 2 or greater, $R^{19}$ to $R^{24}$ and A may be the same or different in each repeating unit.

The alkyl group represents, for example, a saturated aliphatic hydrocarbon group, such as a methyl group, an ethyl group, an n-propyl group, an isopropyl group, an n-butyl group, a sec-butyl group, or a tert-butyl group, which may or may not contain a substituent. In cases where the alkyl group contains a substituent, the substituent is not particularly limited. Examples thereof include an alkoxy group, an aryl group, a heteroaryl group, and the like, and these substituents may further contain a substituent. The number of carbon atoms in the alkyl group is not particularly limited, but it is preferably one or more and 20 or less, and more preferably one or more and 8 or less, in terms of ease of availability and cost.

The cycloalkyl group represent, for example, a saturated alicyclic hydrocarbon group, such as a cyclopropyl group, a cyclohexyl group, a norbornyl group, or an adamantyl group, which may or may not contain a substituent. In cases where the cycloalkyl group contains a substituent, the substituent is not particularly limited. Examples thereof include an alkyl group, an alkoxy group, an aryl group, a heteroaryl group, and the like, and these substituents may further contain a substituent. These descriptions of the substituents equally apply to the below-mentioned description, unless otherwise specified. The number of carbon atoms in the cycloalkyl group is not particularly limited, but it is preferably within the range of from 3 to 20.

The heterocyclic group represents a group derived from an aliphatic ring which contains an atom other than a carbon atom within the ring, such as a pyran ring, a piperidine ring, or an amide ring, which group may or may not contain a substituent. The number of carbon atoms in the heterocyclic group is not particularly limited, but it is preferably within the range of from 2 to 20.

The alkenyl group represents, for example, a vinyl group, an aryl group, a butadienyl group or the like, which is an unsaturated aliphatic hydrocarbon group containing a double bond, and which group may or may not contain a substituent. The number of carbon atoms in the alkenyl group is not particularly limited, but it is preferably within the range of from 2 to 20.

The cycloalkenyl group represents, for example, a cyclopentenyl group, a cyclopentadienyl group, a cyclohexenyl group, or the like, which is an unsaturated aliphatic hydrocarbon group containing a double bond, and which group may or may not contain a substituent. The number of carbon atoms in the cycloalkenyl group is not particularly limited, but it is preferably within the range of from 3 to 20.

The alkynyl group represents, for example, an ethynyl group, which is an unsaturated aliphatic hydrocarbon group containing a triple bond, and which group may or may not contain a substituent. The number of carbon atoms in the alkynyl group is not particularly limited, but it is preferably within the range of from 2 to 20.

The alkoxy group represents, for example, a methoxy group, an ethoxy group, a propoxy group, or the like, which is a functional group in which one end of the ether bond is substituted by an aliphatic hydrocarbon group, which may or may not contain a substituent. The number of carbon atoms in the alkoxy group is not particularly limited, but it is preferably within the range of from 1 to 20.

The alkylthio group represents a group in which the oxygen atom of the ether bond of an alkoxy group is substituted by a sulfur atom, and which group may or may not contain a substituent. The number of carbon atoms in the alkylthio group is not particularly limited, but it is preferably within the range of from 1 to 20.

The arylether group represents, for example, a phenoxy group, a naphthoxy group, or the like, which is a functional group in which one end of the ether bond is substituted by an aromatic hydrocarbon group, which may or may not contain a substituent. The number of carbon atoms in the arylether group is not particularly limited, but it is preferably within the range of from 6 to 40.

The arylthioether group represents a group in which the oxygen atom of the ether bond of an arylether group is substituted by a sulfur atom, and which group may or may not contain a substituent. The number of carbon atoms in the arylthioether group is not particularly limited, but it is preferably within the range of from 6 to 40.

The aryl group represents, for example, an aromatic hydrocarbon group such as a phenyl group, a naphthyl group, a biphenyl group, an anthracenyl group, a phenanthryl group, a terphenyl group, or a pyrenyl group, which may or may not contain a substituent. The number of carbon atoms in the aryl group is not particularly limited, but it is preferably within the range of from 6 to 40.

The heteroaryl group represents, for example, a furanyl group, a thiophenyl group, a benzofuranyl group, a dibenzofuranyl group, a pyridyl group, or a quinolinyl group, which is an aromatic group having one or more atoms other than a carbon atom in the ring, which group may or may not contain a substituent. The number of carbon atoms in the heteroaryl group is not particularly limited, but it is preferably within the range of from 2 to 30.

A halogen atom represents fluorine, chlorine, bromine, or iodine.

The alkylcarbonyl group represents an acetyl group, a hexanoyl group, or the like, which is a functional group in which one end of the carbonyl bond is substituted by an aliphatic hydrocarbon group, which may or may not contain a substituent. The number of carbon atoms in the alkylcarbonyl group is not particularly limited, but it is preferably within the range of from 2 to 20.

The arylcarbonyl group represents, for example, a benzoyl group or the like, which is a functional group in which one end of the carbonyl bond is substituted by an aromatic hydrocarbon group, which may or may not contain a substituent. The number of carbon atoms in the arylcarbonyl group is not particularly limited, but it is preferably within the range of from 7 to 40.

The alkoxycarbonyl group represents, for example, a methoxycarbonyl group or the like, which is a functional group in which one end of the carbonyl bond is substituted by an alkoxy group, which may or may not contain a substituent. The number of carbon atoms in the alkoxycarbonyl group is not particularly limited, but it is preferably within the range of from 2 to 20.

The aryloxycarbonyl group represents, for example, a phenoxycarbonyl group or the like, which is a functional group in which one end of the carbonyl bond is substituted by an arylkoxy group, which may or may not contain a substituent. The number of carbon atoms in the aryloxycarbonyl group is not particularly limited, but it is preferably within the range of from 7 to 40.

The alkylcarbonyloxy group represents, for example, an acetoxy group or the like, which is a functional group in which one end of the ether bond is substituted by an alkylcarbonyl group, which may or may not contain a substituent. The number of carbon atoms in the alkylcarbonyloxy group is not particularly limited, but it is preferably within the range of from 2 to 20.

The arylcarbonyloxy group represents, for example, a benzoyloxy group or the like, which is a functional group in which one end of the ether bond is substituted by an arylcarbonyl group, which may or may not contain a substituent. The number of carbon atoms in the arylcarbonyloxy group is not particularly limited, but it is preferably within the range of from 7 to 40.

The carbamoyl group, amino group, and silyl group may or may not contain a substituent. In cases where they contain a substituent, examples of the substituent include an alkyl group, a cycloalkyl group, an aryl group, a heteroaryl group, and the like, and these substituents may further contain a substituent.

In cases where the adjacent groups are bound together to form a ring structure, $R^{19}$ and $R^{20}$ for example are bound together to form a conjugate or non-conjugate fused ring, according to the general formula (11). The fused ring may contain, as a constituent element, a nitrogen, oxygen, sulfur, phosphorus, or silicon atom besides carbon and may further be fused to another ring.

Next, A in the general formula (11) will be described. The arylene group represents a bivalent (two binding sites) aromatic hydrocarbon group and may be unsubstituted or substituted. In cases where it is substituted, examples of substituents include the above-mentioned alkyls, heteroaryls, and halogens. Preferable specific examples of arylene groups include phenylene, naphthylene, biphenylene, phenanthrylene, anthrylene, terphenylene, pyrenylene, fluorenylene, perylenylene, and the like.

The heteroarylene group represents a bivalent heteroaromatic ring group and may be unsubstituted or substituted. Preferable specific examples of heteroarylene groups include: pyridylene, pyrazylene, quinolinylene, isoquinolylene, quinoxalylene, acridinylene, indolylene, carbazolylene, and the like; in addition, bivalent groups derived from heteroaromatic rings such as benzofuran, dibenzofuran, benzothiophene, dibenzothiophene, benzodithiophene, benzosilol, and dibenzosilol; and the like.

In the general formula (11), l and m represent an integer of from 0 to 10, and $l+m \geq 1$. Preferably, l and m are each 1 or greater, further preferably $l+m \geq 4$, in that the structure containing a thiophene unit enhances the adhesion to CNTs and enhances the dispersibility of the CNTs. In addition, $l+m \leq 12$ is preferable in that the synthesis and subsequent polymerization of monomers are easy.

n represents the polymerization degree of a conjugated polymer and is in the range of 2 to 1000. Considering the easier attachment to CNTs, n is preferably in the range of 3 to 500. In the present invention, a polymerization degree n is a value determined on the basis of the weight average molecular weight. Weight average molecular weights are determined through measurement using GPC (gel permeation chromatography) and conversion using a polystyrene standard sample.

Also in the context of easier formation of CNT composites, the conjugated polymer is preferably soluble in a solvent, and at least one of $R^{19}$ to $R^{24}$ is preferably an alkyl group.

Examples of conjugated polymers include those having the following structures.

[1]

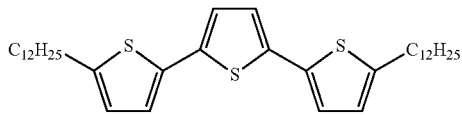

[2]

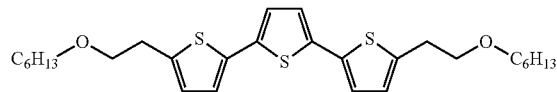

[3]

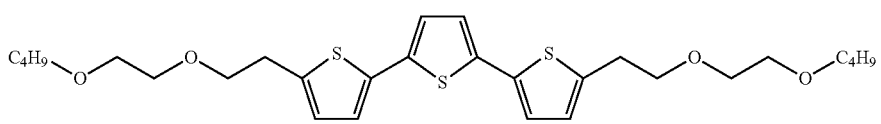

[4]

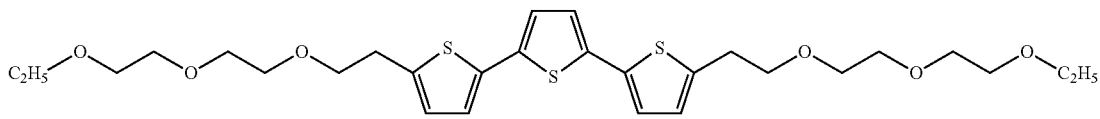

[5]

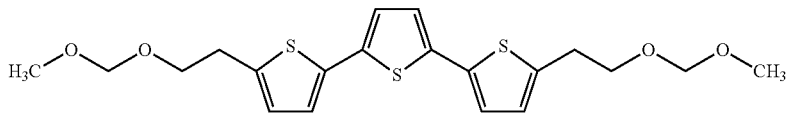

[6]

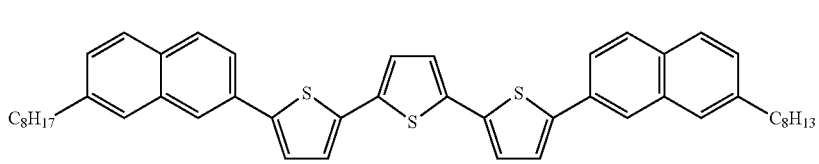

[7]

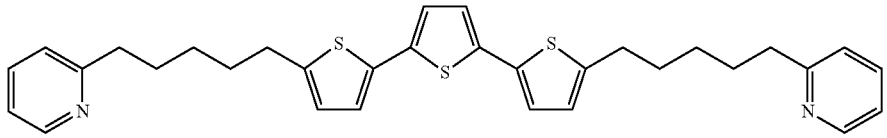

[8]

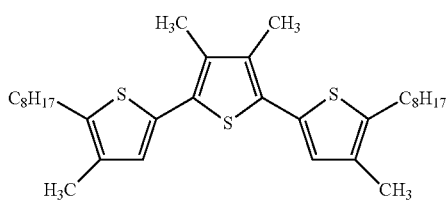

-continued
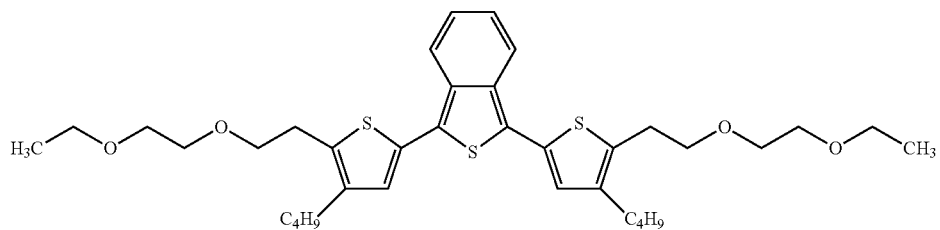
[9]
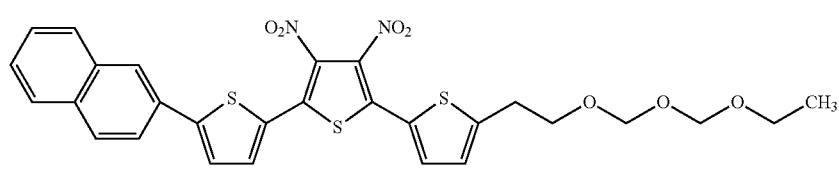
[10]
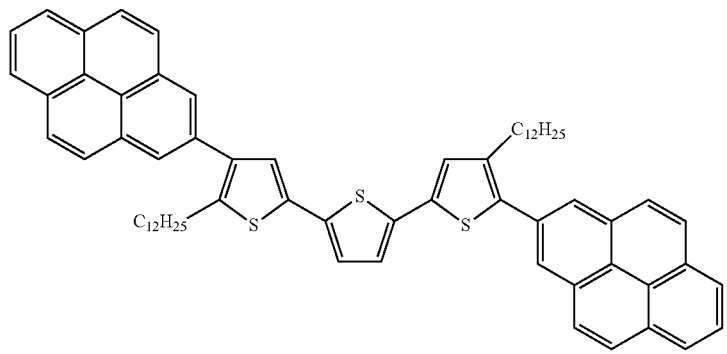
[11]
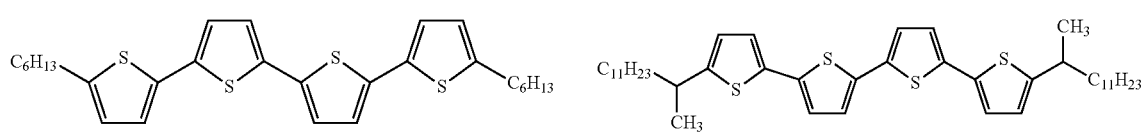
[12] [13]
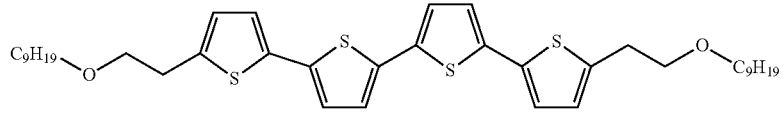
[14]
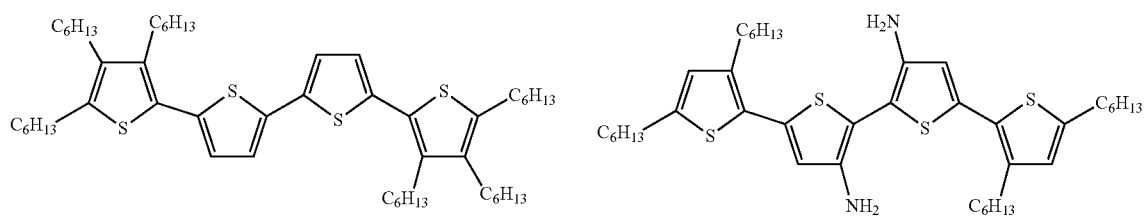
[15] [16]
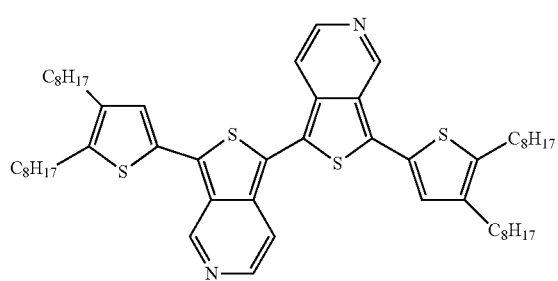
[17]

-continued
[18]
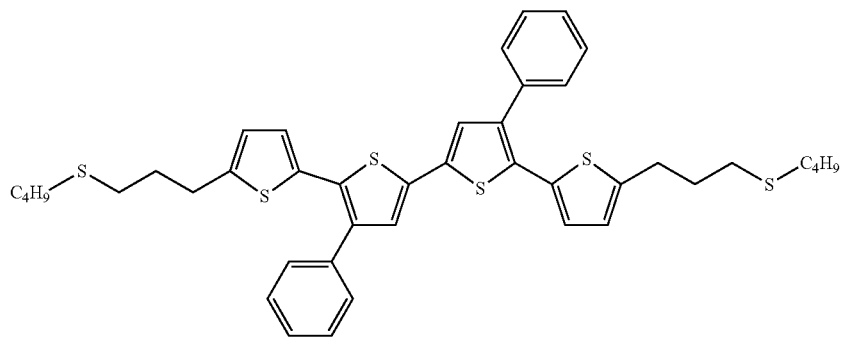
[19]
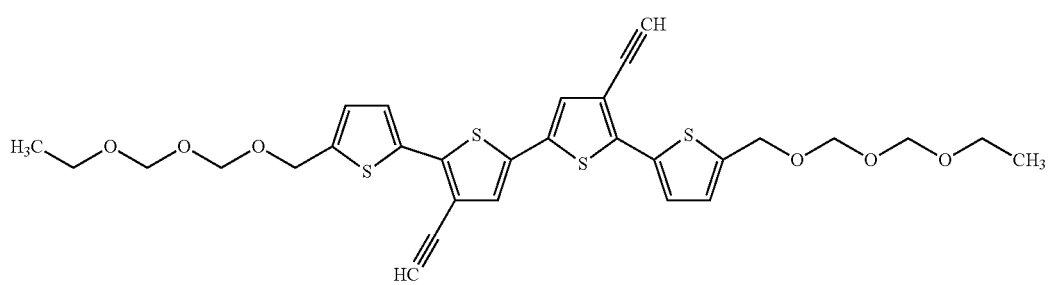
[20]
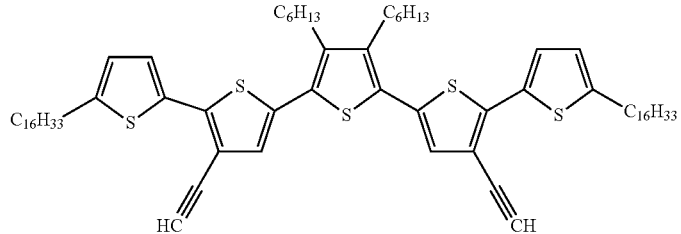
[21]
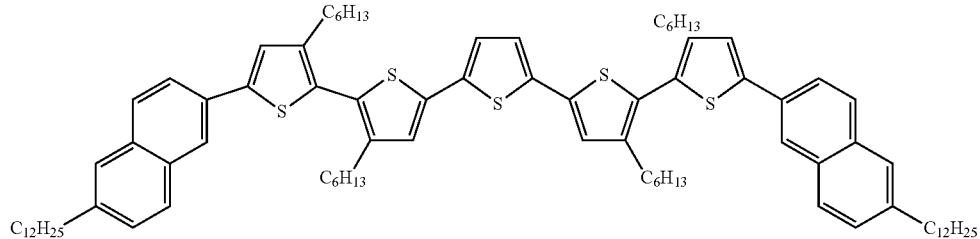
[22]
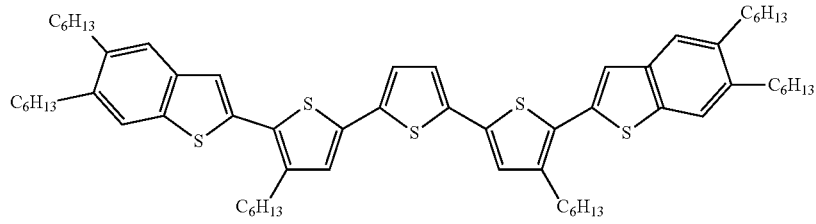
[23]
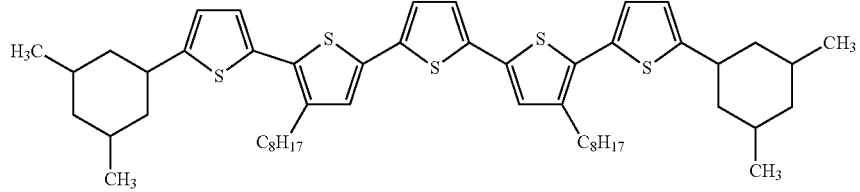

-continued
[24]
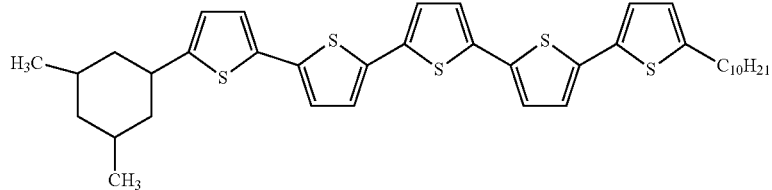
[25]
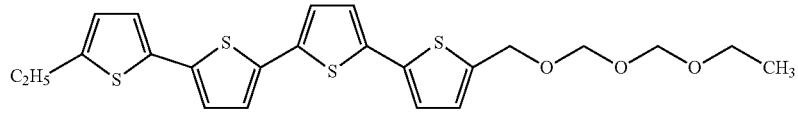
[26]
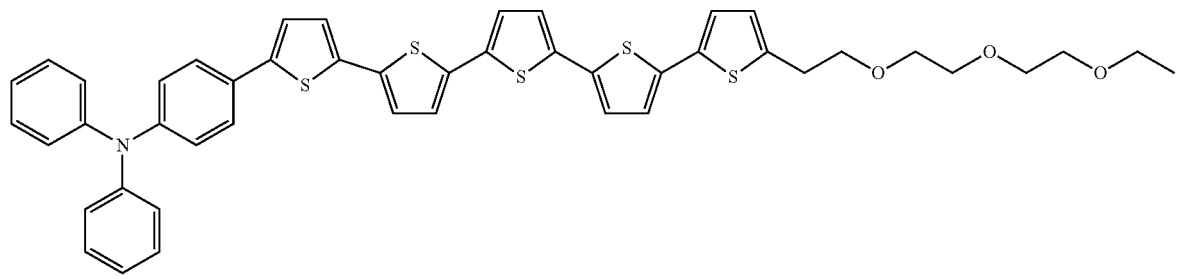
[27]
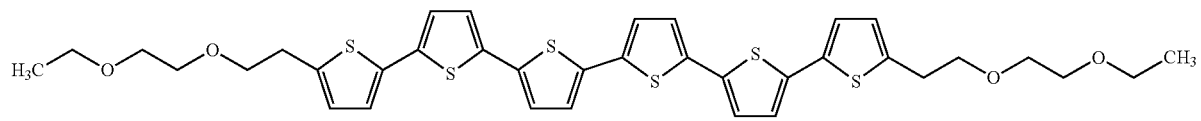
[28]
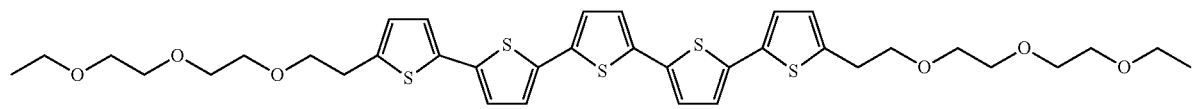
[29]
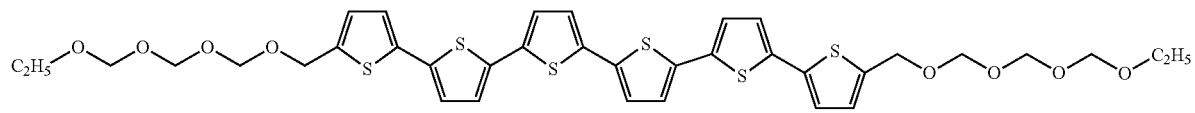
[30]
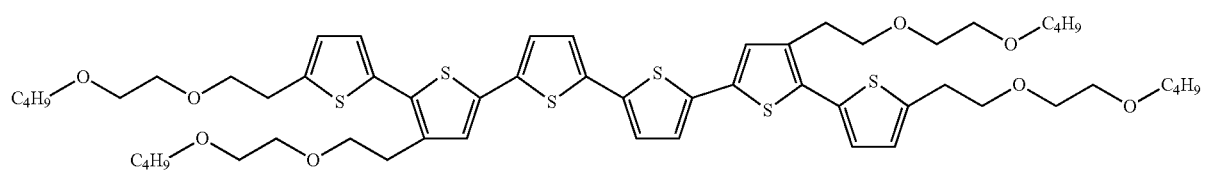
[31]
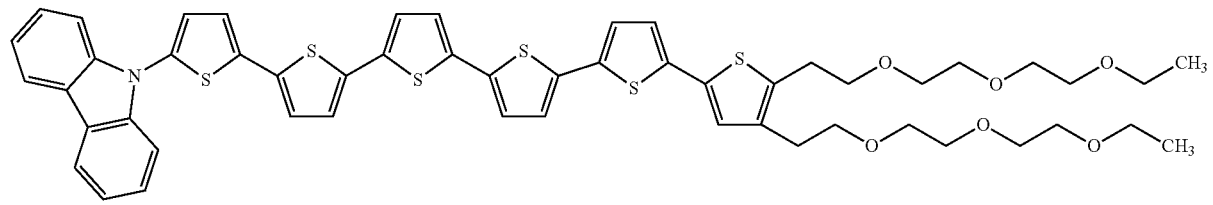
[32]
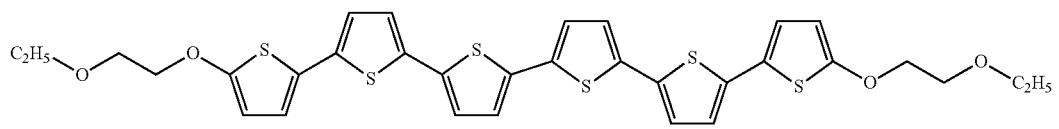

-continued
[33]
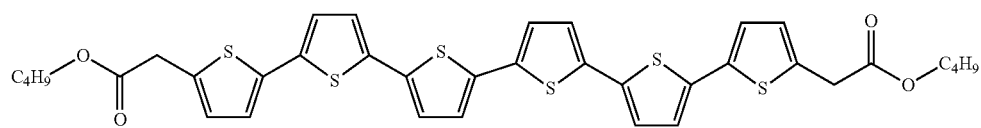
[34]
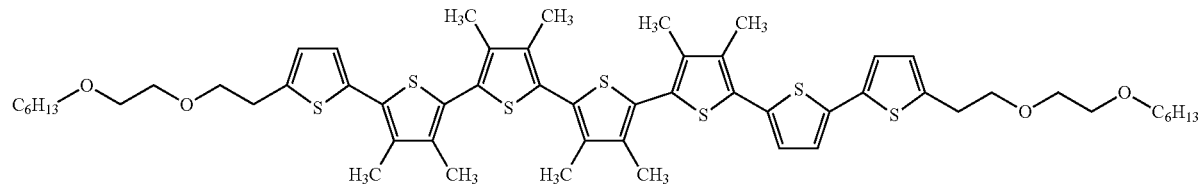
[35]
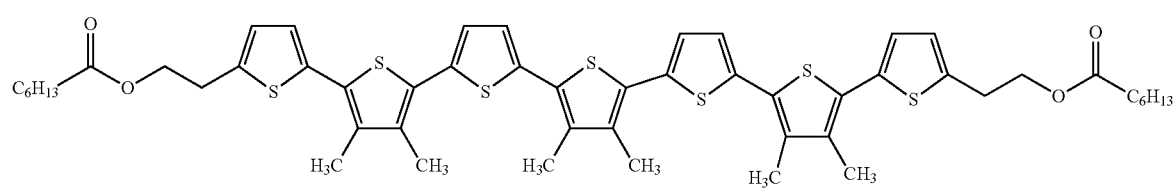
[36]
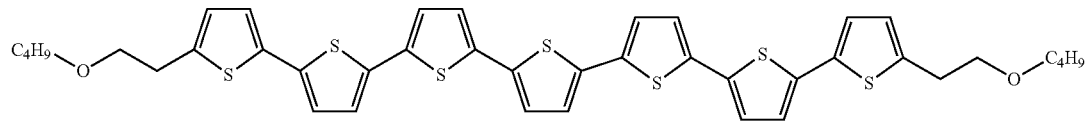
[37]
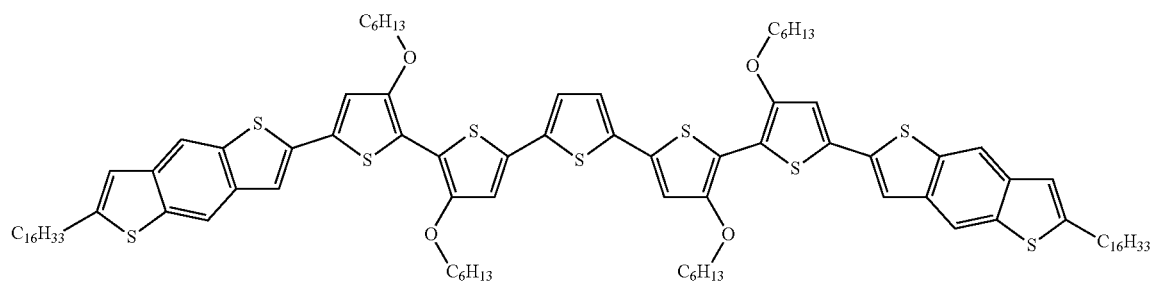
[38]
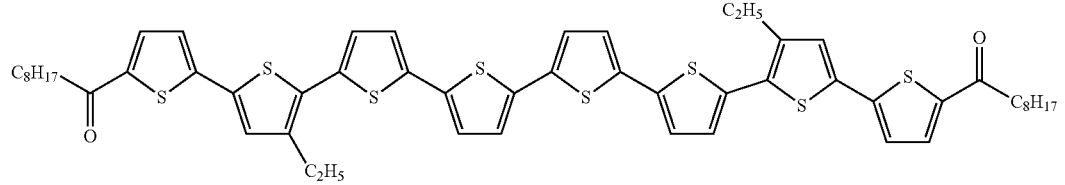
[39]
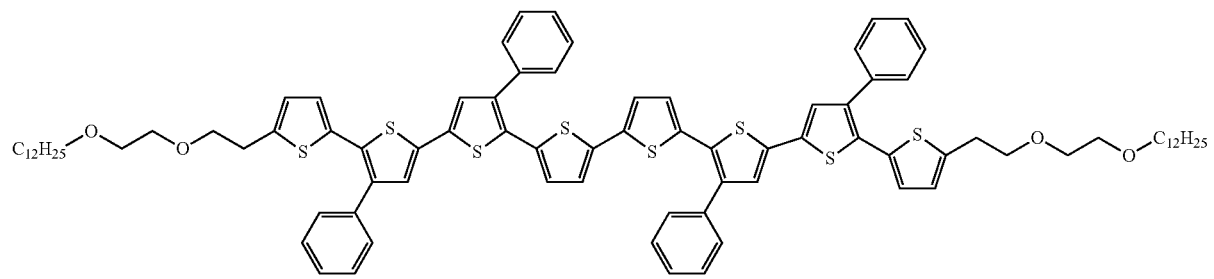

-continued
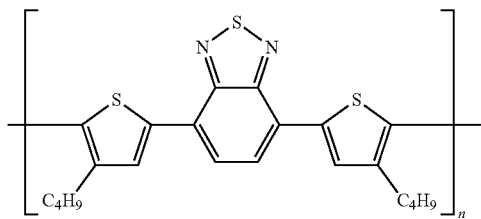
[40]
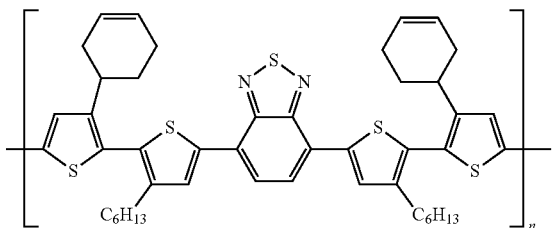
[41]
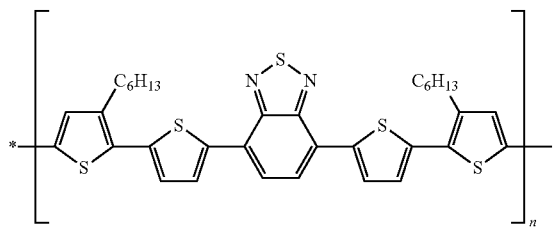
[42]
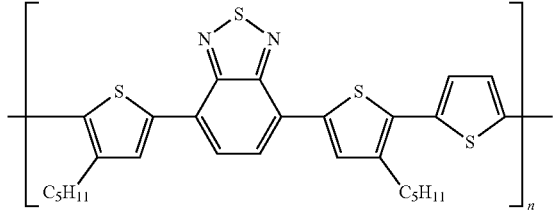
[43]
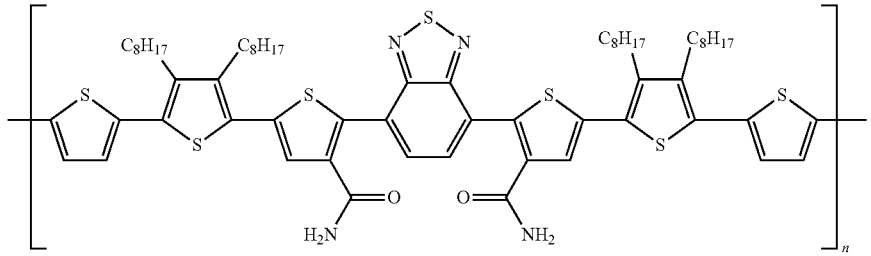
[44]
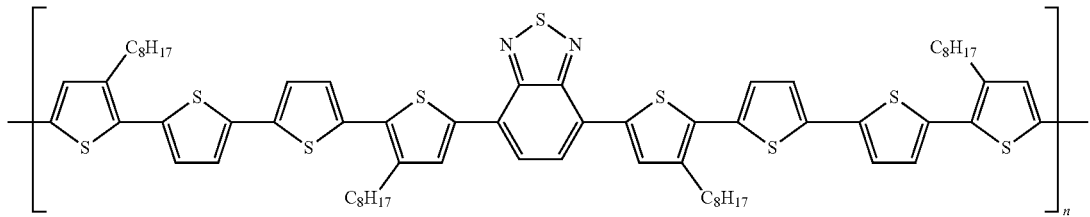
[45]
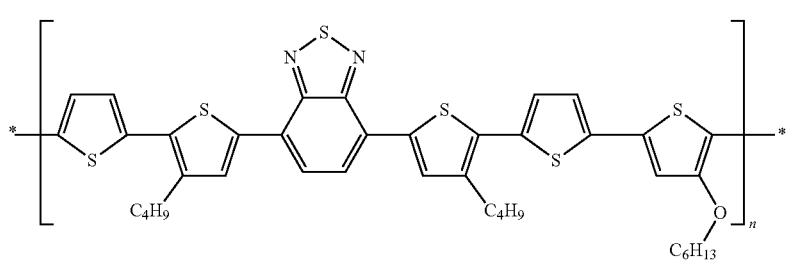
[46]
[47]

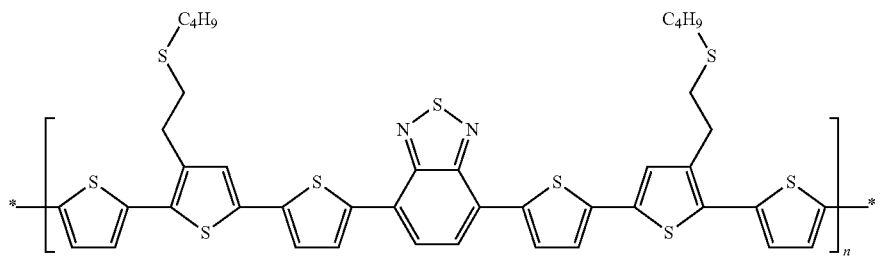
[48]
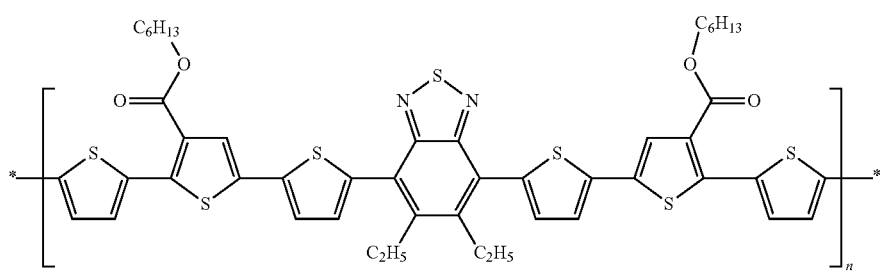
[49]
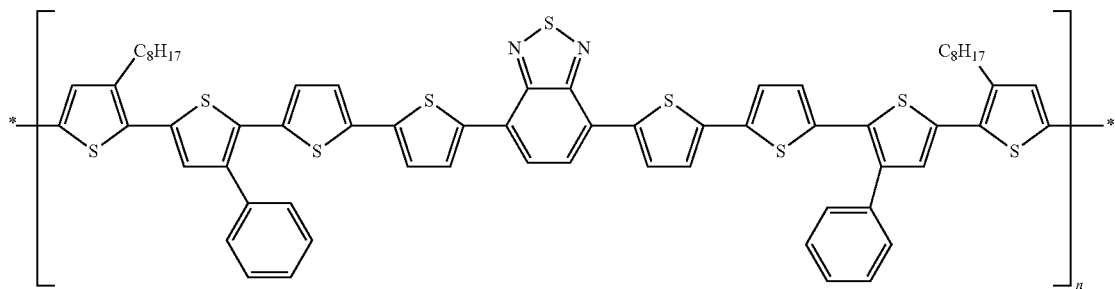
[50]
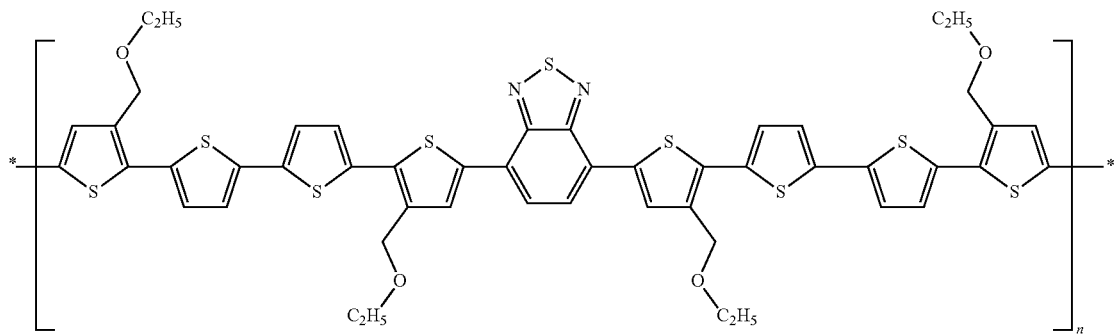
[51]
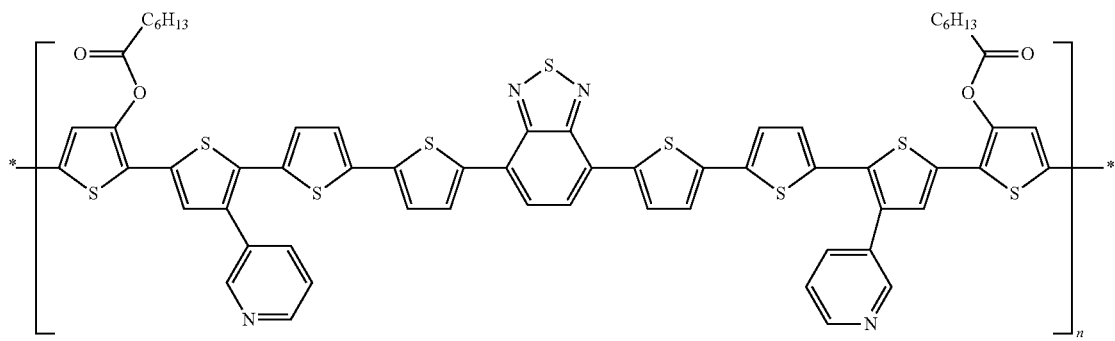
[52]

-continued
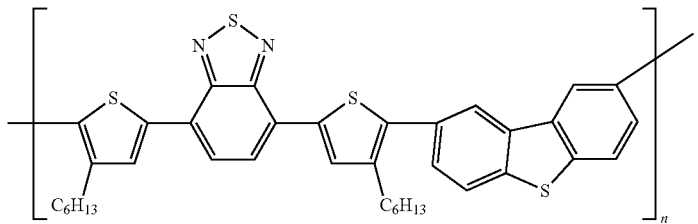
[53]
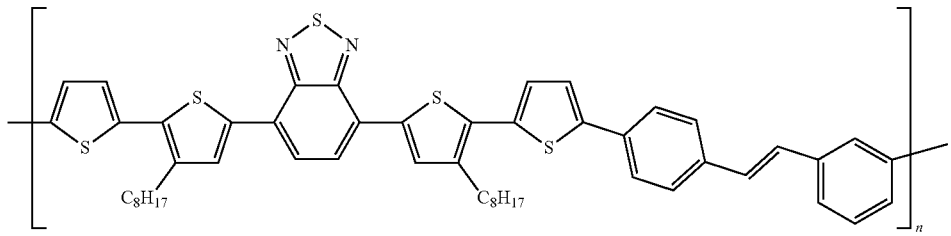
[54]
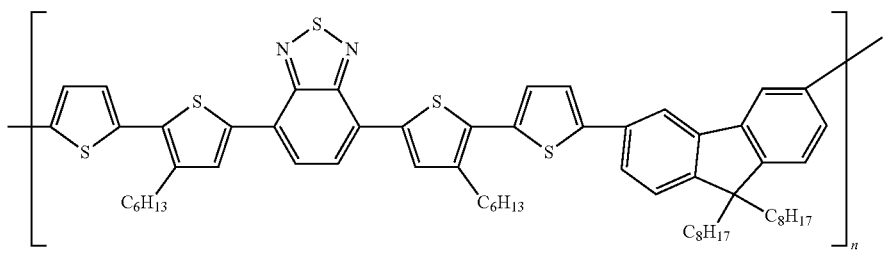
[55]
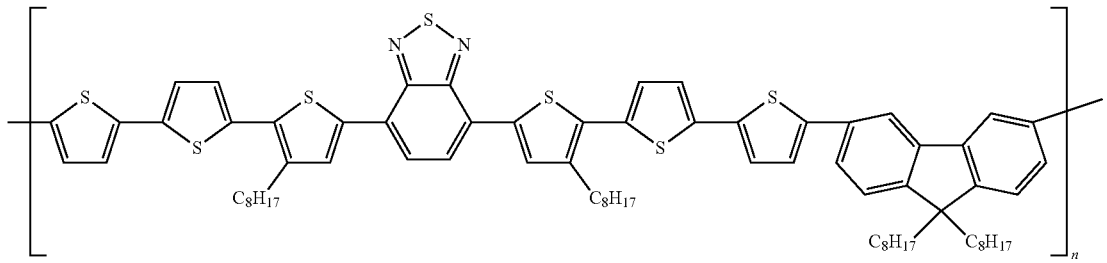
[56]
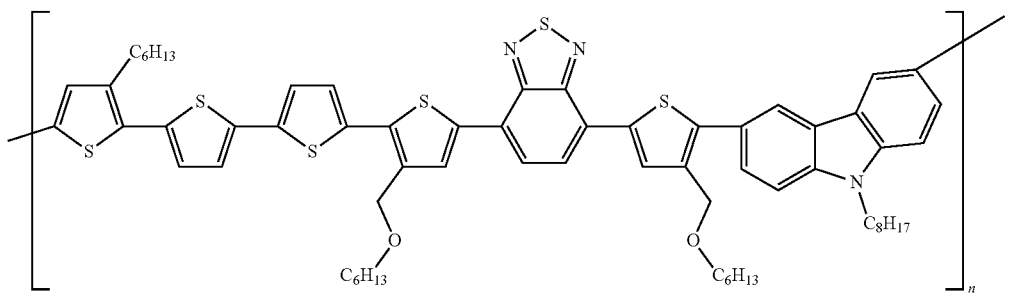
[57]
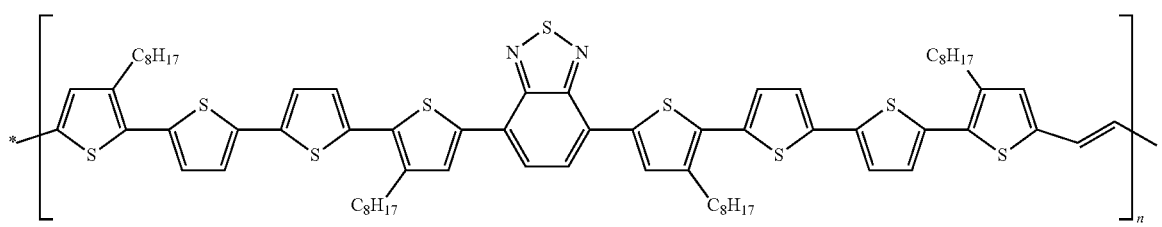
[58]

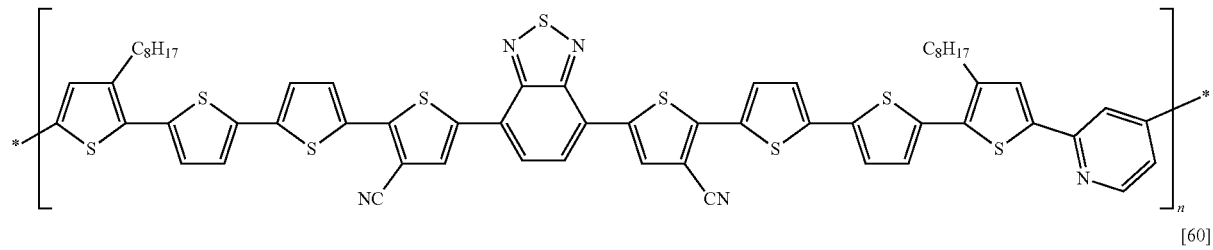
[59]
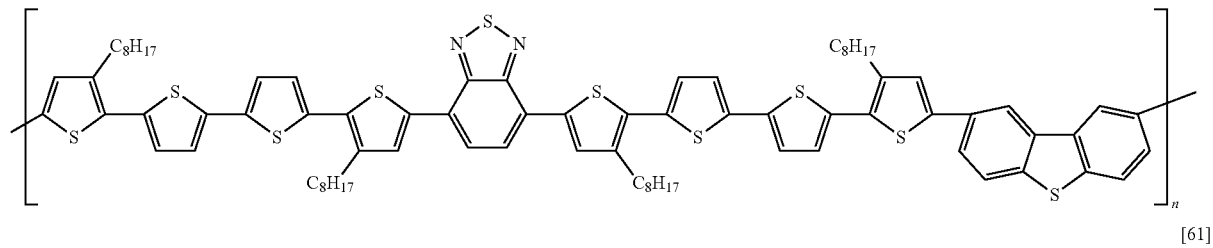
[60]
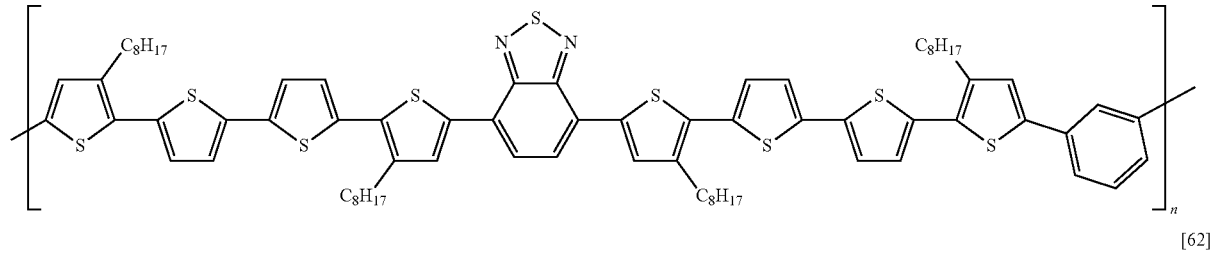
[61]
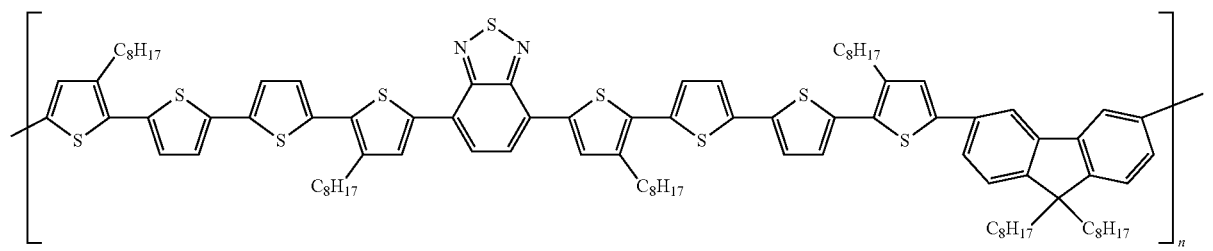
[62]
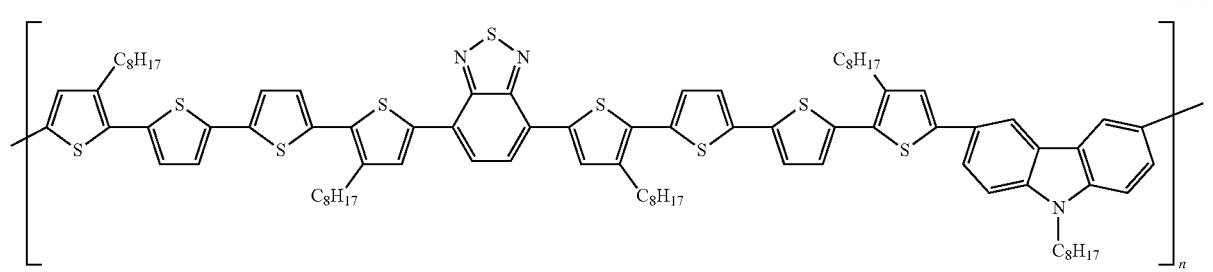
[63]
[64]

[65]
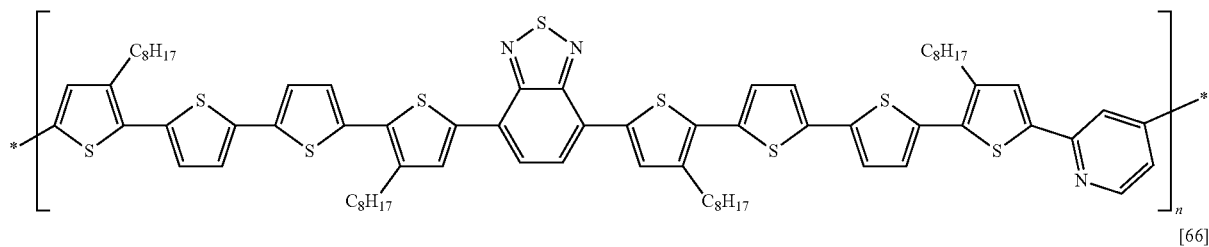
[66]
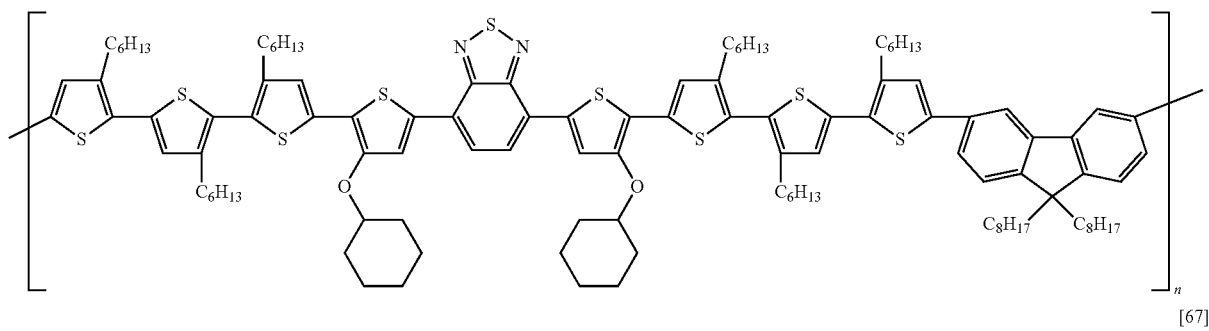
[67]
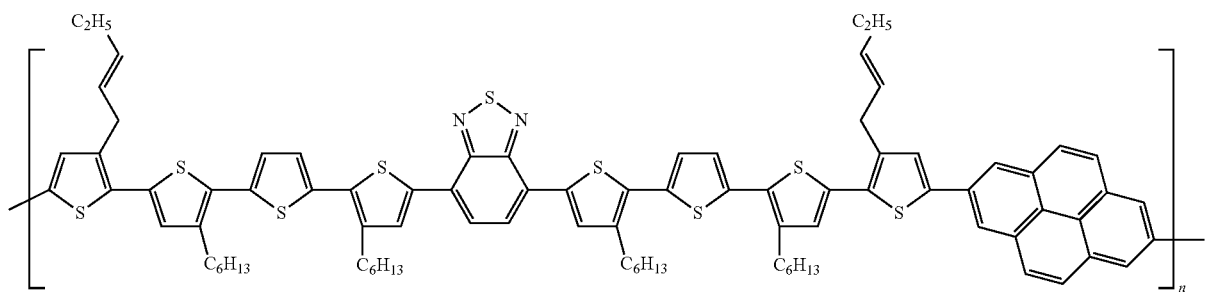
[68]
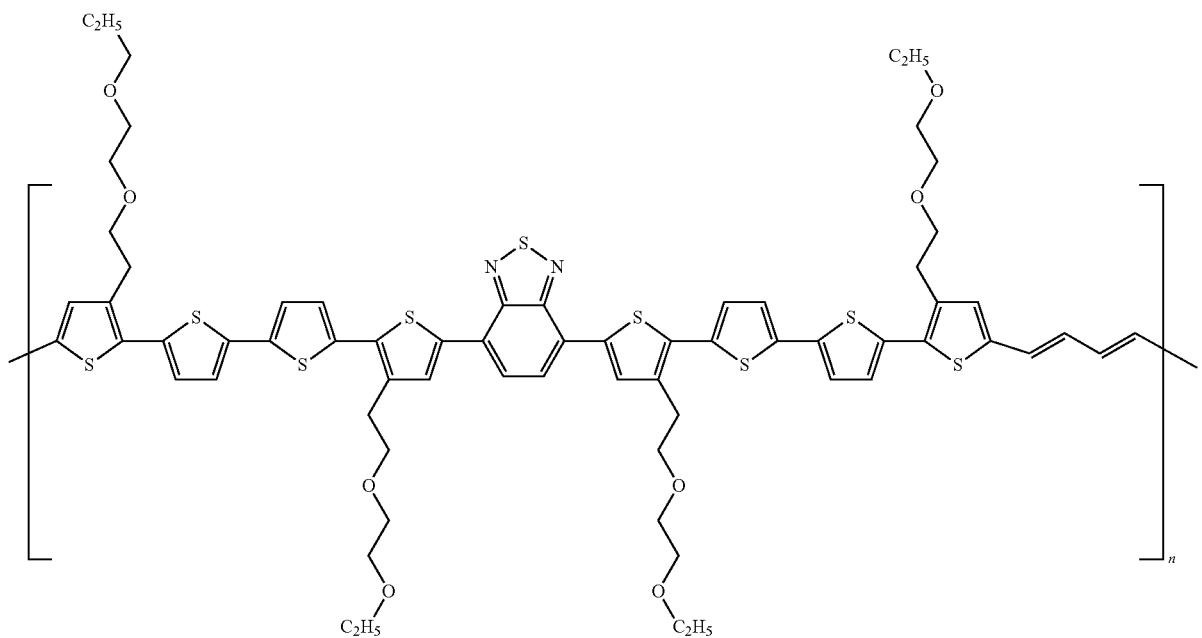

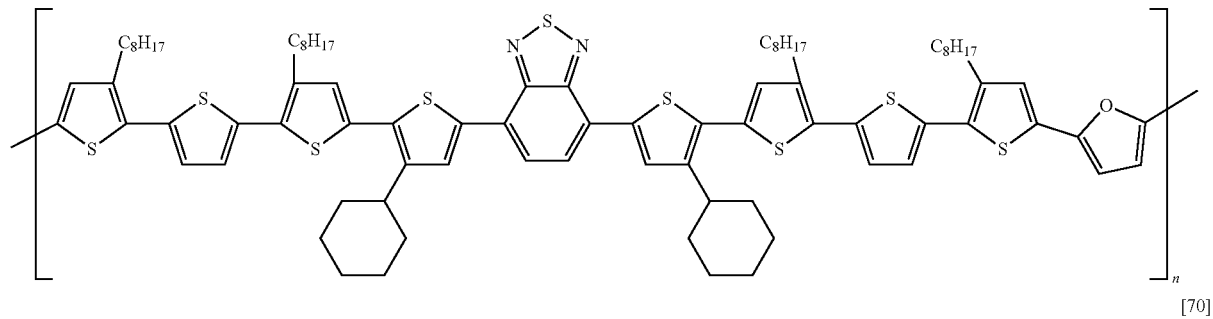
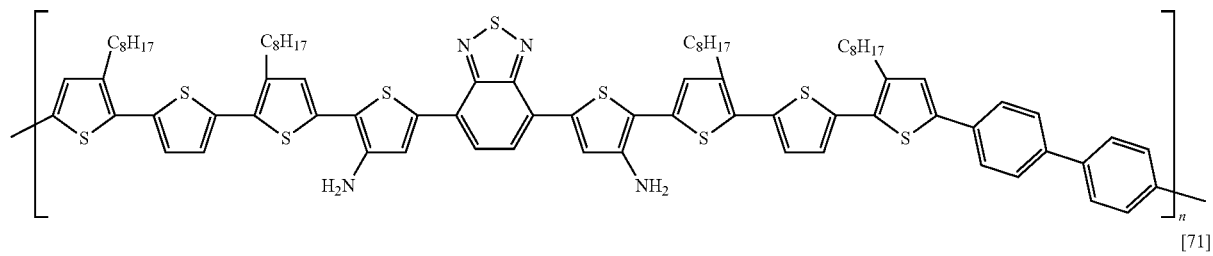
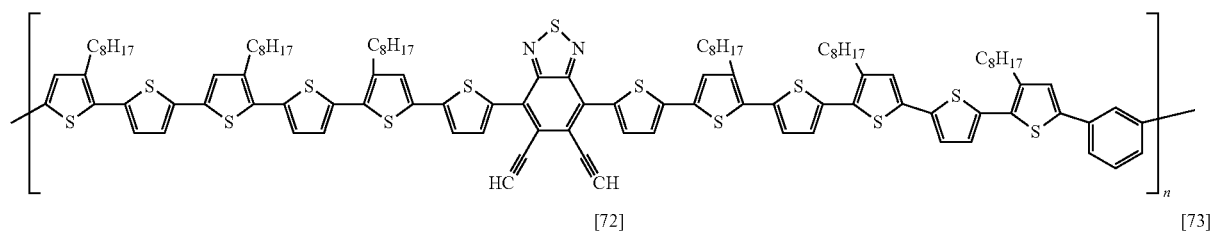
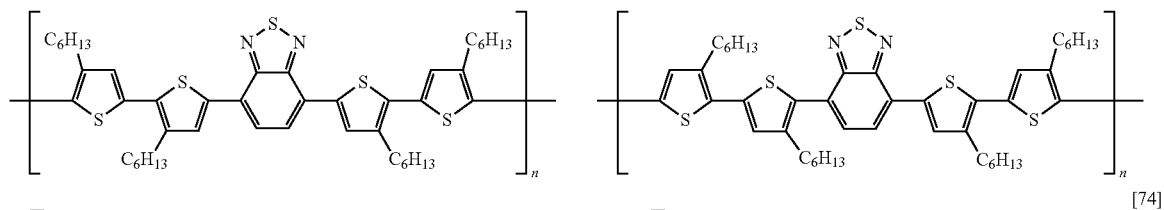
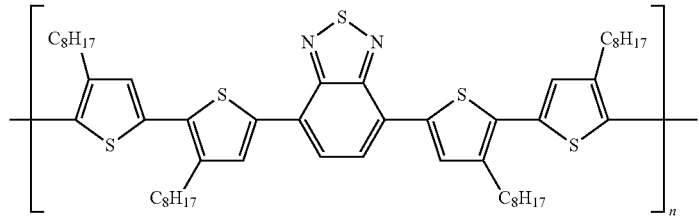

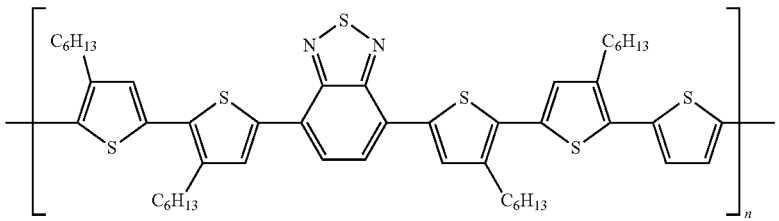

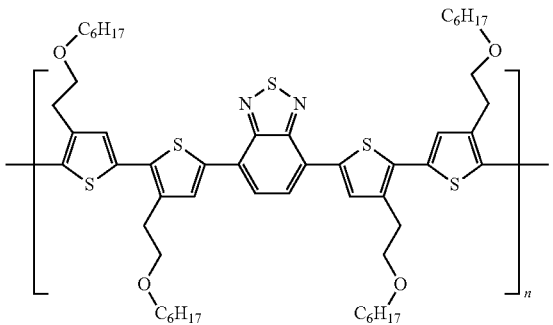

In addition, conjugated polymers can be synthesized using known methods. Examples of methods of linking thiophenes to each other include: a method in which halogenated thiophene and thiopheneboronic acid or thiopheneboronate ester are coupled in the presence of a palladium catalyst; and a method in which halogenated thiophene and a thiophene Grignard reagent are coupled in the presence of a nickel or palladium catalyst. Also in cases where another unit and a thiophene unit are linked, another halogenated unit and a thiophene unit can be coupled in the same manner. Alternatively, conjugated polymers can be obtained by introducing a polymerizable functional group to the end of the thus obtained monomer and allowing the polymerization to progress in the presence of a palladium catalyst or a nickel catalyst.

Conjugated polymers are preferably rid of impurities such as those from raw materials used in synthesis processes and the by-products. As a method of removing impurities, for example, a silica gel column graphy method, a Soxhlet's extraction method, a filtration method, an ion exchange method, a chelation method, and the like can be used. Two or more of these methods may be combined.

As a CNT, any of a single-walled CNT which is one carbon film (graphene sheet) rolled cylindrically, a double-walled CNT which is two graphene sheets rolled concentrically, and a multi-walled CNT which is a plurality of graphene sheets rolled concentrically can be used, and a single-walled CNT is preferably used in order to obtain high semiconductor characteristics. CNTs can be obtained by an arc discharge method, a chemical vapor deposition method (CVD method), a laser ablation method, and the like.

In addition, the CNTs more preferably contains 80 wt % or more semiconductor-type CNTs. The CNTs further preferably contains 95 wt % or more semiconductor-type CNTs. As methods of obtaining CNTs having 80 wt % or more semiconductor-type CNTs, known methods can be used. Examples thereof include: a method in which ultracentrifugation is carried out in the coexistence of a density gradient agent; a method in which a particular compound is selectively attached to the surface of a semiconductor-type or metal-type CNT and separation is carried out utilizing the difference in solubility; a method in which separation is carried out through electrophoresis and the like utilizing the difference in electrical properties; and the like. Examples of methods of measuring the content of semiconductor-type CNTs include: a method in which calculation is carried out from the absorptive area ratio of visible and near-infrared absorption spectrum; a method in which calculation is carried out from the intensity ratio of raman spectrum; and the like.

In cases where CNTs are used for a semiconductor layer of a semiconductor device in the present invention, the length of the CNT is preferably shorter than the distance between the source electrode and the drain electrode. The average length of CNTs depends on the distance between the source electrode and the drain electrode, but is preferably 2 μm or less, more preferably 1 μm or less.

The average length of CNTs refers to the average value of the lengths of randomly picked up 20 CNTs. Examples of methods of measuring the average length of CNTs include a method in which 20 CNTs are randomly picked up from an image obtained using an atomic force microscope, a scanning electron microscope, a transmission electron microscope, or the like, and their lengths are averaged.

Commercially available CNTs have a length distribution, and it may happen that they include CNTs longer than a distance between the electrodes, and accordingly, it is preferable that a step of making CNTs shorter than the distance between the source electrode and the drain electrode is added. For example, a method in which CNTs are cut into the shape of short fibers through an acid treatment with nitric acid, sulfuric acid, or the like, an ultrasonic treatment, a freeze grinding method, or the like is effective. In addition, it is more preferable in the context of improving the purity of CNTs that separation through a filter is carried out together.

In addition, the diameter of a CNT is, without particular limitation, preferably 1 nm to 100 nm, more preferably 50 nm or less.

In the present invention, it is preferable to include a step of uniformly dispersing CNTs in a solvent and filtering the dispersion solution through a filter. By obtaining CNTs smaller than the pore size of the filter from the filtrate, CNTs shorter than a distance between the pair of electrodes can be efficiently obtained. As the filter in this case, a membrane filter is preferably used. The pore size of the filter used for filtration should be smaller than a distance between the pair of electrodes, and is preferably 0.5 to 10 μm.

Other methods of making CNTs shorter and smaller include an acid treatment, a freeze grinding treatment, and the like.

(Semiconductor Layer)

The semiconductor layer contains the above-mentioned CNT composites or carbon nanotubes. The semiconductor layer may further contain an organic semiconductor and an insulating material to the extent that its electrical characteristics are not impaired. In addition, the total length of the CNT composite or carbon nanotubes present per 1 μm² of the semiconductor layer is preferably 1 μm to 50 μm. The total length in this range is preferable because it reduces the resistance in FET. The total length of the CNT composite or carbon nanotubes present per 1 μm² of the semiconductor layer refers to the sum of lengths of the CNT composite or carbon nanotubes present per any 1 μm² of the semiconductor layer. Examples of methods of determining the total length of the CNT composite or carbon nanotubes include a method in which any 1 μm² area is selected from an image of the semiconductor layer which is obtained using an atomic force microscope, a scanning electron microscope, a transmission electron microscope, or the like, and the lengths of all the CNT composites or carbon nanotubes included in the area are measured and summed.

The semiconductor layer preferably has a film thickness of 1 nm to 100 nm. A film thickness within this range facilitates the formation of a uniform thin film. The film thickness is more preferably 1 nm to 50 nm, and still more preferably 1 nm to 20 nm. The film thickness can be measured using an atomic force microscope or by ellipsometry.

The semiconductor layer can be formed by a dry method such as resistance heating evaporation, electron beaming, sputtering, or CVD, but it is preferable to use a coating method, in terms of production cost and adaptability to a large area. Specific examples of preferred coating methods include a spin-coating method, a blade coating method, a slit die coating method, a screen printing method, a bar coater method, a casting method, a transfer printing method, an immersion and withdrawal method, and an inkjet method, and a coating method can be selected in accordance with the desired coating film properties, such as controlled thickness and controlled orientation of the coating film. In addition, the formed coating film may be annealed under the atmosphere, under a reduced pressure, or under an atmosphere of an inert gas such as nitrogen or argon.

(Second Insulating Layer)

A second insulating layer is formed on the opposite side of the semiconductor layer from the gate insulating layer. The opposite side of the semiconductor layer from the gate insulating layer refers to, for example, the underside of the semiconductor layer in cases where the gate insulating layer is on top of the semiconductor layer. Forming the second insulating layer also allows the semiconductor layer to be protected.

The second insulating layer contains an organic compound containing a bond between a carbon atom and a nitrogen atom. Such an organic compound may be any organic compound, and examples thereof include amidic compounds, imidic compounds, urea compounds, amine compounds, imine compounds, aniline compounds, nitrile compounds, and the like.

Examples of amidic compounds include polyamides, formamides, acetamide, poly-N-vinylacetamide, N,N-dimethylformamide, acetanilide, benzanilide, N-methylbenzanilide, sulfonamide, nylons, polyvinylpyrrolidone, N-methylpyrrolidone, polyvinylpolypyrrolidone, β-lactam, γ-lactam, δ-lactam, ε-caprolactam, and the like. Examples of imidic compounds include polyimide, phthalimide, maleimide, alloxan, succinimide, and the like.

Examples of urea compounds include uracil, thymine, urea, and acetohexamide.

Examples of amine compounds include methylamine, dimethylamine, trimethylamine, ethylamine, diethylamine, triethylamine, diisopropylethylamine, cyclohexylamine, methylcyclohexylamine, dimethylcyclohexylamine, dicyclohexylamine, dicyclohexylmethylamine, tricyclohexylamine, cyclooctylamine, cyclodecylamine, cyclododecylamine, 1-azabicyclo[2.2.2]octane(quinuclidine), 1,8-diazabicyclo[5.4.0]undeca-7-ene (DBU), 1,5-diazabicyclo[4.3.0]nona-5-ene (DBN), 1,5,7-triazabicyclo[4.4.0]deca-5-ene (TBD), 7-methyl-1,5,7-triazabicyclo[4.4.0]deca-5-ene (MTBD), poly(melamine-co-formaldehyde), tetramethylethylene diamine, diphenylamine, triphenylamine, phenylalanine, and the like.

Examples of imine compounds include ethyleneimine, N-methylhexane-1-imine, N-methyl-1-butyl-1-hexaneimine, propane-2-imine, methanediimine, N-methylethaneimine, ethane-1,2-diimine, and the like.

Examples of aniline compounds include aniline, methylaminobenzoic acid, and the like.

Examples of nitrile compounds include acetonitrile, acrylonitrile, and the like. Examples of other compounds include, but are not limited to, polyurethane, allantoin, 2-imidazolidinone, 1,3-dimethyl-2-imidazolidinone, dicyandiamidine, citrulline, piperidine, imidazole, pyrimidine, julolidine, poly(melamine-co-formaldehyde), and the like.

Among these, the second insulating layer preferably contains a compound containing one or more selected from the structures of the following general formulae (1) and (2), in the context of enhancing the characteristics of the n-type semiconductor device.

($R^1$ to $R^4$ independently represent a group constituted by one or more atoms selected from a hydrogen atom(s), a carbon atom(s), a nitrogen atom(s), an oxygen atom(s), a silicon atom(s), a phosphorus atom(s), and a sulfur atom(s); $X^1$ and $X^2$ independently represent a group represented by the following general formulae (3) to (8).)

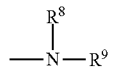 (5)

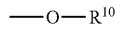 (6)

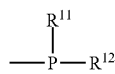 (7)

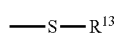 (8)

($R^5$ to $R^{13}$ independently represent a group constituted by one or more atoms selected from a hydrogen atom(s), a carbon atom(s), a nitrogen atom(s), an oxygen atom(s), a silicon atom(s), a phosphorus atom(s), and a sulfur atom(s).)

Further, $R^1$ to $R^{13}$ in the general formulae (1) to (8) are preferably hydrocarbon groups in the context of the availability of materials.

Among others, the second insulating layer preferably contains a compound containing a ring structure, in the context of the preservation stability of FETs. In particular, the compound is preferably an amine compound having a ring structure or a compound containing a ring structure of the general formula (1) or (2) which contains, as a heteroatom, the nitrogen atom described in the formula. Examples of amine compounds having a ring structure include cyclohexylamine, methylcyclohexylamine, dimethylcyclohexylamine, dicyclohexylamine, dicyclohexylmethylamine, tricyclohexylamine, cyclooctylamine, cyclodecylamine, cyclododecylamine, aniline, diphenylamine, triphenylamine, and the like. Examples of compounds containing a ring structure containing a nitrogen atom as a heteroatom include polyvinylpyrrolidone, N-methylpyrrolidone, polyvinylpolypyrrolidone, β-lactam, γ-lactam, δ-lactam, ε-caprolactam, polyimides, phthalimide, maleimide, alloxan, succinimide, uracil, thymine, 2-imidazolidinone, 1,3-dimethyl-2-imidazolidinone, quinuclidine, DBU, DBN, TBD, MTBD, piperidine, imidazole, pyrimidine, julolidine, and the like.

In addition, the second insulating layer preferably further contains an amidine compound and a guanidine compound. Examples of amidine compounds include DBU, DBN, and the like, and examples of guanidine compounds include TBD, MTBD, and the like. These compounds are preferable because they have high electron-donating properties and further enhance the performance of an n-type semiconductor device as an FET using CNTs.

The second insulating layer preferably has a film thickness of from 50 nm or more, more preferably from 100 nm or more. In addition, it is preferably 10 μm or less, more preferably 3 μm or less. A film thickness within the above range facilitates the formation of a uniform thin film. The film thickness can be measured using an atomic force microscope or by ellipsometry.

The second insulating layer may be a monolayer or multilayer. Alternatively, one layer may be formed out of a plurality of insulating materials, or a plurality of insulating materials may be formed into a multilayer.

The second insulating layer can be formed using a dry method, examples of which include, without particular limitation, resistance heating evaporation, electron beaming, sputtering, and CVD, but it is preferable to use a coating method, in terms of production cost and adaptability to a large area. Specific examples of preferred coating methods include a spin-coating method, a blade coating method, a slit die coating method, a screen printing method, a bar coater method, a casting method, a transfer printing method, an immersion and withdrawal method, an inkjet method, and a drop casting method. A coating method can be selected in accordance with the desired coating film properties, such as controlled thickness and controlled orientation of the coating film.

Examples of solvents in which an insulating material used for the second insulating layer is dissolved when the second insulating layer is formed using a coating method include, without particular limitation: ethers such as ethylene glycol monomethyl ether, ethylene glycol monoethyl ether, propylene glycol monomethyl ether, propylene glycol monoethyl ether, propylene glycol mono-n-butyl ether, propylene glycol mono-t-butyl ether, ethylene glycol dimethyl ether, ethylene glycol diethyl ether, ethylene glycol dibutyl ether, diethylene glycol ethylmethyl ether, and the like; esters such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, ethyl lactate, butyl lactate, and the like; ketones such as acetone, methylethyl ketone, methylpropyl ketone, methylbutyl ketone, methylisobutyl ketone, cyclopentanone, 2-heptanone, and the like; alcohols such as butyl alcohol, isobutyl alcohol, pentanol, 4-methyl-2-pentanol, 3-methyl-2-butanol, 3-methyl-3-methoxy butanol, diacetone alcohol, and the like; aromatic hydrocarbons such as toluene, xylene, and the like.

Two or more of these may be used. They preferably contain, among others, a solvent having a boiling point of 110 to 200° C. at 1 atm. A solvent having a boiling point of 110° C. or more allows its volatilization to be suppressed when the solution is applied, and affords good coating properties. A solvent having a boiling point of 200° C. or less allows a smaller amount thereof to remain in the insulating film and affords an insulating layer having better heat resistance and chemical resistance. In addition, the formed coating film may be annealed under the atmosphere, under a reduced pressure, or under an atmosphere of an inert gas such as nitrogen or argon.

In the n-type semiconductor device thus formed, the electric current flowing between the source electrode and the drain electrode (source-drain current) can be controlled by varying the gate voltage, and the mobility can be calculated using the following equation (a).

$$\mu=(\delta Id/\delta Vg)L \cdot D/(W \cdot \varepsilon r \cdot \varepsilon \cdot Vsd) \tag{a}$$

wherein Id is a source-drain current (A), Vsd is a source-drain voltage (V), Vg is a gate voltage (V), D is a gate insulating layer thickness (m), L is a channel length (m), W is a channel width (m), εr is a relative permittivity of the gate insulating layer, and ε is a vacuum permittivity ($8.85 \times 10^{-12}$ F/m).

In addition, a threshold voltage can be determined from the intersection between the extension of a linear portion and the Vg axis in an Id-Vg graph.

N-type semiconductor devices are characterized in that they are operated by the conduction across the source and drain which is effected by applying a positive voltage equal to or greater than the threshold voltage to the gate electrode, and, for example, a good n-type semiconductor device characteristic of high function has a low threshold voltage in absolute value and high mobility.

(Method of Producing N-Type Semiconductor Device)

A method of producing n-type semiconductor devices is not limited to a particular one, and preferably includes a step in which they are formed by applying a semiconductor layer for an n-type semiconductor device and by drying the layer.

Preferably, the method further includes a step in which a second insulating layer for the n-type drive semiconductor device is formed by applying a composition containing an organic compound containing a bond between a carbon atom and a nitrogen atom and by drying the composition.

Figure 5:
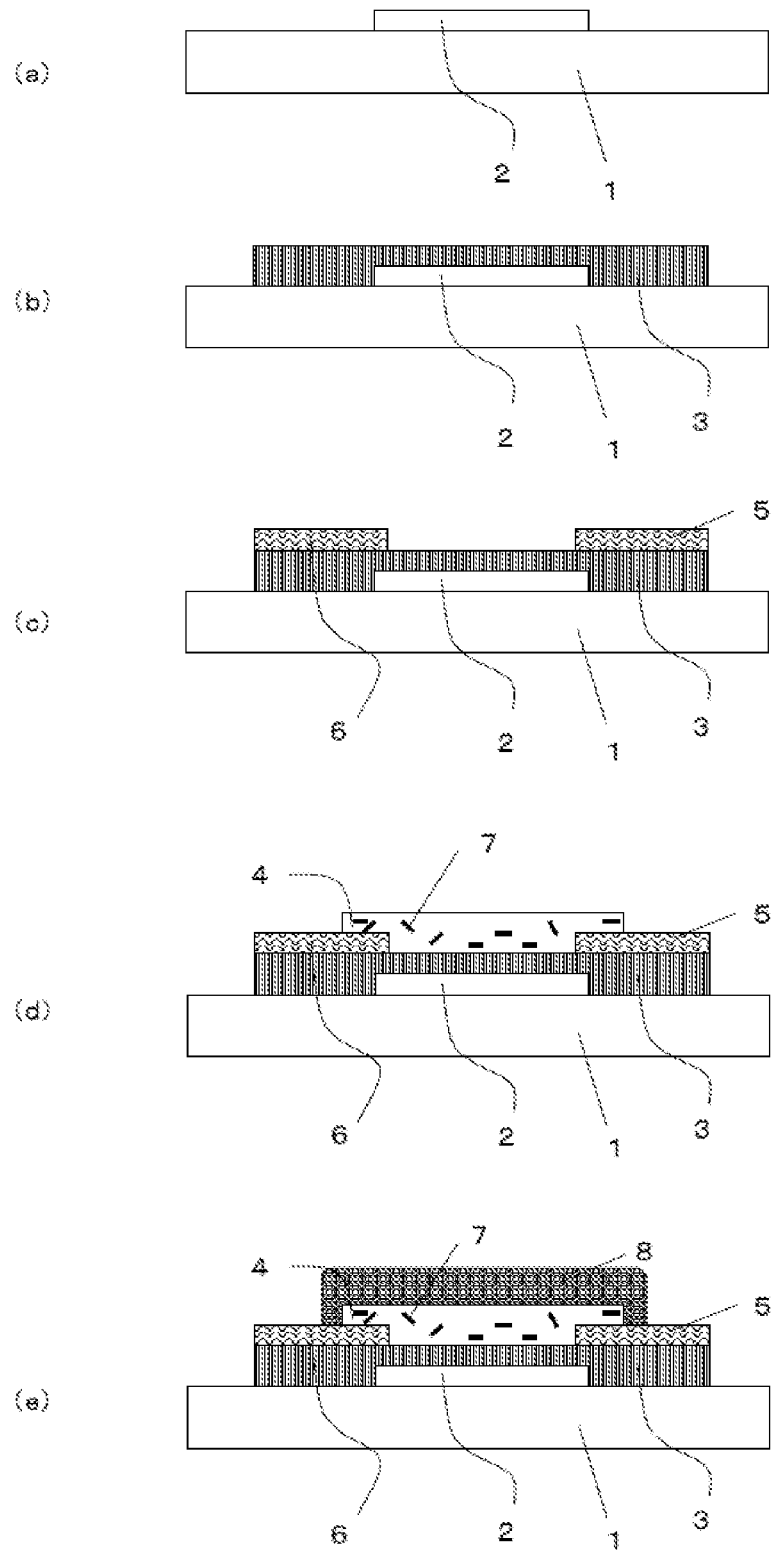
FIG. 5 is a cross-sectional view depicting production steps of an n-type semiconductor device which is one of the embodiments of the present invention.

Below, an example of a method of producing an n-type semiconductor device according to the embodiment shown in FIG. 5 will be described specifically. First, as shown in FIG. 5 (a), a gate electrode 2 is formed on an insulating substrate 1 using the above-mentioned method. Next, as shown in FIG. 5 (b), an organic compound containing a bond between a silicon atom and a carbon atom is applied and dried to form a gate insulating layer 3. Next, as shown in FIG. 5 (c), a source electrode 5 and a drain electrode 6 are simultaneously formed from the same material on top of the gate insulating layer 3 using the above-mentioned method. Next, as shown in FIG. 5 (d), a semiconductor layer 4 is formed between the source electrode 5 and the drain electrode 6 using the above-mentioned method. Next, as shown in FIG. 5 (e), a second insulating layer 8 is formed using the above-mentioned method so as to cover the semiconductor layer 4, whereby an n-type semiconductor device can be produced.

<Complementary Semiconductor Device>

A complementary semiconductor device according to the present invention includes both the n-type semiconductor device and a p-type semiconductor device. The p-type semiconductor device includes a substrate; a source electrode, a drain electrode, and a gate electrode; a semiconductor layer in contact with the source electrode and the drain electrode; a gate insulating layer insulating the semiconductor layer from the gate insulating layer; in which the semiconductor layer contains a carbon nanotube composite having a conjugated polymer attached to at least a part of the surface thereof.

Figure 6:
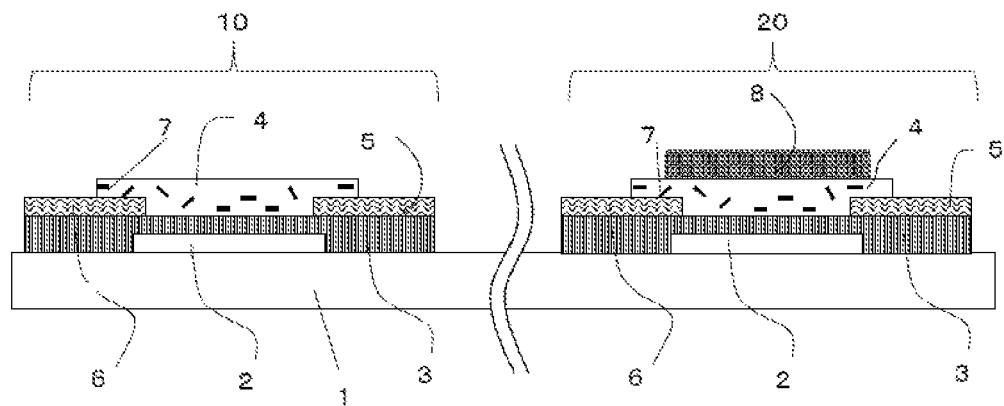
FIG. 6 is a schematic cross-sectional view depicting a complementary semiconductor device which is one of the embodiments of the present invention.

FIG. 6 is a schematic cross-sectional view depicting a first embodiment of a complementary semiconductor device according to the present invention.

A p-type semiconductor device 10 and an n-type semiconductor device 20 according to the present invention are formed on the surface of an insulating substrate 1. The p-type semiconductor device has a gate electrode 2 formed on the insulating substrate 1, a gate insulating layer 3 covering the gate electrode, a source electrode 5 and a drain electrode 6 provided on the gate insulating layer, and a semiconductor layer 4 provided between the electrodes. Each semiconductor layer 4 contains a carbon nanotube composite 7 having a conjugated polymer attached to at least a part of the surface thereof.

This structure is what is called a bottom-gate/bottom-contact structure in which a gate electrode is disposed below the semiconductor layer, and a source electrode and a drain electrode are disposed on the underside of the semiconductor layer.

Figure 7:
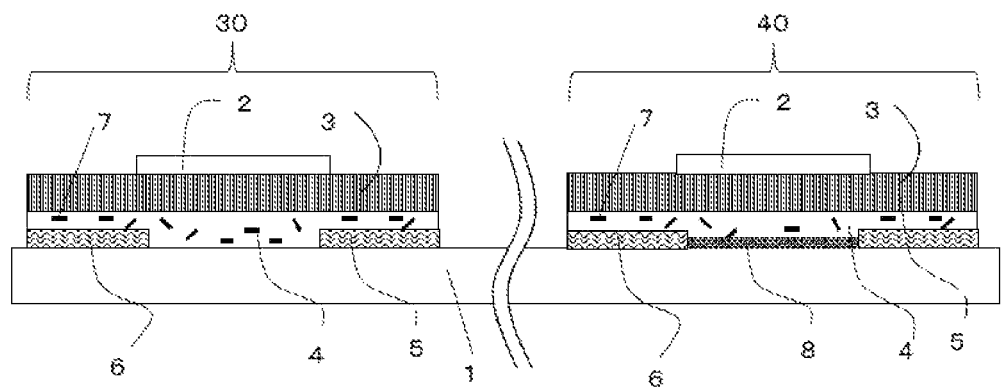
FIG. 7 is a schematic cross-sectional view depicting a complementary semiconductor device which is one of the embodiments of the present invention.

FIG. 7 is a schematic cross-sectional view depicting a second embodiment of a complementary semiconductor device according to the present invention.

A p-type semiconductor device 30 and an n-type semiconductor device 40 according to the present invention are formed on the surface of an insulating substrate 1. The p-type semiconductor device has a source electrode 5 and a drain electrode 6 formed on the insulating substrate 1, a semiconductor layer 4 provided between the electrodes, a gate insulating layer 3 covering them, and a gate electrode 2 provided on the gate insulating layer. Each semiconductor layer 4 contains a carbon nanotube composite 7 having a conjugated polymer attached to at least a part of the surface thereof.

This structure is what is called a top-gate/bottom-contact structure in which a gate electrode is disposed above the semiconductor layer, and a source electrode and a drain electrode are disposed on the underside of the semiconductor layer.

Figure 8:
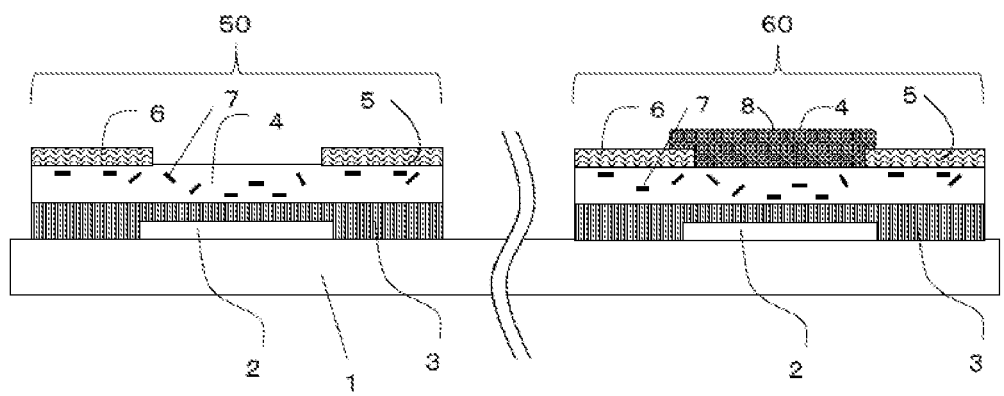
FIG. 8 is a schematic cross-sectional view depicting a complementary semiconductor device which is one of the embodiments of the present invention.

FIG. 8 is a schematic cross-sectional view depicting a third embodiment of a complementary semiconductor device according to the present invention.

A p-type semiconductor device 50 and an n-type semiconductor device 60 according to the present invention are formed on the surface of an insulating substrate 1. The p-type semiconductor device has a gate electrode 2 formed on the insulating substrate 1, a gate insulating layer 3 covering the gate electrode, a semiconductor layer 4 provided on the gate insulating layer 3, and a source electrode 5 and a drain electrode 6 formed on the semiconductor layer. Each semiconductor layer 4 contains a carbon nanotube composite 7 having a conjugated polymer attached to at least a part of the surface thereof.

This structure is what is called a bottom-gate/top-contact structure in which a gate electrode is disposed below the semiconductor layer, and a source electrode and a drain electrode are disposed on the top side of the semiconductor layer.

Figure 9:
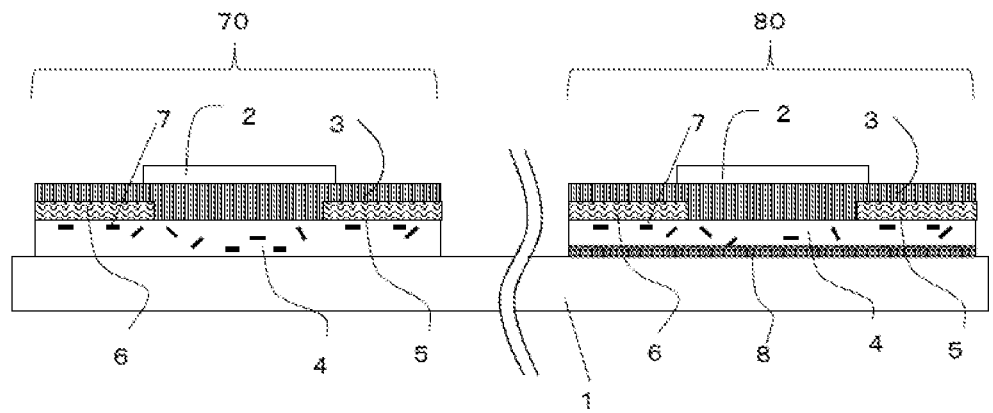
FIG. 9 is a schematic cross-sectional view depicting a complementary semiconductor device which is one of the embodiments of the present invention.

FIG. 9 is a schematic cross-sectional view depicting a fourth embodiment of a complementary semiconductor device according to the present invention.

A p-type semiconductor device 70 and an n-type semiconductor device 80 according to the present invention are formed on the surface of an insulating substrate 1. The p-type semiconductor device has a semiconductor layer 4 formed on the insulating substrate 1, a source electrode 5 and a drain electrode 6 formed on the semiconductor layer, a gate insulating layer 3 covering the electrodes, and a gate electrode 2 provided on the gate insulating layer. Each semiconductor layer 4 contains a carbon nanotube composite 7 having a conjugated polymer attached to at least a part of the surface thereof.

This structure is what is called a top-gate/top-contact structure in which a gate electrode is disposed above the semiconductor layer, and a source electrode and a drain electrode are disposed on the top side of the semiconductor layer.

An embodiment of a complementary semiconductor device according to the present invention is not to be limited to the above-mentioned, but may be any of those which are formed using a suitable combination of one or more each of the p-type semiconductor devices and the n-type semiconductor devices illustrated in FIG. 6 to FIG. 9. For example, a complementary semiconductor device containing the p-type semiconductor device 10 in FIG. 6 and the n-type semiconductor device 40 in FIG. 7, a complementary semiconductor device containing the p-type semiconductor device 50 in FIG. 8 and the n-type semiconductor device 80 in FIG. 9, and the like are possible.

In addition, the p-type semiconductor device and the n-type semiconductor device may have a structure other than the structures illustrated in FIG. 6 to FIG. 9, to the extent that the essential functions of the devices are not impaired.

In this regard, p-type semiconductor devices are operated by the conduction across the source and drain which is effected by applying a negative voltage equal to or smaller than the threshold voltage to the gate electrode, and are operated differently from n-type semiconductor devices.

In addition, it is preferable that, in the p-type semiconductor device, a second insulating layer be formed on the opposite side of the semiconductor layer from the substrate. This is because forming the second insulating layer enables the semiconductor layer to be protected from an external environment such as oxygen and moisture.

It is preferable that the source electrode and drain electrode of the p-type semiconductor device and the source electrode and the drain electrode of the n-type semiconductor device be all composed of the same material. The reason is that this requires fewer kinds of materials and enables these electrodes to be produced in the same step.

That the electrodes are composed of the same material means that the electrodes contain the same element which has the highest mole fraction among the elements contained in each electrode. The kinds and contents of the elements in the electrodes can be identified by elemental analysis such as X-ray photoelectron spectroscopy (XPS) and secondary ion mass spectrometry (SIMS).

In addition, it is preferable that the gate insulating layer of the p-type semiconductor device and the gate insulating layer of the n-type semiconductor device be composed of the same material, because this requires fewer kinds of materials and enables the layers to be produced in the same step. That these insulating layers are composed of the same material means that the insulating layers have the same kinds of elements contained at the same composition ratios at 1 mol % or more each among the elements of the composition constituting each insulating layer. Whether the kinds and composition ratios of elements are the same can be determined by elemental analysis such as X-ray photoelectron spectroscopy (XPS) and secondary ion mass spectrometry (SIMS).

It is preferable that the p-type semiconductor device and the n-type semiconductor device have the same structure, because this requires fewer kinds of materials and enables the layers to be produced in the same step. In the present invention, having the same structure means that the forming order of the layers and electrodes formed on the substrate and the number of layers are the same. The p-type semiconductor device and the n-type semiconductor device having the same structure simplifies processes of producing the p-type semiconductor device and the n-type semiconductor device simultaneously and improves the production efficiency.

The complementary semiconductor devices shown in FIG. 6 to FIG. 9 are all examples in which the p-type semiconductor device and the n-type semiconductor device have the same structure. By contrast, examples in which the p-type semiconductor device and the n-type semiconductor device do not have the same structure include the below-mentioned ones. Complementary semiconductor device containing p-type semiconductor device 10 in FIG. 6 and n-type drive semiconductor device 40 in FIG. 7: in this case, the forming orders of the electrodes and layers contained in the semiconductor devices are different.

Figure 10:
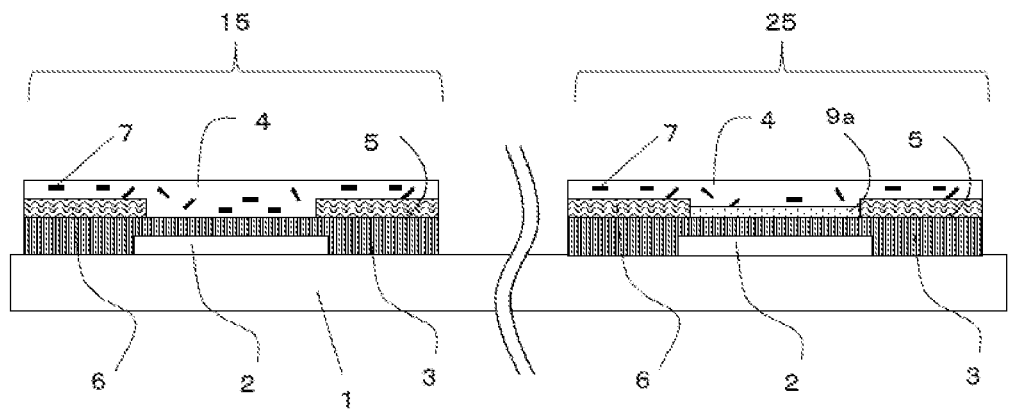
FIG. 10 is a schematic cross-sectional view depicting a complementary semiconductor device of which the p-type semiconductor device and the n-type semiconductor device do not have the same structure.

Complementary semiconductor device, as shown in FIG. 10, having an additional layer 9a only in one of p-type drive semiconductor device 15 and n-type drive semiconductor device 25 (n-type drive semiconductor device 25 in the case of FIG. 10): in this case, the structures of the electrodes and layers contained in the semiconductor devices are different.

Figure 11:
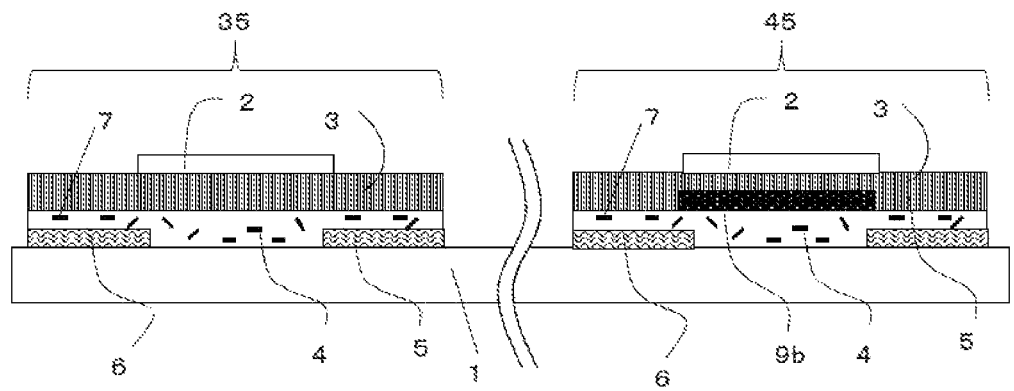
FIG. 11 is a schematic cross-sectional view depicting a complementary semiconductor device of which the p-type semiconductor device and the n-type semiconductor device do not have the same structure.

Complementary semiconductor device, as shown in FIG. 11, having a doped region 9b provided only in the semiconductor layer of one of p-type semiconductor device 35 and n-type semiconductor device 45 (n-type drive semiconductor device 45 in the case of FIG. 11): in this case, the structures of them are different in whether they have a doped region in the semiconductor layer.

Next, the members of the p-type semiconductor device included in the complementary semiconductor device according to the present invention will be described in detail. The below-mentioned description equally applies to all embodiments, unless otherwise specified.

(Insulating Substrate)

The insulating substrate may be of any material as long as at least the surface thereof on which the electrode system is to be disposed has insulating properties, and is preferably composed of the same materials as in the above-mentioned n-type semiconductor device.

(Electrode)

The material used for the gate electrode, source electrode, and drain electrode may be any electrically conductive material which can be generally used for electrodes, and the electrodes are preferably composed of the same materials as in the above-mentioned n-type semiconductor device.

(Gate Insulating Layer)

The material to be used for the gate insulating layer is not particularly limited, and examples thereof include: inorganic materials such as silicon oxide and alumina; organic polymer materials such as polyimides, polyvinyl alcohol, polyvinyl chloride, polyethylene terephthalate, polyvinylidene fluoride, polysiloxanes, and polyvinyl phenol (PVP); and mixtures of inorganic material powders and organic materials. The gate insulating layer is preferably composed of the same material as in the above-mentioned n-type semiconductor device.

(Semiconductor Layer)

The semiconductor layer contains a CNT composite in the same manner as the semiconductor layer of the n-type semiconductor device does. The semiconductor layer may further contain an organic semiconductor and an insulating material to the extent that the electrical characteristics of the CNT composite are not impaired, and is preferably composed of the same material as in the above-mentioned n-type semiconductor device.

(Second Insulating Layer)

In the present invention, a second insulating layer may be formed on the opposite side of the semiconductor layer of the p-type semiconductor device from the substrate. Forming the second insulating layer enables the semiconductor layer to be protected from an external environment such as oxygen and moisture.

The material to be used for the second insulating layer is not particularly limited, and specific examples thereof include: inorganic materials such as silicon oxide and alumina; organic polymer materials such as polyimides or derivatives thereof, polyvinyl alcohol, polyvinyl chloride, polyethylene terephthalate, polyvinylidene fluoride, polysiloxanes or derivatives thereof, and polyvinyl phenol of derivatives thereof; and mixtures of inorganic material powders and organic high molecular weight materials or mixtures of organic low molecular weight materials and organic high molecular weight materials.

Among these, organic high molecular weight materials which allow the production using a coating method such as an inkjet method are preferably used. In particular, it is preferable in the context of the uniformity of the insulating layer to use an organic high molecular weight material selected from the group consisting of: polyfluoroethylene, polynorbornene, polysiloxane, polyimide, polystyrene, polycarbonate, and derivatives thereof; polyacrylic acid derivatives; polymethacrylic acid derivatives; and copolymers containing them. Polyacrylic acid derivatives, polymethacrylic acid derivatives, or copolymers containing them are particularly preferable.

The second insulating layer has a film thickness of generally 50 nm to 10 μm, preferably 100 nm to 3 μm. The second insulating layer may be a monolayer or multilayer. Alternatively, one layer may be formed out of a plurality of insulating materials, or a plurality of insulating materials may be formed into a multilayer.

The second insulating layer can be formed by a dry method, examples of which include, without particular limitation, resistance heating evaporation, electron beaming, sputtering, and CVD, but it is preferable to use a coating method, in terms of production cost and adaptability to a large area. Specific examples of preferred coating methods include a spin-coating method, a blade coating method, a slit die coating method, a screen printing method, a bar coater method, a casting method, a transfer printing method, an immersion and withdrawal method, an inkjet method, and a drop casting method. A coating method can be selected in accordance with the desired coating film properties, such as controlled thickness and controlled orientation of the coating film.

Examples of solvents in which an insulating material used for the second insulating layer is dissolved include, without particular limitation: ethers such as ethylene glycol monomethyl ether, ethylene glycol monoethyl ether, propylene glycol monomethyl ether, propylene glycol monoethyl ether, propylene glycol mono-n-butyl ether, propylene glycol mono-t-butyl ether, ethylene glycol dimethyl ether, ethylene glycol diethyl ether, ethylene glycol dibutyl ether, diethylene glycol ethylmethyl ether, and the like; esters such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, ethyl lactate, butyl lactate, and the like; ketones such as acetone, methylethyl ketone, methylpropyl ketone, methylbutyl ketone, methylisobutyl ketone, cyclopentanone, 2-heptanone, and the like; alcohols such as butyl alcohol, isobutyl alcohol, pentanol, 4-methyl-2-pentanol, 3-methyl-2-butanol, 3-methyl-3-methoxy butanol, diacetone alcohol, and the like; aromatic hydrocarbons such as toluene, xylene, and the like. Two or more of these may be used.

They preferably contain, among others, a solvent having a boiling point of 110 to 200° C. at 1 atm. A solvent having a boiling point of 110° C. or more allows its volatilization to be suppressed when the solution is applied, and affords good coating properties. A solvent having a boiling point of 200° C. or less allows a smaller amount thereof to remain in the insulating film and affords an insulating layer having better heat resistance and chemical resistance. In addition, the formed coating film may be annealed under the atmosphere, under a reduced pressure, or under an atmosphere of an inert gas such as nitrogen or argon.

(Characteristics of Complementary Semiconductor Device)

Figure 12:
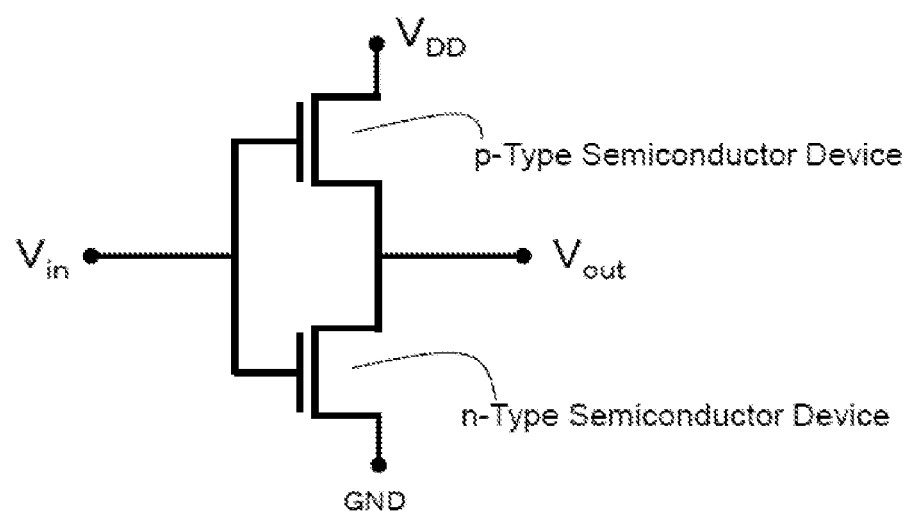
FIG. 12 is a schematic view describing a function of a complementary semiconductor device according to the present invention.

FIG. 12 shows an equivalent circuit of a complementary semiconductor device produced using a combination of the n-type semiconductor device and the p-type semiconductor device.

The operation of the complementary semiconductor device is described below. First, an input signal ($V_{in}$) varies between Low "L" (ground potential GND) and High "H" ($V_{DD}$). When the input signal is given at "L", the p-type FET conducts, and the n-type FET is cut off, whereby the output signal is given at "H". Conversely, when the input signal is given at "H", the n-type FET conducts, and the p-type FET is cut off, whereby the output signal is given at "L".

For example, when the threshold voltage of the n-type FET is large and when the input signal is given at "H", the n-type FFT is not completely conducts, and the output signal is not given at "L".

In addition, in a complementary semiconductor device, the variation of the output signal (gain) relative to the variation of the input signal correlates to the mobility, and a complementary semiconductor device having a high gain is one which has high performance.

Accordingly, a complementary semiconductor device, for example, characterized in that the p-type semiconductor device and the n-type semiconductor device each have a small threshold voltage absolute value and high mobility is a complementary semiconductor device that achieves low power consumption and high function and thus has good characteristics.

(Method of Producing Complementary Semiconductor Device)

Methods of producing complementary semiconductor devices are not limited to particular ones. The methods of forming the electrodes and insulating layers constituting each semiconductor device are as above-mentioned, and complementary semiconductor devices such as shown in FIG. 6 to FIG. 9 can be produced by selecting the order of the methods suitably.

In the context of production cost and process simpleness, the p-type semiconductor device and the n-type semiconductor device should not be formed separately but is preferably formed simultaneously. Accordingly, it is preferable that the p-type semiconductor device and the n-type semiconductor device have the same structure.

A method of producing complementary semiconductor devices preferably includes a step in which they are formed by applying each of a semiconductor layer of the p-type semiconductor device and a semiconductor layer of the n-type semiconductor device and by drying each layer. More preferably, the following production steps are further included.

(1) the step of forming the source electrode and drain electrode of the p-type semiconductor device and the source electrode and the drain electrode of the n-type semiconductor device in the same step.

(2) the step of forming the gate insulating layer of the p-type semiconductor device and the gate insulating layer of the n-type semiconductor device in the same step by applying a composition containing a compound containing a bond between a silicon atom and a carbon atom and by drying the composition.

(3) the step of forming the semiconductor layer of the p-type semiconductor device and the semiconductor layer of the n-type semiconductor device in the same step.

Here, forming two electrodes or layers in the same step means forming the two electrodes or layers together by carrying out once a process required to form the electrodes or layers.

Any of these steps is applicable even if the p-type semiconductor device and the n-type semiconductor device have different structures, but is easier to apply when they have the same structure.

Below, an example of a method of producing a complementary semiconductor device according to the first embodiment will be described specifically. First, as shown in FIG. 13 (a), a gate electrode 2 is formed in the p-type semiconductor device region 10 and the n-type semiconductor device region 20 on an insulating substrate 1, using the above-mentioned method.

Figure 13:
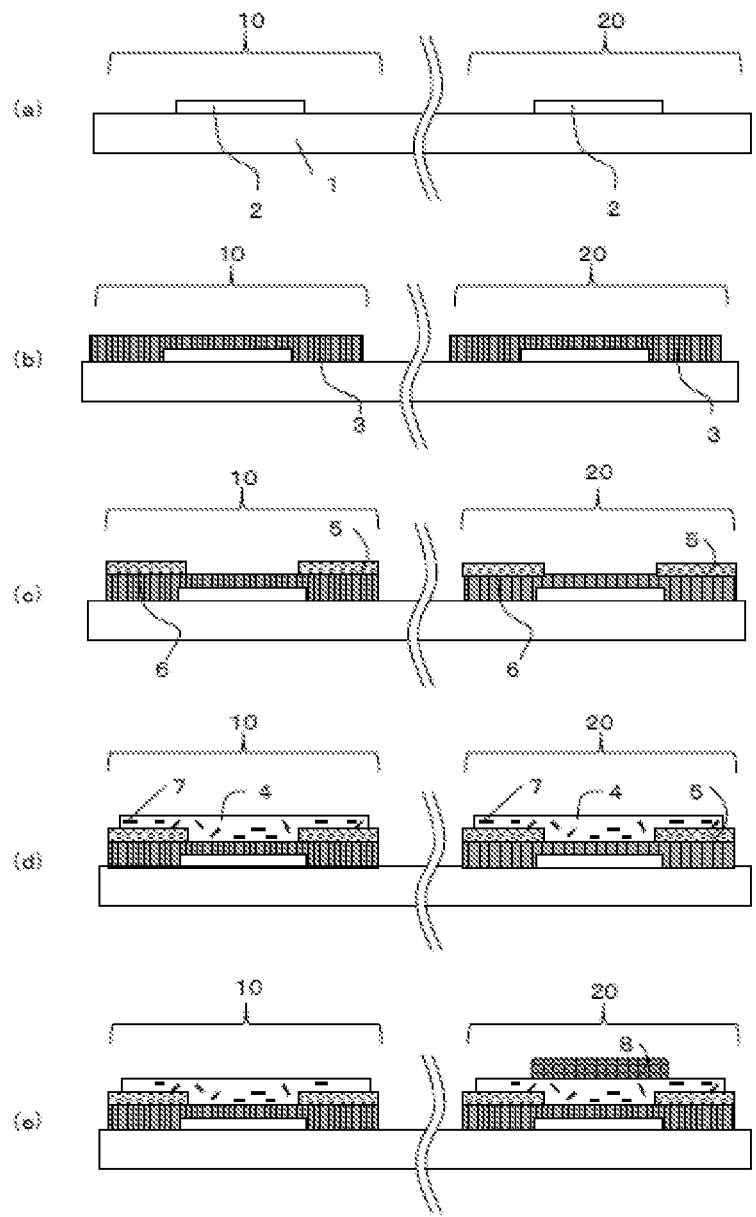
FIG. 13 is a cross-sectional view depicting production steps of a complementary semiconductor device which is one of the embodiments of the present invention.

Next, as shown in FIG. 13 (b), a compound containing a bond between a silicon atom and a carbon atom is applied and dried to form a gate insulating layer 3 in the p-type semiconductor device region 10 and the n-type semiconductor device region 20. Next, as shown in FIG. 13 (c), a source electrode 5 and a drain electrode 6 are simultaneously formed from the same material on top of the gate insulating layer 3 in the p-type semiconductor device region 10 and the n-type semiconductor device region 20, using the above-mentioned method.

Next, as shown in FIG. 13 (d), a semiconductor layer 4 is formed between the source electrode 5 and the drain electrode 6 in both the p-type semiconductor device region 10 and the n-type semiconductor device region 20, using the above-mentioned method.

Next, as shown in FIG. 13 (e), a second insulating layer 8 is formed using the above-mentioned method so as to cover the semiconductor layer 4 of the n-type semiconductor device, whereby a complementary semiconductor device can be produced.

In this regard, the gate electrode 2 of the p-type drive semiconductor device region 10 and the gate electrode 2 of the n-type drive semiconductor device region 20 are preferably made of the same material in terms of usage efficiency of materials and fewer kinds of materials. For the same reason, the semiconductor layer 4 of the p-type drive semiconductor device region 10 and the semiconductor layer 4 of the n-type drive semiconductor device region 20 are preferably made of the same material.

<Wireless Communication Device>

Next, a wireless communication device containing an n-type semiconductor device or a complementary semiconductor device according to the present invention will be described. This wireless communication device is a device, such as an RFID, in which an RFID tag receives carrier waves transmitted from an antenna mounted in a reader/writer, whereby telecommunications are performed. Specific operations to be performed are, for example, as follows. The antenna of an RFID tag receives a wireless signal transmitted from the antenna mounted in a reader/writer, and the signal is converted into a direct current by a rectifier circuit to make the RFID tag electromotive. Next, the electromotive RFID tag receives a command from the wireless signal and carries out an operation in response to the command. Thereafter, a response as a result of executing the command is transmitted from the antenna of the RFID tag to the antenna of the reader/writer, as a wireless signal. The operation in response to the command is carried out at least in a known demodulation circuit, control logic circuit, and modulation circuit.

Figure 14:
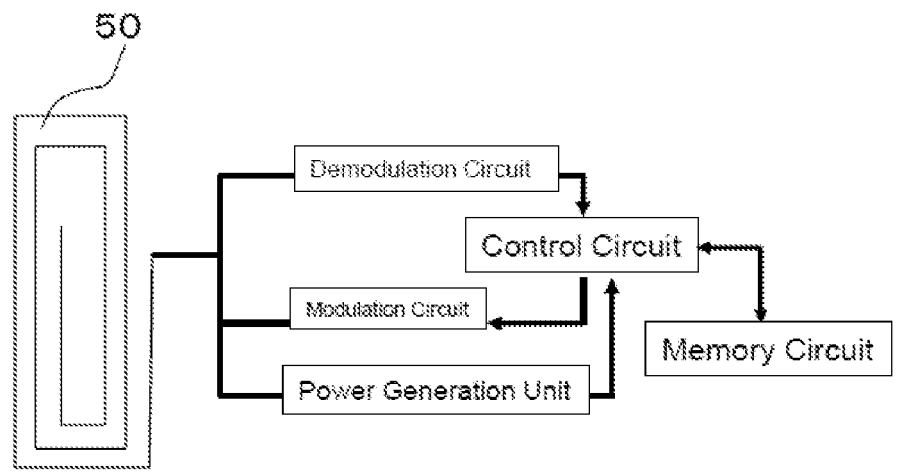
FIG. 14 is a block diagram depicting an example of a wireless communication device using an n-type semiconductor device or a complementary semiconductor device according to the present invention.

The wireless communication device according to the present invention includes at least the above-mentioned n-type semiconductor device or the complementary semiconductor device and an antenna. As shown in FIG. 14, examples of more specific configurations include a wireless communication device constituted by: a power generation unit which rectifies a modulation wave signal received from outside by an antenna 50 and supplies power to another unit; a demodulation circuit which demodulates the modulation wave signal and sends it to a control circuit; a modulation circuit which modulates data sent from the control circuit and sends it to the antenna; and the control circuit which carries out writing of data demodulated by the demodulation circuit into a memory circuit and reading of the data from the memory circuit and sends it to the modulation circuit; in which the circuit units are electrically connected. The demodulation circuit, control circuit, modulation circuit, and memory circuit include the above-mentioned n-type semiconductor device or complementary semiconductor device, and may further include a capacitor, a resistance device, and a diode. In addition, the memory circuit further has a non-volatile rewritable memory unit such as an EEPROM (Electrically Erasable Programmable Read-Only Memory) or an FeRAM (Ferroelectric Randam Access Memory). In addition, the power generation unit is constituted by a capacitor and a diode.

The antenna, capacitor, resistance device, diode, and non-volatile rewritable memory unit may be those which are generally used, and the materials and shapes to be used are not limited to particular ones. Further, any materials can be used for electrically connecting the respective components, as long as they are electrically conductive materials which can be commonly used. Likewise, any methods can be used for electrically connecting these components, as long as they allow for electrical conduction, and the widths and the thicknesses of the connecting portions can be selected arbitrarily.

<Merchandise Tag>

Next, a merchandise tag containing a wireless communication device according to the present invention will be described. This merchandise tag has, for example, a base material and the above-mentioned wireless communication device covered with the base material.

The base material is formed from, for example, a non-metal material in planar shape, such as paper. For example, the base material has the structure of two planar sheets of paper pasted together, and the wireless communication device is disposed between the two sheets of paper. In the memory circuit of the wireless memory device, for example, the individual identification information for identifying items of merchandise individually is stored previously.

Wireless communication is carried out between this merchandise tag and a reader/writer. A reader/writer is a device which carries out reading and writing of data with merchandise tags wirelessly and exchanges data with merchandise tags in merchandise circulation processes and payment. For example, those of a portable type and those of a fixed type installed at checkout counters are available. As reader/writers, those known are available.

Specifically, this merchandise tag has an identification information return function by which the stored individual identification information is returned wirelessly in response to the command from a predetermined reader/writer which requires the individual identification information to be sent. This makes it possible, for example, to simultaneously identify a large number of merchandise items in a contactless manner at checkout counters for payment for merchandise and to attempt easier and more rapid payment processing, as compared to identification by bar code.

For example, it is possible that when payment is made for merchandise items, the merchandise information read by a reader/writer from the merchandise tags is sent to a POS (point of sale system) terminal, whereby the sale of the merchandise items identified by the merchandise information is registered at the POS terminal.

EXAMPLES

The present invention will now be more specifically described below, based on Examples. Note, however, that the present invention is in no way limited by the following Examples. Each evaluation method in Examples will be described in the following (1) to (3).

(1) Weight Average Molecular Weight Measurement

The weight average molecular weight of a polymer was determined in terms of polystyrene using GPC (GEL PERMEATION CHROMATOGRAPHY: HLC-8220GPC manufactured by Tosoh Corporation) (developing solvent: tetrahydrofuran, developing rate: 0.4 ml/min.) after filtering a sample through a membrane filter having a pore size of 0.45 μm.

(2) Elemental Analysis

The element information and element content of a film to be measured were analyzed using X-ray photoelectron spectroscopy (Quantera SXM manufactured by ULVAC-PHI, Inc.) that irradiates the film with soft X-rays in ultra-high vacuum and detects photoelectrons emitted from the surface.

(3) Evaluation of Adhesion of Electrode

Figure 15A:
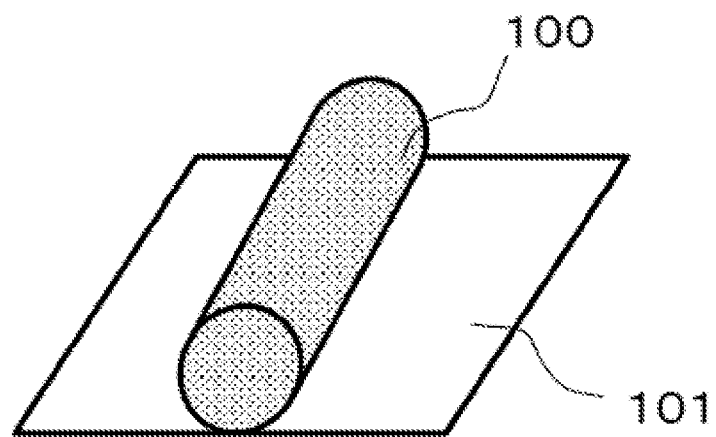
FIG. 15A is a schematic perspective view depicting an electrode being evaluated for adhesion resistance in bending.
Figure 15B:
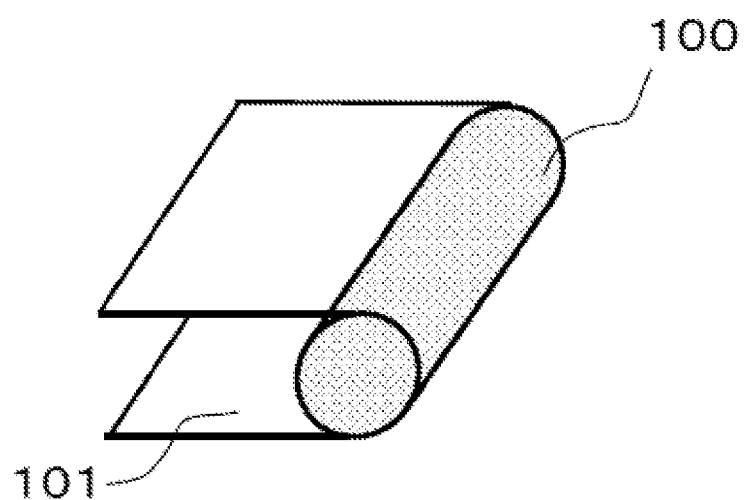
FIG. 15B is a schematic perspective view depicting an electrode being evaluated for adhesion resistance in bending.

The description will be given with reference to FIG. 15. A substrate 101 having an n-type semiconductor device formed thereon was used such that a metal column 100 having a diameter of 30 mm was fixed on the central part of the surface with the n-type semiconductor device formed thereon; was arranged along the column such that the wrap angle to the column was 0° (the sample was in a state of a flat surface) (see FIG. 15A); and underwent flexing actions such that the wrap angle to the column was in the range up to 180° (in a state of being flexed back around the column) (see FIG. 15B). For the flex resistance, the pattern of the n-type semiconductor device was observed using a light microscope before and after the flexing actions, and checked for peeling and breaking.

Preparation Example 1 for Semiconductor Solution: Semiconductor Solution A

To 10 ml of a solution of 2.0 mg of poly(3-hexylthiophene) (P3HT) (manufactured by Sigma-Aldrich Co. LLC.) in chloroform, 1.0 mg of CNT 1 (a single-walled CNT, purity: 95%; manufactured by CNI Inc.) was added. The resultant was subjected to ultrasonic stirring for four hours using an ultrasonic homogenizer (VCX-500; manufactured by Tokyo Rikakikai Co., Ltd.) at an output of 20%, while cooling with ice, thereby obtaining a CNT dispersion solution A (CNT composite concentration with respect to the solvent: 0.96 g/l).

Next, a semiconductor solution for forming a semiconductor layer was prepared. The CNT dispersion solution A obtained as described above was filtered using a membrane filter (Omnipore, pore diameter: 10 μm, diameter: 25 mm; manufactured by Millipore Corporation), to remove CNT composites having a length of 10 μM or more. To the resulting filtrate, 5 ml of o-DCB (manufactured by Wako Pure Chemical Industries, Ltd.) was added. Thereafter, chloroform, which is a solvent having a low-boiling point, was removed by distillation using a rotatory evaporator, to replace the solvent with o-DCB, thereby obtaining a CNT dispersion solution B. To 1 ml of the resulting CNT dispersion solution B, 3 mL of o-DCB was added, to prepare the semiconductor solution (CNT composite concentration with respect to the solvent: 0.03 g/l).

Preparation Example 2 for Semiconductor Solution: Semiconductor Solution B

The compound [60] was synthesized using the method shown in the scheme 1.

Scheme 1

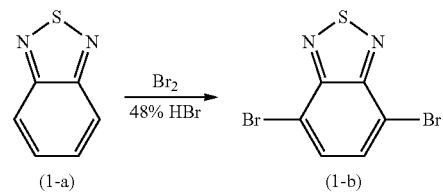

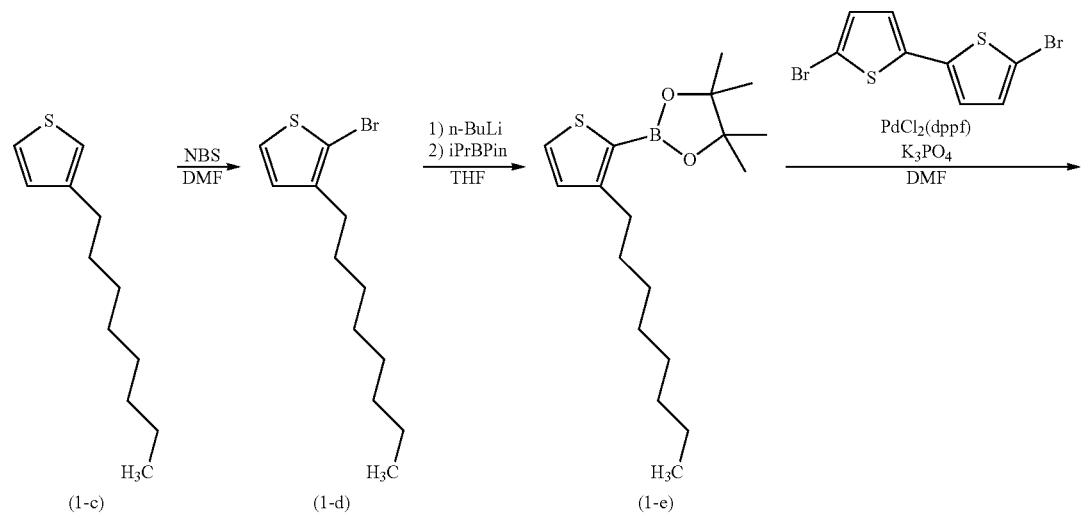

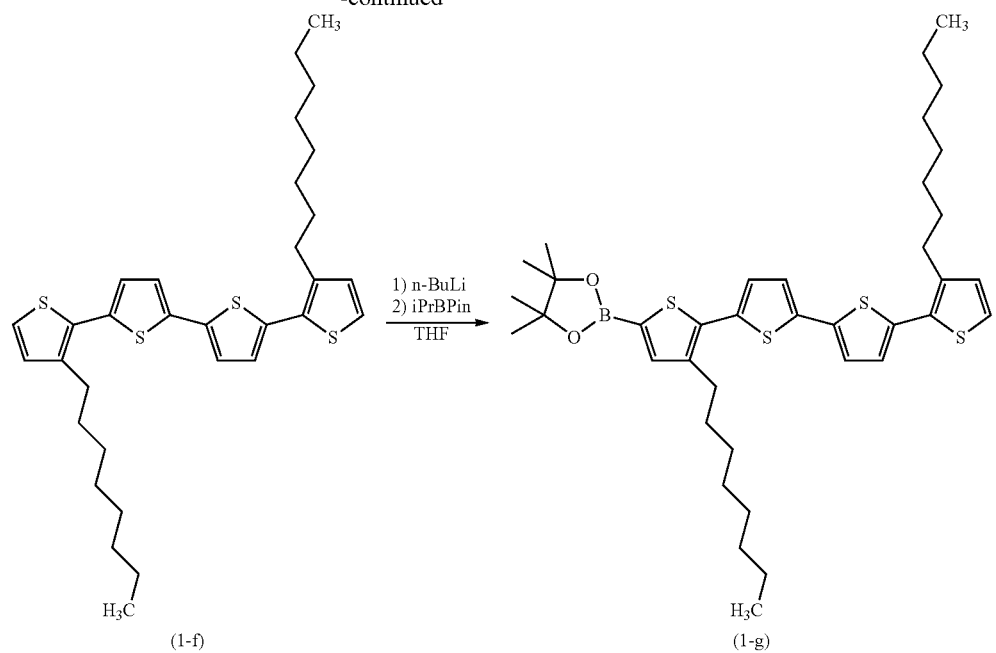
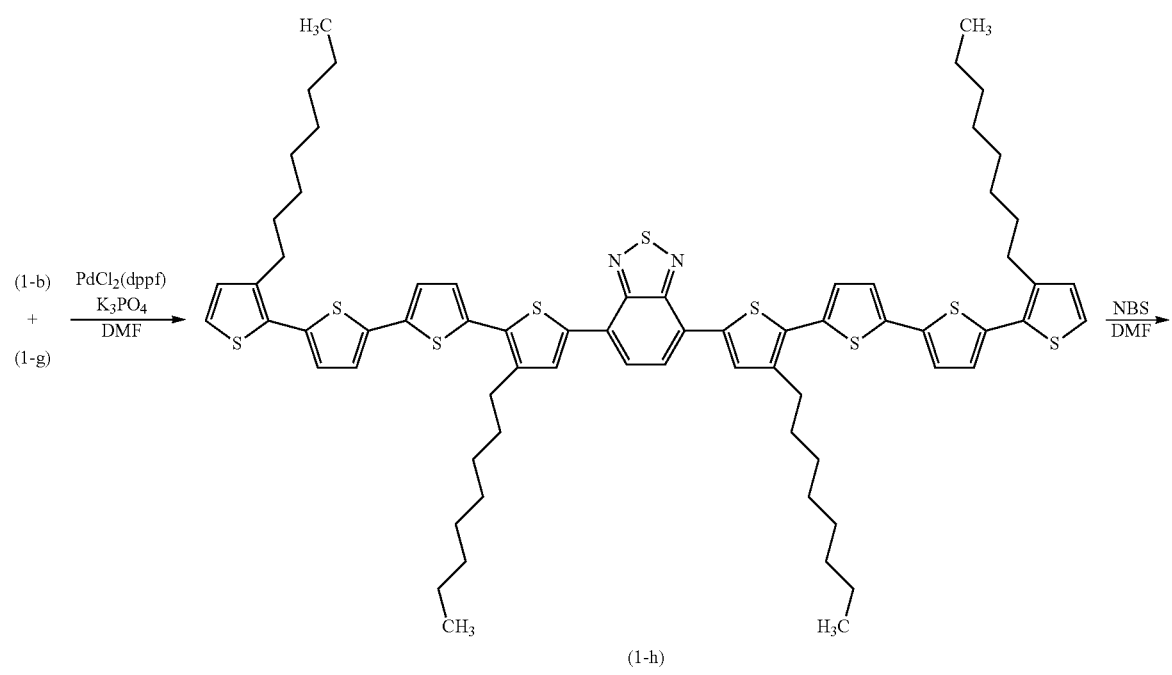

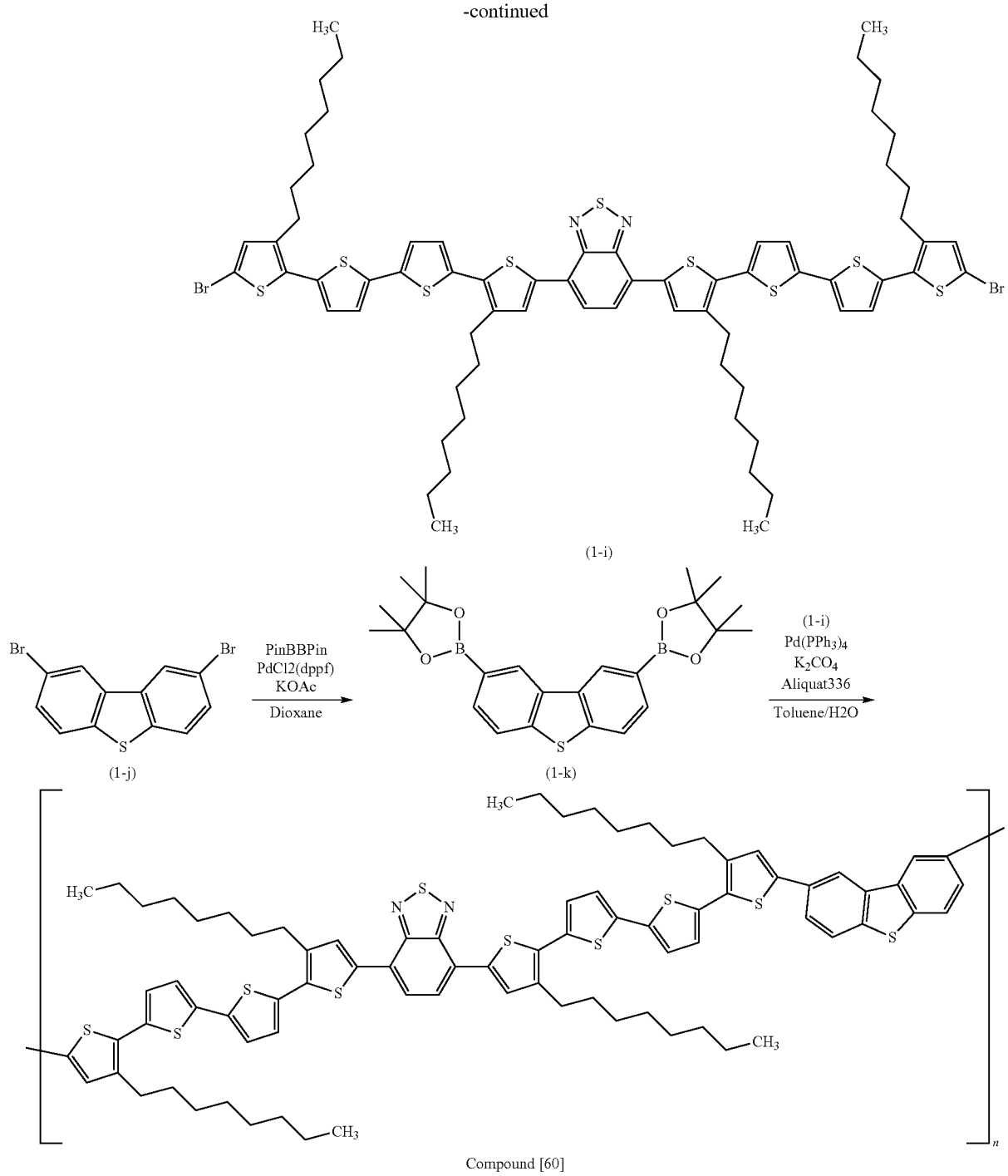

To 150 ml of 48% hydrobromic acid, 4.3 g of the compound (1-a) (manufactured by Tokyo Chemical Industry Co., Ltd.) and 10 g of bromine (manufactured by Wako Pure Chemical Industries, Ltd.) were added, and the resulting mixture was stirred at 120° C. for three hours. The mixture was cooled to room temperature, and the precipitated solid was filtered through a glass filter and washed with 1000 ml of water and 100 ml of acetone. The resulting solid was dried in vacuo at 60° C. to obtain 6.72 g of the compound (1-b).

A 10.2 g amount of the compound (1-c) was dissolved in 100 ml of dimethylformamide; to the resulting solution, 9.24 g of N-bromosuccinimide (manufactured by Wako Pure Chemical Industries, Ltd.) was added; and the resulting mixture was stirred under a nitrogen atmosphere at room temperature for three hours. To the resulting solution, 200 ml of water, 200 ml of n-hexane, and 200 ml of dichloromethane were added, and the organic layer was separated. The resulting organic layer was washed with 200 ml of water and dried over magnesium sulfate. The resulting solution was purified by column chromatography (filler: silica gel, eluent: hexane) to obtain 14.4 g of the compound (1-d).

A 14.2 g amount of the compound (1-d) was dissolved in 200 ml of tetrahydrofuran and cooled to −80° C. To the resulting solution, 35 ml of n-butyllithium (1.6 M hexane solution) (manufactured by Wako Pure Chemical Industries, Ltd.) was added, and the resulting mixture was heated to −50° C. and again cooled to −80° C. To the resulting mixture, 13.6 ml of 2-isopropoxy-4,4,5,5-tetramethyl-1,3,2-didioxaborolane (manufactured by Wako Pure Chemical Industries, Ltd.) was added, and the resulting mixture was heated to room temperature and stirred under a nitrogen atmosphere for four hours. To the resulting solution, 200 ml of 1 N ammonium chloride aqueous solution and 200 ml of ethyl acetate were added, and the organic layer was separated. The resulting organic layer was washed with 200 ml of water and dried over magnesium sulfate. The resulting solution was purified by column chromatography (filler: silica gel, eluent: hexane/dichloromethane) to obtain 14.83 g of the compound (1-e).

To 200 ml of dimethylformamide, 14.83 g of the compound (1-e) and 6.78 g of 5,5'-dibromo-2,2'-bithiophene (manufactured by Tokyo Chemical Industry Co., Ltd.) were added, and 26.6 g of potassium phosphate (manufactured by Wako Pure Chemical Industries, Ltd.) and 1.7 g of [bis(diphenylphosphino)ferrocene]dichloropalladium (manufactured by Sigma-Aldrich Co. LLC.) were further added under a nitrogen atmosphere, and the resulting mixture was stirred at 100° C. for four hours. To the resulting solution, 500 ml of water and 300 ml of ethyl acetate were added, and the organic layer was separated. The resulting organic layer was washed with 500 ml of water and dried over magnesium sulfate. The resulting solution was purified by column chromatography (filler: silica gel, eluent: hexane) to obtain 4.53 g of the compound (1-f).

A 4.53 g amount of the compound (1-f) was dissolved in 40 ml of tetrahydrofuran and cooled to −80° C. To the resulting solution, 6.1 ml of n-butyllithium (1.6 M hexane solution) was added, and the resulting mixture was heated to −5° C. and again cooled to −80° C. To the resulting mixture, 2.3 ml of 2-isopropoxy-4,4,5,5-tetramethyl-1,3,2-didioxaborolane was added, and the resulting mixture was heated to room temperature and stirred under a nitrogen atmosphere for two hours. To the resulting solution, 150 ml of 1 N ammonium chloride aqueous solution and 200 ml of ethyl acetate were added, and the organic layer was separated. The resulting organic layer was washed with 200 ml of water and dried over magnesium sulfate. The resulting solution was purified by column chromatography (filler: silica gel, eluent: dichloromethane/hexane) to obtain 2.31 g of the compound (1-g).

To 17 ml of dimethylformamide, 0.498 g of the compound (1-b) and 2.31 g of the compound (1-g) were added, and 2.17 g of potassium phosphate and 0.14 g of [bis(diphenylphosphino)ferrocene]dichloropalladium (manufactured by Sigma-Aldrich Co. LLC.) were further added under a nitrogen atmosphere, and the resulting mixture was stirred at 90° C. for seven hours. To the resulting solution, 200 ml of water and 100 ml of chloroform were added, and the organic layer was separated. The resulting organic layer was washed with 200 ml of water and dried over magnesium sulfate. The resulting solution was purified by column chromatography (filler: silica gel, eluent: dichloromethane/hexane) to obtain 1.29 g of the compound (1-h). The $^1$H-NMR analysis results of the compound (1-h) are shown below.

$^1$H-NMR (CD$_2$Cl$_2$, (d=ppm)): 8.00 (s, 2H), 7.84 (s, 2H), 7.20-7.15 (m, 8H), 7.04 (d, 2H), 6.95 (d, 2H), 2.88 (t, 4H), 2.79 (t, 4H), 1.77-1.29 (m, 48H), 0.88 (m, 12H)

A 0.734 g amount of the compound (1-h) was dissolved in 15 ml of chloroform; 0.23 g of N-bromosuccinimide and 10 ml of dimethylformamide were added; and the resulting mixture was stirred under a nitrogen atmosphere at room temperature for nine hours. To the resulting solution, 100 ml of water and 100 ml of chloroform were added, and the organic layer was separated. The resulting organic layer was washed with 200 ml of water and dried over magnesium sulfate. The resulting solution was purified by column chromatography (filler: silica gel, eluent: dichloromethane/hexane) to obtain 0.58 g of the compound (1-i).

A 0.5 g amount of the compound (1-j), 0.85 g of bis(pinacolato)diboron (manufactured by BASF Japan Ltd.), and 0.86 g of potassium acetate (manufactured by Wako Pure Chemical Industries, Ltd.) were added to 7 ml of 1,4-dioxane; 0.21 g of [bis(diphenylphosphino)ferrocene]dichloropalladium was further added under a nitrogen atmosphere; and the resulting mixture was stirred at 80° C. for seven hours. To the resulting solution, 100 ml of water and 100 ml of ethyl acetate were added, and the organic layer was separated. The resulting organic layer was washed with 100 ml of water and dried over magnesium sulfate. The resulting solution was purified by column chromatography (filler: silica gel, eluent: dichloromethane) to obtain 57 mg of the compound (1-k).

A 93 mg amount of the compound (1-i) and a 19.3 mg amount of the compound (1-k) were dissolved in 6 ml of toluene. To this, 2 ml of water, 0.18 g of potassium carbonate, 7.7 mg of tetrakis(triphenylphosphine)palladium (0) (manufactured by Tokyo Chemical Industry Co., Ltd.), and one drop of Aliquat® 336 (manufactured by Sigma-Aldrich Co. LLC.) were added, and the resulting mixture was stirred under a nitrogen atmosphere at 100° C. for 25 hours. Then, 40 mg of phenylboronic acid was added, and the resulting mixture was stirred at 100° C. for seven hours. To the resulting solution, 50 ml of methanol was added, and the produced solid was obtained by filtration and washed with methanol, water, methanol, and acetone in this order. The obtained solid was dissolved in chloroform, passed through a silica gel short column (eluent: chloroform), and then concentrated to dryness to obtain 30 mg of a compound [60]. The compound has a weight average molecular weight of 4367, a number average molecular weight of 3475, and a polymerization degree n of 3.1.

A semiconductor solution B (having a CNT composite concentration of 0.03 g/l with respect to the solvent) was obtained in the same manner as the semiconductor solution A except that the compound [60] was used in place of P3HT.

Preparation Example 3 for Semiconductor Solution: Semiconductor Solution C

A 1.0 g amount of the CNT 1 and 50 mL of chloroform were added, and the resulting mixture was dispersed using an ultrasonic washer for one hour. Further, 5 ml of this dispersion solution was taken and diluted in 100 ml, and the resulting solution was further dispersed using an ultrasonic washer for two hours to obtain a CNT dispersion solution C. The obtained CNT dispersion solution C was filtered using a membrane filter (Omnipore, pore diameter: 10 µm, diameter: 25 mm; manufactured by Millipore Corporation) to remove CNTs having a length of 10 µm or more to obtain a semiconductor solution C.

Preparation Example 4 for Semiconductor Solution: Semiconductor Solution D

A 1.5 mg amount of the CNT 1 and 1.5 mg of sodium dodecyl sulfate (manufactured by Wako Pure Chemical Industries, Ltd.) were added in 30 ml of water, and the resulting mixture was stirred on ice with ultrasonication using an ultrasonic homogenizer at an output of 250 W for five hours to obtain a CNT dispersion solution D (having a CNT composite concentration of 0.05 g/l with respect to the solvent). The obtained CNT dispersion solution D was centrifuged using a centrifugal separator (CT15E manufactured by Hitachi Koki Co., Ltd.) at 21000 G for 60 minutes, and 80% of the supernatant was taken out to obtain a semiconductor solution D.

Composition Preparation Example 1: Gate Insulating Layer Solution A

A 61.29 g (0.45 mol) amount of methyltrimethoxysilane, 12.31 g (0.05 mol) of 2-(3,4-epoxycyclohexyl)ethyltrimethoxysilane, and 99.15 g (0.5 mol) of phenyltrimethoxysilane were dissolved in 203.36 g of propylene glycol monobutyl ether (boiling point: 170° C.). To the resulting mixture, 54.90 g of water and 0.864 g of phosphoric acid were added with stirring. The resulting solution was heated at a bath temperature of 105° C. for two hours, and the internal temperature of the solution was raised to 90° C. to distill out a component mainly composed of by-produced methanol. Subsequently, the resulting solution was heated at a bath temperature of 130° C. for 2.0 hours, and the internal temperature was raised to 118° C. to distill out a component mainly composed of water and propylene glycol monobutyl ether, followed by cooling to room temperature, to obtain a polysiloxane solution having a solid concentration of 26.0 wt %. The resulting polysiloxane had a weight average molecular weight of 6,000.

A 10 g amount of the thus obtained polysiloxane solution A was weighed, and mixed with 54.4 g of propylene glycol monoethyl ether acetate (hereinafter, referred to as PGMEA), followed by stirring at room temperature for two hours, to obtain a gate insulating layer solution A.

Composition Preparation Example 2: Gate Insulating Layer Solution B

A 10 g amount of the thus obtained polysiloxane solution was weighed, and mixed with 0.13 g of aluminumbis(ethylacetoacetate)mono(2,4-pentanedionate) (tradename "Alumichelate D"; manufactured by Kawaken Fine Chemicals Co., Ltd., hereinafter, referred to as Alumichelate D) and 54.4 g of propylene glycol monoethyl ether acetate (hereinafter, referred to as PGMEA), followed by stirring at room temperature for two hours, to obtain a gate insulating layer solution B. The content of the above described polymer in the resulting solution was 2,000 parts by weight with respect to 100 parts by weight of Alumichelate D. The gate insulating layer solution B was stored in the atmosphere at room temperature. As a result, the paste was stable and no precipitate was observed even after one month.

Composition Preparation Example 3: Gate Insulating Layer Solution C

A gate insulating layer solution C was obtained in the same manner as the gate insulating layer solution B except that 2.5 g of the polysiloxane solution A, 13 g of indium tris(2,4-pentanedionate) (manufactured by Wako Pure Chemical Industries, Ltd.) in place of Alumichelate D, and 49.8 g of PGMEA were used. The content of the above-mentioned polymer in this solution was 5 parts by weight with respect to 100 parts by weight of indium tris(2,4-pentanedionate).

Composition Preparation Example 4: Gate Insulating Layer Solution D

A gate insulating layer solution D was obtained in the same manner as the gate insulating layer solution B except that 5.2 g of titanium tetra(2,4-pentanedionate) (the tradename "ORGATIX TC-401"; manufactured by Matsumoto Fine Chemical Co., Ltd.) in place of Alumichelate D and 49.8 g of PEGMEA were used. The content of the above-mentioned polymer in this solution was 50 parts by weight with respect to 100 parts by weight of titanium tetra(2,4-pentanedionate).

Composition Preparation Example 5: Gate Insulating Layer Solution E

A gate insulating layer solution E was obtained in the same manner as the gate insulating layer solution B except that 13 g of Alumichelate D and 42 g of PGMEA were used. The content of the above-mentioned polymer in this solution was 20 parts by weight with respect to 100 parts by weight of Alumichelate D.

Composition Preparation Example 6: Gate Insulating Layer Solution F

A gate insulating layer solution F was obtained in the same manner as the gate insulating layer solution B except that 13 g of Alumichelate D and 49.5 g of PGMEA were used. The content of the above-mentioned polymer in this solution was 87 parts by weight with respect to 100 parts by weight of Alumichelate D.

Composition Preparation Example 7: Gate Insulating Layer Solution G

A gate insulating layer solution G was obtained in the same manner as the gate insulating layer solution B except that 2.5 g of the polysiloxane solution A, 13 g of Alumichelate D, and 49.5 g of PGMEA were used. The content of the above-mentioned polymer in this solution was 5 parts by weight with respect to 100 parts by weight of Alumichelate D.

Synthesis Example 1: Compound P1 (Organic Component)

Copolymerization ratio (based on weight):ethyl acrylate (hereinafter referred to as "EA")/2-ethylhexyl methacrylate (hereinafter referred to as "2-EHMA")/styrene (hereinafter referred to as "St")/glycidyl methacrylate (hereinafter referred to as "GMA")/acrylic acid (hereinafter referred to as "AA")=20/40/20/5/15.

Into a reaction vessel under a nitrogen atmosphere, 150 g of diethylene glycol monoethyl ether acetate (hereinafter referred to as "DMEA") was charged, and the vessel was heated to 80° C. using an oil bath. To the resultant, a mixture composed of 20 g of EA, 40 g of 2-EHMA, 20 g of St, 15 g of AA, 0.8 g of 2,2'-azobisisobutyronitrile and 10 g of DMEA was added dropwise over one hour. After the completion of the dropwise addition, the polymerization reaction was carried out for six more hours. Thereafter, 1 g of hydroquinone monomethyl ether was added to terminate the polymerization reaction. To the resultant, a mixture composed of 5 g of GMA, 1 g of triethylbenzylammonium chloride and 10 g of DMEA was added dropwise over 0.5 hours. After the completion of the dropwise addition, the addition reaction was carried out for two more hours. The resulting reaction solution was purified with methanol to remove unreacted impurities, followed by vacuum drying for 24 hours, to obtain a compound P1.

Synthesis Example 2: Compound P2 (Organic Component)

Copolymerization ratio (based on weight):bifunctional epoxy acrylate monomer (epoxy ester 3002A; manufactured by Kyoeisha Chemical Co., Ltd.)/bifunctional epoxy acrylate monomer (epoxy ester 70PA; manufactured by Kyoeisha Chemical Co., Ltd.)/GMA/St/AA=20/40/5/20/15.

Into a reaction vessel under a nitrogen atmosphere, 150 g of diethylene glycol monoethyl ether acetate (hereinafter referred to as "DMEA") was charged, and the vessel was heated to 80° C. using an oil bath. To the resultant, a mixture composed of 20 g of epoxy ester 3002A, 40 g of epoxy ester 70PA, 20 g of St, 15 g of AA, 0.8 g of 2,2'-azobisisobutyronitrile, and 10 g of DMEA was added dropwise over one hour. After the completion of the dropwise addition, the polymerization reaction was carried out for six more hours. Thereafter, 1 g of hydroquinone monomethyl ether was added to terminate the polymerization reaction. To the resultant, a mixture composed of 5 g of GMA, 1 g of triethylbenzylammonium chloride, and 10 g of DMEA was added dropwise over 0.5 hours. After the completion of the dropwise addition, the addition reaction was carried out for two more hours. The resulting reaction solution was purified with methanol to remove unreacted impurities, followed by vacuum drying for 24 hours, to obtain a compound P2.

Synthesis Example 3: Compound P3 (Organic Component)

A Urethane-Modified Compound of the Compound P2

Into a reaction vessel under a nitrogen atmosphere, 100 g of diethylene glycol monoethyl ether acetate (hereinafter referred to as "DMEA") was charged, and the vessel was heated to 80° C. using an oil bath. To the resultant, a mixture composed of 10 g of the photosensitive component P2, 3.5 g of n-hexylisocyanate, and 10 g of DMEA was added dropwise over one hour. After the completion of the dropwise addition, the reaction was carried out for three more hours. The resulting reaction solution was purified with methanol to remove unreacted impurities, followed by vacuum drying for 24 hours, to obtain a compound P3 having a urethane bond.

Preparation Example 1; Conductive Paste A

To a 100 ml clean bottle, 16 g of the compound P1, 4 g of the compound. P3, 4 g of a photopolymerization initiator OXE-01 (manufactured by BASF Japan Ltd.), 0.6 g of an acid generator SI-110 (manufactured by Sanshin Chemical Industry Co., Ltd.), and 10 g of γ-butyrolactone (manufactured by Mitsubishi Gas Chemical Company, Inc.) were charged. The resultant was mixed by a rotation-revolution vacuum mixer "Awatori Neritaro" (registered trademark) (ARE-310; manufactured by Thinky Corporation), to obtain 46.6 g of a photosensitive resin solution (solid content: 78.5 wt %). A 8.0 g amount of the resulting photosensitive resin solution and 42.0 g of Ag particles having an average particle size of 0.2 μm were mixed, followed by kneading using a three roll mill "EXAKT M-50" (tradename; manufactured by EXAKT Inc.) to obtain 50 g of a conductive paste A.

Example 1

An n-type semiconductor device as shown in FIG. 1 was produced. On a glass substrate 1 (having a film thickness of 0.7 mm), chromium and gold were vacuum vapor deposited through a mask to a thickness of 5 nm and 50 nm respectively using a resistance heating method to form a gate electrode 2 for the n-type drive semiconductor device. Next, the resulting substrate was spin-coated (2000 rpm×30 seconds) with Ethyl Silicate 28 (a tradename, manufactured by Colcoat Co., Ltd.), and the coated substrate was heat-treated under a nitrogen stream at 200° C. for one hour to form a gate insulating layer 3 having a film thickness of 600 nm. Subsequently, gold was vacuum vapor deposited through a mask to a film thickness of 50 nm using a resistance heating method, to form a source electrode 5 and a drain electrode 6 for the n-type drive semiconductor device. Next, 1 μL of the semiconductor solution A was dropped between the source electrode 5 and the drain electrode 6, air-dried at 30° C. for 10 minutes, and heat-treated on a hot plate under a nitrogen stream at 150° C. for 30 minutes to form a semiconductor layer 4. Next, 50 μL of the below-mentioned F8BT (manufactured by Sigma-Aldrich Co. LLC.) was dropped onto the semiconductor layer 4 so as to cover the semiconductor layer 4, and heat-treated under a nitrogen stream at 150° C. for one hour, forming a second insulating layer to obtain an n-type drive semiconductor device.

The source and drain electrodes (channel width) of this n-type drive semiconductor device each had a width of 200 μm, and the spacing between the source and drain electrodes (channel length) was 100 μm.

Next, the characteristic of the source-drain current (Id) versus the source-drain voltage (Vsd) was measured when the gate voltage (Vg) of the n-type drive semiconductor device was varied. The measurement was made in the atmosphere using a semiconductor characterization system Model 4200-SCS (manufactured by Keithley Instruments Co., Ltd.). The mobility in the linear region was determined from the variation in the Id value at Vsd=−5V which was caused in the variation of Vg=+30 to −30V, and the threshold voltage was determined from the intersection between the extension and Vg axis of the linear portion on the Id-Vg graph.

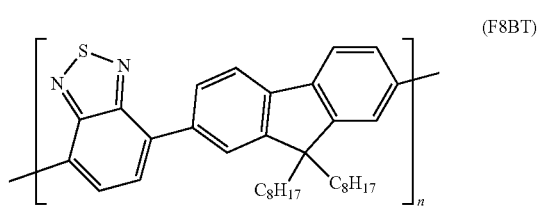

(F8BT)

Examples 2 to 22, 24 to 26, 28 to 31

An n-type semiconductor device was prepared in the same manner as in Example 1, under the conditions shown in Table 1. The obtained n-type semiconductor device was evaluated for mobility and threshold voltage. The results are shown in Table 1. In this regard, one of polyvinylpyrrolidone K-30 (a tradename, manufactured by Nacalai Tesque, Inc.), poly(melamine-co-formaldehyde) (a solid concentration of 84 wt %, a 1-butanol solution, manufactured by Sigma-Aldrich Co. LLC.), N,N-dimethylformamide (99% or more, for molecular biology, manufactured by Sigma-Aldrich Co. LLC.), diisopropylethylamine (primary, manufactured by Tokyo Chemical Industry Co., Ltd.), cyclododecylamine (primary, manufactured by Tokyo Chemical Industry Co., Ltd.), dicyclohexylmethylamine (primary, manufactured by Tokyo Chemical Industry Co., Ltd.), quinuclidine (primary, manufactured by Tokyo Chemical Industry Co., Ltd.), DBU (primary, manufactured by Tokyo Chemical Industry Co., Ltd.), DBN (primary, manufactured by Tokyo Chemical Industry Co., Ltd.), TBD (primary, manufactured by Tokyo Chemical Industry Co., Ltd.), MTBD (primary, manufactured by Tokyo Chemical Industry Co., Ltd.), urea (99.5% or more, for molecular biology, manufactured by Sigma-Aldrich Co. LLC.), and poly(vinylpolypyrrolidone) (for molecular biology, manufactured by Sigma-Aldrich Co. LLC.) was used for the second insulating layer.

Example 23

A PET film having a film thickness of 50 µm in place of the glass substrate 1 was coated with the conductive paste A by means of screen printing, followed by prebaking in a drying oven at 100° C. for 10 minutes. Subsequently, the coated PET film was exposed using an exposure apparatus "PEM-8M" (tradename; manufactured by Union Optical Co., Ltd.), and then developed by immersion in a 0.5% $Na_2CO_3$ solution for 30 seconds. Thereafter, the developed film was rinsed with ultrapure water, followed by curing in a drying oven at 140° C. for 30 minutes, to form a gate electrode 2 for the n-type drive semiconductor device. Next, the resulting substrate was spin-coated (2000 rpm×30 seconds) with the above-mentioned gate insulating layer solution E, and the coated substrate was heat-treated under a nitrogen stream at 200° C. for one hour to form a gate insulating layer 3 having a film thickness of 600 nm. Next, the resulting substrate was coated with the conductive paste A by screen printing, followed by prebaking in a drying oven at 100° C. for 10 minutes. Subsequently, the coated PET film was exposed using an exposure apparatus "PEM-8M", and then developed by immersion in a 0.5% $Na_2CO_3$ solution for 30 seconds. Thereafter, the developed film was rinsed with ultrapure water, followed by curing in a drying oven at 140° C. for 30 minutes, to form a source electrode 5 and a drain electrode 6 for the n-type drive semiconductor device. Next, 1 µL of the semiconductor solution B was dropped between the source electrode 5 and the drain electrode 6 of the n-type drive semiconductor device, air-dried at 30° C. for 10 minutes, and heat-treated on a hot plate under a nitrogen stream at 150° C. for 30 minutes to form a semiconductor layer 4 for the n-type drive semiconductor device. Next, 50 µL of polyvinylpyrrolidone K-30 was dropped onto the semiconductor layer 4 so as to cover the semiconductor layer 4, and heat-treated under a nitrogen stream at 150° C. for one hour, forming a second insulating layer to obtain the n-type drive semiconductor device.

The width of and the spacing between the source and drain electrodes of this n-type drive semiconductor device were the same as in Example 1.

Next, in the same manner as in Example 1, the characteristic of the source-drain current (Id) versus the source-drain voltage (Vsd) was measured when the gate voltage (Vg) of the n-type drive semiconductor device was varied, and the mobility and threshold voltage were determined. In addition, the electrodes were evaluated for adhesion, and no peeling nor breaking was found even on repeating a flexing action 100 times, showing that the adhesion was good.

Example 27

An n-type semiconductor device was prepared in the same manner as in Example 23 under the conditions shown in Table 1 except that DBU was used in place of polyvinylpyrrolidone K-30 when the second insulating layer was formed. The obtained n-type semiconductor device was evaluated for mobility and threshold voltage. The results are shown in Table 1. In addition, the electrodes were evaluated for adhesion, and no peeling nor breaking was found even on repeating a flexing action 100 times, showing that the adhesion was good.

Comparative Example 1

An n-type semiconductor device was prepared in the same manner as in Example 1 except that the semiconductor solution C was used in place of the semiconductor solution A. The obtained n-type semiconductor device was evaluated for mobility and threshold voltage, but the leak current was large, and thus neither mobility nor threshold voltage could be calculated.

Comparative Example 2

An n-type semiconductor device was prepared in the same manner as in Example 1 except that the semiconductor solution D was used in place of the semiconductor solution A. The obtained n-type semiconductor device was evaluated for mobility and threshold voltage. The results are shown in Table 1.

Example 32

A complementary semiconductor device as shown in FIG. 6 was produced. On a glass substrate 1 (having a film thickness of 0.7 mm), chromium and gold were vacuum vapor deposited through a mask to a thickness of 5 nm and 50 nm respectively using a resistance heating method to form a gate electrode 2 for the p-type semiconductor device and a gate electrode 2 for the n-type semiconductor device. Next, the resulting substrate was spin-coated (2000 rpm×30 seconds) with the above-mentioned gate insulating layer solution G, and the coated substrate was heat-treated under a nitrogen stream at 200° C. for one hour to form a gate insulating layer 3 having a film thickness of 600 nm. Subsequently, gold was vacuum vapor deposited through a mask to a film thickness of 50 nm using a resistance heating method, to form a source electrode 5 and a drain electrode 6 for the p-type semiconductor device and a source electrode 5 and a drain electrode 6 for the n-type semiconductor device. Next, 1 µL of the semiconductor solution B was dropped between the source electrode 5 and the drain electrode 6 of the p-type semiconductor device and between the source electrode 5 and the drain electrode 6 of the n-type semiconductor device, air-dried at 30° C. for 10 minutes, and heat-treated on a hot plate under a nitrogen stream at 150° C. for 30 minutes to form a semiconductor layer 4 for the p-type semiconductor device and a semiconductor layer 4 for the n-type semiconductor device. Next, 50 µL of polyvinylpyrrolidone K-30 was dropped onto the semiconductor layer 4 of the n-type semiconductor device so as to cover the semiconductor layer 4 of the n-type semiconductor device, and heat-treated under a nitrogen stream at 150° C. for one hour, forming a second insulating layer to obtain the p-type semiconductor device and the n-type semiconductor device.

The source and drain electrodes (channel width) of each of the p-type semiconductor device and the n-type semiconductor device had a width of 200 μm, and the spacing between the source and drain electrodes (channel length) was 100 μm.

The p-type semiconductor device and the n-type semiconductor device were evaluated for mobility and threshold voltage. The results are shown in Table 2. Next, the p-type semiconductor device and the n-type semiconductor device were wired to each other, and the complementary semiconductor device as shown in FIG. 12 was evaluated. In this regard, $V_{dd}$ was 10V and the GND terminal was grounded. The variation (gain) in $V_{out}$ caused in the variation of $V_{in}$ from 0 to 10V was measured and found to be 9.

Example 33

A p-type semiconductor device and an n-type semiconductor device were prepared in the same manner as in Example 28 except that DBU was used in place of polyvinylpyrrolidone K-30 for the second insulating layer for the n-type semiconductor device. The obtained p-type semiconductor device and n-type semiconductor device were evaluated for mobility and threshold voltage. The results are shown in Table 2. Next, the complementary semiconductor device as shown in FIG. 12 was evaluated in the same manner as in Example 32. The variation (gain) in $V_{out}$ caused in the variation of $V_{in}$ from 0 to 10V was measured and found to be 15.

Example 34

A p-type semiconductor device and an n-type semiconductor device were prepared in the same manner as in Example 29 except that 10 μL of a 5 mass % propyleneglycol 1-monomethylether 2-acetate solution of polystyrene (having a weight average molecular weight (Mw) of 192000, hereinafter referred to as PS, manufactured by Sigma-Aldrich Co. LLC.) was drop-cast on the semiconductor layer 4 of the p-type semiconductor device, air-dried at 30° C. for 5 minutes, and heat-treated on a hot plate under a nitrogen stream at 120° C. for 30 minutes to form a p-type semiconductor device having a second insulating layer. The obtained p-type semiconductor device and n-type semiconductor device were evaluated for mobility and threshold voltage. The results are shown in Table 2. Next, the complementary semiconductor device as shown in FIG. 12 was evaluated in the same manner as in Example 32. The variation (gain) in $V_{out}$ caused in the variation of $V_{in}$ from 0 to 10V was measured and found to be 21.

Comparative Example 4

A p-type semiconductor device and an n-type semiconductor device were prepared in the same manner as in Example 32 except that the semiconductor solution C in place of the semiconductor solution B, Ethyl Silicate 28 in place of the gate insulating layer solution G, and F8BT in place of polyvinylpyrrolidone K-30 for the second insulating layer of the n-type semiconductor device were used. The obtained p-type semiconductor device and n-type semiconductor device were evaluated for mobility and threshold voltage, but the leak current was large, and thus neither mobility nor threshold voltage could be calculated.

Comparative Example 5

A p-type semiconductor device and an n-type semiconductor device were prepared in the same manner as in Example 32 except that the semiconductor solution D in place of the semiconductor solution B, Ethyl Silicate 28 in place of the gate insulating layer solution G, and diisopropylethylamine in place of polyvinylpyrrolidone K-30 for the second insulating layer of the n-type semiconductor device were used. The obtained p-type semiconductor device and n-type semiconductor device were evaluated for mobility and threshold voltage. The results are shown in Table 2. Next, the complementary semiconductor device as shown in FIG. 12 was evaluated in the same manner as in Example 32. The variation (gain) in $V_{out}$ caused in the variation of $V_{in}$ from 0 to 10V was measured, but the $V_{out}$ did not vary, and thus the complementary semiconductor device was not operable.

TABLE 1-1

| | | 2nd Insulating Layer of n-type Semiconductor Device Compound | Gate Insulating Layer | | | Mobility [cm²/Vs] | Threshold Voltage (Absolute Value) [V] |
|---|---|---|---|---|---|---|---|
| | Semiconductor Layer | | Gate Insulating Layer Solution | Metal Compound | Electrode Material | | |
| Example 1 | Semiconductor Solution A | F8BT | Ethyl Silicate 28 | — | Au Electrode | 0.18 | 14.0 |
| Example 2 | Semiconductor Solution A | F8BT | Gate Insulating Solution A | — | Au Electrode | 0.21 | 11.0 |
| Example 3 | Semiconductor Solution A | polyvinylpyrrolidone K-30 | Gate Insulating Solution A | — | Au Electrode | 0.22 | 7.1 |
| Example 4 | Semiconductor Solution A | polyvinylpyrrolidone K-30 | Gate Insulating Solution C | In | Au Electrode | 0.31 | 6.8 |
| Example 5 | Semiconductor Solution A | polyvinylpyrrolidone K-30 | Gate Insulating Solution D | Ti | Au Electrode | 0.30 | 6.4 |
| Example 6 | Semiconductor Solution A | polyvinylpyrrolidone K-30 | Gate Insulating Solution B | Al | Au Electrode | 0.35 | 6.0 |
| Example 7 | Semiconductor Solution A | poly(melamine-co-formaldehyde) | Gate Insulating Solution E | Al | Au Electrode | 0.25 | 7.5 |
| Example 8 | Semiconductor Solution A | N,N-dimethylformamide | Gate Insulating Solution E | Al | Au Electrode | 0.30 | 3.5 |
| Example 9 | Semiconductor Solution A | diisopropylethylamine | Gate Insulating Solution E | Al | Au Electrode | 0.42 | 2.7 |
| Example 10 | Semiconductor Solution A | cyclododecylamine | Gate Insulating Solution E | Al | Au Electrode | 0.47 | 2.2 |
| Example 11 | Semiconductor Solution A | dicyclohexylmethylamine | Gate Insulating Solution E | Al | Au Electrode | 0.48 | 2.1 |
| Example 12 | Semiconductor Solution A | quinuclidine | Gate Insulating Solution E | Al | Au Electrode | 0.55 | 1.7 |
| Example 13 | Semiconductor Solution A | DBU | Gate Insulating Solution E | Al | Au Electrode | 0.65 | 1.0 |
| Example 14 | Semiconductor Solution A | DBN | Gate Insulating Solution E | Al | Au Electrode | 0.64 | 1.1 |

TABLE 1-1-continued

|  | Semiconductor Layer | 2nd Insulating Layer of n-type Semiconductor Device Compound | Gate Insulating Layer Solution | Gate Insulating Layer Metal Compound | Electrode Material | Mobility [cm²/Vs] | Threshold Voltage (Absolute Value) [V] |
| --- | --- | --- | --- | --- | --- | --- | --- |
| Example 15 | Semiconductor Solution A | TBD | Gate Insulating Solution E | Al | Au Electrode | 0.61 | 1.3 |
| Example 16 | Semiconductor Solution A | MTBD | Gate Insulating Solution E | Al | Au Electrode | 0.62 | 1.2 |
| Example 17 | Semiconductor Solution A | urea | Gate Insulating Solution G | Al | Au Electrode | 0.26 | 4.1 |

TABLE 1-2

|  | Semiconductor Layer | 2nd Insulating Layer of n-type Semiconductor Device Compound | Gate Insulating Layer Solution | Gate Insulating Layer Metal Compound | Electrode Material | Mobility [cm²/Vs] | Threshold Voltage (Absolute Value) [V] |
| --- | --- | --- | --- | --- | --- | --- | --- |
| Example 18 | Semiconductor Solution A | polyvinylpyrrolidone K-30 | Gate Insulating Solution E | Al | Au Electrode | 0.40 | 3.2 |
| Example 19 | Semiconductor Solution B | poly(vinylpolypyrrolidone) | Gate Insulating Solution G | Al | Au Electrode | 0.47 | 2.8 |
| Example 20 | Semiconductor Solution B | polyvinylpyrrolidone K-30 | Gate Insulating Solution F | Al | Au Electrode | 0.35 | 3.9 |
| Example 21 | Semiconductor Solution B | polyvinylpyrrolidone K-30 | Gate Insulating Solution G | Al | Au Electrode | 0.68 | 0.9 |
| Example 22 | Semiconductor Solution B | polyvinylpyrrolidone K-30 | Gate Insulating Solution E | Al | Au Electrode | 0.51 | 0.8 |
| Example 23 | Semiconductor Solution B | polyvinylpyrrolidone K-30 | Gate Insulating Solution E | Al | Conductive Paste A | 0.65 | 1.0 |
| Example 24 | Semiconductor Solution B | DBU | Gate Insulating Solution F | Al | Au Electrode | 0.60 | 1.7 |
| Example 25 | Semiconductor Solution B | DBU | Gate Insulating Solution G | Al | Au Electrode | 1.03 | 0.8 |
| Example 26 | Semiconductor Solution B | DBU | Gate Insulating Solution E | Al | Au Electrode | 0.88 | 0.7 |
| Example 27 | Semiconductor Solution B | DBU | Gate Insulating Solution E | Al | Conductive Paste A | 0.97 | 1.0 |
| Example 28 | Semiconductor Solution C | DBU | Gate Insulating Solution E | Al | Au Electrode | 0.20 | 5.3 |
| Example 29 | Semiconductor Solution C | DBU | Gate Insulating Solution E | Al | Au Electrode | 0.20 | 5.3 |
| Example 30 | Semiconductor Solution C | TBD | Gate Insulating Solution E | Al | Au Electrode | 0.19 | 5.5 |
| Example 31 | Semiconductor Solution D | DBU | Gate Insulating Solution E | Al | Au Electrode | 0.22 | 4.9 |
| Comparative Example 1 | Semiconductor Solution C | F8BT | Ethyl Silicate 28 | — | Au Electrode | — | — |
| Comparative Example 2 | Semiconductor Solution D | F8BT | Ethyl Silicate 28 | — | Au Electrode | 0.001 | 14.8 |
| Comparative Example 3 | Semiconductor Solution C | diisopropylethylamine | Gate Insulating Solution E | — | Au Electrode | 0.001 | 13.9 |

TABLE 2

|  | Semiconductor Layer | 2nd Insulating Layer of n-type Semiconductor Device | Gate Insulating Layer Solution | Gate Insulating Layer Metal Compound | 2nd Insulating Layer of p-type Semiconductor Device | Electrode Material | Mobility [cm²/Vs] p-type | Mobility [cm²/Vs] n-type | Threshold Voltage (Absolute Value) [V] p-type | Threshold Voltage (Absolute Value) [V] n-type |
| --- | --- | --- | --- | --- | --- | --- | --- | --- | --- | --- |
| Example 32 | Semiconductor Solution B | polyvinylpyrrolidone K-30 | Gate Insulating Solution G | Al | — | Au Electrode | 0.66 | 0.68 | 1.2 | 0.9 |
| Example 33 | Semiconductor Solution B | DBU | Gate Insulating Solution G | Al | — | Au Electrode | 0.66 | 1.03 | 1.2 | 0.8 |
| Example 34 | Semiconductor Solution B | DBU | Gate Insulating Solution G | Al | polystyrene | Au Electrode | 0.74 | 1.03 | 0.9 | 0.8 |
| Comparative Example 4 | Semiconductor Solution C | F8BT | Ethyl Silicate 28 | — | — | Au Electrode | — | — | — | — |
| Comparative Example 5 | Semiconductor Solution D | diisopropylethylamine | Ethyl Silicate 28 | — | — | Au Electrode | 0.08 | 0.001 | 13.5 | 15.6 |

DESCRIPTION OF SYMBOLS

1 Substrate
2 Gate Electrode
3 Gate Insulating Layer
4 Semiconductor Layer
5 Source Electrode
6 Drain Electrode
7 Carbon Nanotube Composite
8 Second Insulating Layer of N-type Semiconductor Device
100 Metal Column
101 Substrate

The invention claimed is:

1. An n-type semiconductor device comprising:
a substrate;
a source electrode, a drain electrode, and a gate electrode;
a semiconductor layer in contact with the source electrode and the drain electrode;
a gate insulating layer insulating the semiconductor layer from the gate electrode; and
a second insulating layer in contact with the semiconductor layer on the opposite side of the semiconductor layer from the gate insulating layer;
wherein the semiconductor layer contains a carbon nanotube composite having a conjugated polymer attached to at least a part of the surface thereof;
wherein the second insulating layer contains an organic compound containing a bond between a carbon atom and a nitrogen atom; and
wherein the second insulating layer comprises one or more compounds selected from the following general formulae (1) and (2):

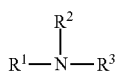

(1)

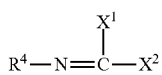

(2)

wherein $R^1$ to $R^4$ independently represent a group constituted by one or more atoms selected from a hydrogen atom(s), a carbon atom(s), a nitrogen atom(s), an oxygen atom(s), a silicon atom(s), a phosphorus atom(s), and a sulfur atom(s); and
$X^1$ and $X^2$ independently represent a group represented by the following general formulae (3) to (8):

—H  (3)

 (4)

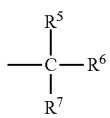

(5)

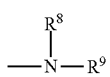

(6)

—O—$R^{10}$

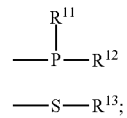

(7)

—S—$R^{13}$;  (8)

wherein $R^5$ to $R^{13}$ independently represent a group constituted by one or more atoms selected from a hydrogen atom(s), a carbon atom(s), a nitrogen atom(s), an oxygen atom(s), a silicon atom(s), a phosphorus atom(s), and a sulfur atom(s).

2. The n-type semiconductor device according to claim 1, wherein the conjugated polymer comprises, in the repeating units thereof, a fused heteroaryl unit having a nitrogen-containing double bond in the ring thereof and a thiophene unit.

3. The n-type semiconductor device according to claim 1, wherein $R^1$ to $R^{13}$ in the general formulae (1) to (8) are hydrocarbon groups.

4. The n-type semiconductor device according to claim 1, wherein the second insulating layer comprises an amine compound having a ring structure.

5. The n-type semiconductor device according to claim 1, wherein the second insulating layer comprises an organic compound having a structure of the general formula (1) or (2) and containing a ring structure containing the nitrogen atom shown in the formula (1) or (2) as a heteroatom.

6. The n-type semiconductor device according to claim 1, wherein the second insulating layer comprises one or more compounds selected from an amidine compound and a guanidine compound.

7. The n-type semiconductor device according to claim 1, wherein the gate insulating layer comprises an organic compound containing a bond between a silicon atom and a carbon atom.

8. The n-type semiconductor device according to claim 1, wherein the gate insulating layer further comprises a metal compound containing a bond between a metal atom and an oxygen atom.

9. The n-type semiconductor device according to claim 8, wherein the metal atom is aluminum.

10. An n-type semiconductor device comprising:
a substrate;
a source electrode, a drain electrode, and a gate electrode;
a semiconductor layer in contact with the source electrode and the drain electrode;
a gate insulating layer insulating the semiconductor layer from the gate electrode; and
a second insulating layer in contact with the semiconductor layer on the opposite side of the semiconductor layer from the gate insulating layer;
wherein the semiconductor layer contains a carbon nanotube; and
wherein the second insulating layer contains an organic compound having a structure of the general formula (2):

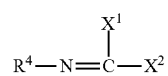

(2)

wherein $R^4$ represents a group constituted by one or more atoms selected from a hydrogen atom(s), a carbon atom(s), a nitrogen atom(s), an oxygen atom(s), a silicon atom(s), a phosphorus atom(s), and a sulfur atom(s); and $X^1$ and $X^2$ independently represent a group represented by the following general formulae (3) to (8):

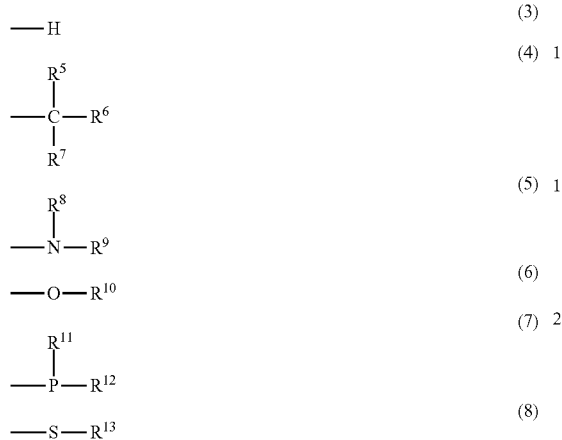

wherein $R^5$ to $R^{13}$ represent a group constituted by one or more atoms selected from a hydrogen atom(s), a carbon atom(s), a nitrogen atom(s), an oxygen atom(s), a silicon atom(s), a phosphorus atom(s), and a sulfur atom(s).

11. The n-type semiconductor device according to claim 10, wherein the second insulating layer comprises an organic compound having a structure of the general formula (2) and containing a ring structure containing the nitrogen atom shown in the general formula (2) as a heteroatom.

12. The n-type semiconductor device according to claim 1, wherein the total length of the carbon nanotube composite present per 1 μm² of the semiconductor layer is 1 μm to 50 μm.

13. A complementary semiconductor device comprising the n-type semiconductor device according to claim 1 and a p-type semiconductor device, wherein the p-type semiconductor device comprises:
a substrate;
a source electrode, a drain electrode, and a gate electrode;
a semiconductor layer in contact with the source electrode and the drain electrode; and
a gate insulating layer insulating the semiconductor layer from the gate insulating layer;
wherein the semiconductor layer of the p-type semiconductor device contains a carbon nanotube composite having a conjugated polymer attached to at least a part of the surface thereof.

14. The complementary semiconductor device according to claim 13, wherein the p-type semiconductor device comprises a second insulating layer in contact with the semiconductor layer of the p-type semiconductor device on the opposite side of the semiconductor layer of the p-type semiconductor device from the gate insulating layer of the p-type semiconductor device.

15. The complementary semiconductor device according to claim 13, wherein the source electrode and the drain electrode of the p-type semiconductor device and the source electrode and the drain electrode of the n-type semiconductor device are all composed of the same material.

16. The complementary semiconductor device according to claim 13, wherein the semiconductor layer of the p-type semiconductor device and the semiconductor layer of the n-type semiconductor device are composed of the same material.

17. The complementary semiconductor device according to claim 13, wherein the gate insulating layer of the p-type semiconductor device and the gate insulating layer of the n-type semiconductor device are composed of the same material.

18. A wireless communication device comprising at least the n-type semiconductor device according to claim 1 and an antenna.

19. A wireless communication device comprising at least the complementary semiconductor device according to claim 13 and an antenna.

* * * * *